(12) United States Patent
Mitsumoto et al.

(10) Patent No.: US 7,910,286 B2
(45) Date of Patent: Mar. 22, 2011

(54) LITHOGRAPHIC PRINTING PLATE PRECURSOR, LITHOGRAPHIC PRINTING METHOD AND PACKAGED BODY OF LITHOGRAPHIC PRINTING PLATE PRECURSORS

(75) Inventors: Tomoyoshi Mitsumoto, Shizuoka (JP); Yasuhito Oshima, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 153 days.

(21) Appl. No.: 11/339,447

(22) Filed: Jan. 26, 2006

(65) Prior Publication Data

US 2006/0166137 A1 Jul. 27, 2006

(30) Foreign Application Priority Data

Jan. 26, 2005 (JP) .............................. P. 2005-018195
Jan. 31, 2005 (JP) .............................. P. 2005-022650
Mar. 11, 2005 (JP) .............................. P. 2005-068924
Jul. 28, 2005 (JP) .............................. P. 2005-219200

(51) Int. Cl.
G03F 7/00 (2006.01)
G03F 7/26 (2006.01)

(52) U.S. Cl. ............... 430/273.1; 430/270.1; 430/281.1; 430/286.1; 430/287.1; 430/302; 430/138

(58) Field of Classification Search ................. 101/395, 101/401.1, 453; 430/204, 300–310, 428, 430/320; 53/461
See application file for complete search history.

(56) References Cited

U.S. PATENT DOCUMENTS

| 3,615,450 | A | * | 10/1971 | Werber et al. ................. 430/306 |
| 5,124,236 | A | * | 6/1992 | Yamaguchi et al. ........ 430/281.1 |
| 6,106,997 | A | * | 8/2000 | Oguni et al. ................ 430/272.1 |
| 6,294,298 | B1 | * | 9/2001 | Denzinger et al. .............. 430/56 |
| 7,005,234 | B2 | | 2/2006 | Hoshi et al. |
| 2002/0017208 | A1 | * | 2/2002 | Kasai et al. ................... 101/375 |
| 2002/0177074 | A1 | | 11/2002 | Hoshi et al. |
| 2003/0064318 | A1 | | 4/2003 | Huang et al. |
| 2003/0118851 | A1 | * | 6/2003 | Minami ........................ 428/515 |
| 2003/0219615 | A1 | * | 11/2003 | Kikuchi et al. ............. 428/537.1 |
| 2004/0146799 | A1 | * | 7/2004 | Miyamoto et al. ............ 430/138 |
| 2004/0224258 | A1 | * | 11/2004 | Maemoto ................... 430/270.1 |
| 2005/0069811 | A1 | * | 3/2005 | Mitsumoto et al. ........ 430/270.1 |
| 2005/0072122 | A1 | * | 4/2005 | Usui ............................... 53/461 |
| 2005/0153239 | A1 | * | 7/2005 | Hoshi et al. ................ 430/270.1 |

FOREIGN PATENT DOCUMENTS

EP 0849090 A2 * 12/1996

(Continued)

OTHER PUBLICATIONS

Amethyst Galleries, Inc. The Mica Group of Minerals. Feb. 1997.*

*Primary Examiner* — Cynthia H Kelly
*Assistant Examiner* — Chanceity N Robinson
(74) *Attorney, Agent, or Firm* — Birch, Stewart, Kolasch & Birch, LLP

(57) ABSTRACT

(1) A packaged body of lithographic printing plate precursors, wherein an image-recording layer or a protective layer of the outermost surface layer contains an inorganic layered compound. (2) A lithographic printing plate precursor having a protective layer containing an inorganic layered compound, and an image-recording layer containing a binder polymer. (3) A lithographic printing plate precursor having a protective layer containing an inorganic layered compound, and an image-recording layer containing an infrared absorber and an iodonium compound.

13 Claims, 1 Drawing Sheet

FOREIGN PATENT DOCUMENTS

| | | |
|---|---|---|
| EP | 0 849 090 A2 | 6/1998 |
| EP | 0849090 A2 * | 6/1998 |
| EP | 1 464 486 A2 | 10/2004 |
| EP | 1 495 864 A2 | 1/2005 |
| EP | 1495864 A2 * | 1/2005 |
| EP | 1 518 672 A2 | 3/2005 |
| JP | 11-38633 A | 2/1999 |
| JP | 2938397 B2 | 6/1999 |
| JP | 11-227927 A | 10/1999 |
| JP | 2000-39711 A | 2/2000 |
| JP | 2001-277740 A | 10/2001 |
| JP | 2002-287334 A | 10/2002 |

* cited by examiner

LITHOGRAPHIC PRINTING PLATE PRECURSOR, LITHOGRAPHIC PRINTING METHOD AND PACKAGED BODY OF LITHOGRAPHIC PRINTING PLATE PRECURSORS

BACKGROUND OF THE INVENTION

1. Field of the Invention

The present invention relates to a lithographic printing plate precursor and a packaged body of the lithographic printing plate precursors. More specifically, the invention relates to a lithographic printing plate precursor capable of direct plate making by scanning with laser beams on the basis of digital signals such as computer data, and a packaged body of the lithographic printing plate precursors.

2. Description of the Related Art

A lithographic printing plate generally comprises a lipophilic image area that receives ink and a hydrophilic non-image area that receives a fountain solution in a printing process. Lithographic printing is a printing method of making difference in ink-adhering property on the surface of a lithographic printing plate with the lipophilic image area of the lithographic printing plate as the ink-receptive area and the hydrophilic non-image area as the fountain solution receptive area (ink-repellent area) by making use of the natures of water and oily ink of repelling to each other, adhering ink only on the image area, and transferring the ink to the material to be printed, e.g., paper.

For manufacturing the lithographic printing plate, a lithographic printing plate precursor (a PS plate) comprising a hydrophilic support having provided thereon a lipophilic photosensitive resin layer (an image-recording layer) has so far been widely used. The lithographic printing plate is generally obtained by a plate-making method of exposing a lithographic printing plate precursor through an original image of a lith film and the like, and then, for leaving the area to become an image area of the image-recording layer, dissolving and removing other unnecessary image-recording layer with an alkali developing solution or an organic solvent, to thereby bare a hydrophilic support surface to form a non-image area.

In a conventional plate-making process of a lithographic printing plate precursor, a process of dissolving and removing unnecessary image-recording layer with a developing solution and the like after exposure is necessary, but the exclusion or simplification of such an additional wet process is one of the objects in the industry. Since the discard of waste solutions discharged with wet processes is a particularly great interest in the industry at large in recent years from the consideration of the global environment, the solution of the above problem is increasingly desired.

As a simple plate-making method, a method that is called on-press development is proposed, which is a method of using an image-recording layer capable of removing an unnecessary area of a lithographic printing plate precursor in an ordinary printing process, and removing a non-image area after exposure on a printing press to obtain a lithographic printing plate.

As the specific examples of on-press development, e.g., a method of using a lithographic printing plate precursor having an image-recording layer soluble or dispersible with, e.g., a fountain solution, an ink solvent, or an emulsified product of a fountain solution and ink, a method of mechanically removing an image-recording layer by the contact with the rollers and the blanket of a press, and a method of mechanically removing an image-recording layer by the contact with the rollers and the blanket after weakening the cohesive strength of an image-recording layer or the adhesive strength of an image-recording layer and a support by the permeation of a fountain solution and an ink solvent are exemplified.

In the present invention, unless otherwise indicated, "development process" means a process of removing an unexposed area of an image-recording layer of a lithographic printing plate precursor by being brought into contact with a liquid (generally an alkali developing solution) to thereby bare the hydrophilic support surface with an apparatus other than a printing press (generally an automatic processor), and "on-press development" means a method and a process of removing an unexposed area of an image-recording layer of a lithographic printing plate precursor by being brought into contact with a liquid (generally a printing ink and/or a fountain solution) to thereby bare the hydrophilic support surface with a printing press.

On the other hand, in recent years, digitized techniques of electronically processing image data, accumulating and outputting with a computer have prevailed, and various image output systems corresponding to these digitized techniques have been put to practical use. Under such circumstances, a computer-to-plate technique directly making a printing plate is attracting public attention, which technique comprises scanning exposing a lithographic printing plate precursor with high convergent radiant rays such as laser beams carrying digitized image data without using a lith film. With such a tendency, it is an important technical subject to obtain a lithographic printing plate precursor well adapted to such a purpose.

Accordingly, in recent years, the simplification of plate-making operation, and the realization of dry system and non-processing system have been further strongly required from both aspects of the above-described global environmental protection and the adaptation for digitization.

To cope with this problem, there is disclosed in Japanese Patent No. 2938397 a lithographic printing plate precursor comprising a hydrophilic support having provided thereon an image-forming layer containing hydrophobic thermoplastic polymer particles dispersed in a hydrophilic binder. Japanese Patent No. 2938397 discloses that it is possible to perform on-press development with a fountain solution and/or ink by subjecting the lithographic printing plate precursor to exposure with infrared laser beams to coalesce the hydrophobic thermoplastic polymer particles by heat to thereby form an image, and then mounting the lithographic printing plate precursor on the cylinder of a printing press.

However, although a method of forming an image by coalescence of fine particles by mere heat fusion as above certainly shows good on-press developability, there are problems that image strength is weak and press life is insufficient.

Therefore, it is proposed to improve press life by making use of polymerization reaction. For example, a lithographic printing plate precursor having an image-recording layer (a heat-sensitive layer) containing microcapsules encapsulating a polymerizable compound on a hydrophilic support is disclosed in JP-A-2001-277740 (The term "JP-A" as used herein refers to an "unexamined published Japanese patent application".) JP-A-2002-287334 discloses a lithographic printing plate precursor comprising a support having provided thereon an image-recording layer (a heat-sensitive layer) containing an infrared absorber, a radical polymerization initiator and a polymerizable compound. JP-A-2000-39711 discloses a lithographic printing plate precursor capable of on-press development after exposure, which lithographic printing plate precursor comprises an aluminum support using thereon a photosensitive composition containing (a) a water-soluble or water-dispersible polymer, (b) a monomer or an oligomer having a photopolymerizable ethylenic unsaturated double bond, and (c) a photo-polymerization initiator having an absorption maximum in the ultraviolet region. These methods using reactions such as polymerization reaction are characterized in that the density of chemical bonding in an image area is high, so that image strength can be increased.

In general, as the preprocess of mounting a printing plate on a press on printing site, the inspection and the discrimination of images on a printing plate, i.e., works for ascertaining whether the images fitting for the purpose are recorded on the printing plate or not, and ascertaining for what a color of ink the plate is, are operated. In ordinary lithographic printing plate precursors accompanied by a development process, an image can be easily ascertained after plate making (after development process), or before printing (before a printing plate is mounted on the press) generally by coloring an image-recording layer in advance.

However, since there is no image on a printing plate in a lithographic printing plate precursor of an on-press development type or a non-processing (non-development) type not accompanied by development process before printing, the discrimination of a plate cannot be done, which sometimes leads to the error in operation. In particular in multicolor printing, it is important for printing work to be capable of distinguishing whether register marks for register are clearly written so as to be distinguished or not.

To cope with this problem, there is disclosed in JP-A-11-277927 a photosensitive lithographic printing plate containing a light-heat converting agent having absorption in the wavelength region of 600 nm or more, a compound capable of generating at least one selected from an acid, a base and a radical by light or heat, and a compound that discolors by the interaction with at least one of the generated acid, base and radical. However, although the inspection work becomes easy by using in an image-recording layer the combination of a leuco dyestuff with a color developer or the combination of a light-acid generator with a pH indicator as the specific examples of the discoloring compound disclosed in JP-A-11-277927, drawbacks arise such that paper loss increases and printing performances are adversely influenced such that soiling resistance and press life are deteriorated, since a compound that does not concern image formation must be added for generating discoloration.

Further, in a lithographic printing plate precursor having a radical polymerizable image-recording layer that is subjected to development processing, a protective layer is generally provided on the image-recording layer for the purpose of polymerization acceleration (for achieving higher sensitivity and higher press life) by oxygen shielding, and prevention of the occurrence of scratches and ablation due to high intensity laser exposure. A water-soluble polymeric compound excellent in crystallizability, e.g., polyvinyl alcohol, is conventionally used as the main component in such a protective layer. However, for sufficiently exhibiting the function, a relatively great amount of a protective layer must be provided on the image-recording layer. Even if a great amount of a protective layer is provided on the image-recording layer, the protective layer is all removed at the time of development with a lithographic printing plate precursor accompanied by development, so that there arises no problem in printing. However, with an on-press development type lithographic printing plate precursor, such a great amount of a protective layer causes the problems of delay of on-press development, mixing of removed substances in a fountain solution, and accumulation on an impression drum, so that a protective layer capable of exhibiting the same function as conventional protective layers is required.

A lithographic printing plate precursor having a image-recording layer containing a radical polymerization initiator, a polymerizable compound and a polymer binder and further having provided thereon a protective layer is disclosed in U.S. Patent Application 2003/0,064,318A1. There is disclosed in the same patent that a polymer having a polyethylene oxide segment is used as the polymer binder, and the lithographic printing plate precursor is applicable to on-press development. However since the prescription of the protective layer in U.S. Patent Application 2003/0,064,318A1 is the same as those of conventionally used protective layers, when the coating solution of the protective layer is coated on the image-recording layer, the image-recording layer partially dissolves by the protective layer coating solution and the image-recording layer and the protective layer are mixed. Therefore, there is a problem in U.S. Patent Application 2003/0,064,318A1 that the image-forming property is rather hindered by coating the protective layer and sensitivity is reduced.

For preventing mechanical shock during preservation of lithographic printing plate precursors, lithographic printing plate precursors are generally preserved and transported in the state that an interleaf is inserted between printing plate precursors. Interleaving sheets are generally manufactured from wood pulp, synthetic pulp (polyethylene fiber), natural fibers, e.g., hemp, reclaimed cellulose and the like. Interleaving sheets are necessary during preservation and transportation but they are not necessary at all after lithographic printing plate precursors are exposure processed, and generally they are recycled or discarded. With the increase of the consciousness of environmental protection in recent years, lithographic printing plate precursors that do not necessitate interleaving sheets are required in the printing industry.

Lithographic printing plate precursors that do not necessitate development process and free from interleaving sheets are required as described above. However, if polymerization reaction is applied to lithographic printing plate precursors that do not necessitate development process, the lithographic printing plate precursors are adhered to each other when they are laminated without using interleaving sheets, since the content of soft polymerizable compound accounting for in a photosensitive composition is high, and the image-recording layer or the protective layer is scratched, and aging stability and press life are deteriorated.

SUMMARY OF THE INVENTION

The invention intends to solve the above problems concerning lithographic printing plate precursors that do not necessitate development process. That is, an object of the invention is to provide a packaged body of lithographic printing plate precursors free of interleaving sheets not necessitating development process. Another object of the invention is to provide a lithographic printing plate precursor excellent in on-press developability and press life. A further object of the invention is to provide an on-press development type or no processing type (non-development type) lithographic printing plate precursor showing good visibility of a printing plate after exposure, generating little loss paper, and having good press life. A still further object of the invention is to provide a lithographic printing method including on-press development of these lithographic printing plate precursors.

The present inventors have solved the above problems by the lithographic printing plate precursor containing an inorganic layered compound in an image-recording layer or in a protective layer. That is the present invention is as follows.

(1) A packaged body of lithographic printing plate precursors, which comprises at least two lithographic printing plate precursors each comprising: a support; and an image-recording layer, wherein a first one and a second one of the at least two lithographic printing plate precursors are laminated so that a surface of a side having an image-recording layer of the first one directly contacts with a surface of a side not having an image-recording layer of the second one, and wherein the image-recording layer comprises an inorganic layered compound.

(2) A packaged body of lithographic printing plate precursors, which comprises at least two lithographic printing plate precursors each comprising: a support; an image-recording layer; and a protective layer in this order, wherein a first one and a second one of the at least two lithographic printing plate precursors are laminated so that a surface of a side having an image-recording layer of the first one directly contacts with a surface of a side not having an image-recording layer of the second one, and wherein the protective layer comprises an inorganic layered compound.

(3) A packaged body of lithographic printing plate precursors, which comprises at least two lithographic printing plate precursors each comprising: a support; an image-recording layer; and a protective layer in this order, wherein a first one and a second one of the at least two lithographic printing plate precursors are laminated so that a surface of a side having an image-recording layer of the first one directly contacts with a surface of a side not having an image-recording layer of the second one, and wherein the at least two lithographic printing plate precursors each has an outermost surface having a center line average surface roughness (Ra) of from 0.2 to 0.6 μm in a side having an image-recording layer.

(4) The packaged body of lithographic printing plate precursors as described in any one of (1) to (3) above, wherein the image-recording layer is capable of being removed by at least one of a fountain solution and an ink.

(5) The packaged body of lithographic printing plate precursors as described in any one of (1) to (4) above, wherein the image-recording layer comprises (A) an actinic ray absorber, (B) a polymerization initiator and (C) a polymerizable compound.

(6) The packaged body of lithographic printing plate precursors as described in any one of (1) to (5) above, wherein the image-recording layer further comprises at least one of microcapsules and microgels.

(7) A lithographic printing plate precursor comprising:
a support;
an image-recording layer comprising (A) an actinic ray absorber, (B) a polymerization initiator and (D) a binder polymer, and the image-recording layer is capable of being removed by at least one of a printing ink and a fountain solution; and
a protective layer comprising an inorganic layered compound, in this order, wherein the binder polymer has an ethylene oxide group.

(8) The lithographic printing plate precursor as described in (7) above, wherein the inorganic layered compound has an aspect ratio of 10 or more.

(9) The lithographic printing plate precursor as described in (7) or (8) above, wherein the binder polymer has from 2 to 120 repeating units comprising an ethylene oxide group.

(10) The lithographic printing plate precursor as described in (7) or (8) above, wherein the binder polymer has from 6 to 60 repeating units comprising an ethylene oxide group.

(11) The lithographic printing plate precursor as described in any one of (7) to (10) above, wherein the binder polymer is water-insoluble.

(12) The lithographic printing plate precursor as described in any one of (7) to (11) above, wherein the image-recording layer comprises discontinuous particles.

(13) The lithographic printing plate precursor as described in any one of (7) to (12) above, wherein the binder polymer is polymer particles dispersed in the image-recording layer.

(14) The lithographic printing plate precursor as described in any one of (7) to (13) above, wherein the image-recording layer comprises at least one of microcapsules and microgels.

(15) The lithographic printing plate precursor as described in any one of (7) to (14) above, wherein the protective layer has a mass of from 0.02 to 1 g/m$^2$.

(16) A lithographic printing method comprising:
imagewise exposing a lithographic printing plate precursor as described in any one of (7) to (15) above by irradiation with an actinic ray;
removing an area not irradiated with an actinic ray of the image-recording layer by feeding at least one of a printing ink and a fountain solution; and
performing printing.

(17) A lithographic printing plate precursor comprising:
a support;
an image-recording layer capable of imaging by an infrared laser exposure; and
a protective layer, in this order,
wherein the lithographic printing plate precursor is capable of printing by being mounted on a printing press without a development process after an image recording or by an image recording after being mounted on a printing press, and
wherein the image-recording layer comprises (E) an infrared absorber and (F) an iodonium salt and does not substantially comprise a compound other than an infrared absorber (E) which changes a color of the compound by interacting with at least one of an acid, a base and a radical, and the protective layer comprises an inorganic layered compound.

(18) The lithographic printing plate precursor as described in (17) above, wherein an absorbance at any wavelength of from 400 to 700 nm of an infrared absorber (E) in an exposed area changes by at least 0.05 or more by an infrared laser exposure as compared with an absorbance of an infrared absorber (E) in an unexposed area.

(19) The lithographic printing plate precursor as described in (17) above, wherein an absorbance at any wavelength of from 400 to 700 nm of an infrared absorber (E) in an exposed area becomes greater by at least 0.05 or more by an infrared laser exposure as compared with an absorbance of an infrared absorber (E) in an unexposed area.

(20) The lithographic printing plate precursor as described in any one of (17) to (19) above, wherein the infrared absorber (E) is a compound represented by formula (D1):

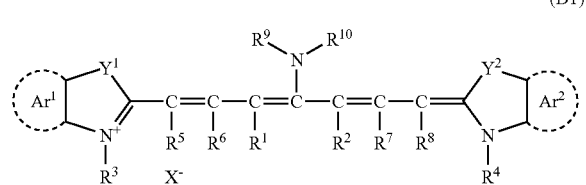

(D1)

wherein $R^1$ and $R^2$ each independently represents a hydrogen atom or a hydrocarbon group having from 1 to 12 carbon atoms, and $R^1$ and $R^2$ may be bonded to each other to form a cyclic structure; $Ar^1$ and $Ar^2$ each independently represents an aromatic hydrocarbon group which may have a substituent; $Y^1$ and $Y^2$ each independently represents a sulfur atom or a dialkylmethylene group having 12 or less carbon atoms; $R^3$ and $R^4$ each independently represents a hydrocarbon group having 20 or less carbon atoms which may have a substituent; $R^5$, $R^6$, $R^7$ and $R^8$ each independently represents a hydrogen atom or a hydrocarbon group having 12 or less carbon atoms; $R^9$ and $R^{10}$ each independently represents an aromatic hydrocarbon group having from 6 to 10 carbon atoms which may have a substituent, an alkyl group having from 1 to 8 carbon atoms or a hydrogen atom, and $R^9$ and $R^{10}$ may be bonded to each other to form a cyclic structure, and in this case, the cyclic structure may arbitrarily contain one or more hetero atoms selected from the group consisting of a nitrogen atom, an oxygen atom and a sulfur atom; and $X^-$ represents a counter anion, provided that when any of $R^1$ to $R^8$ is substituted with a sulfo group, $X^-$ is not necessary.

(21) The lithographic printing plate precursor as described in any one of (17) to (20) above,
wherein the image recording layer further comprises a sulfonium salt.

(22) The lithographic printing plate precursor as described in any one of (17) to (21) above,
wherein the image recording layer comprises at least one of microcapsules and microgels.

(23) A lithographic printing method comprising:
imagewise exposing a lithographic printing plate precursor as described in any one of (17) to (22) above with an infrared laser;
removing an unexposed area of an image-recording layer in a state of fitting the lithographic printing plate precursor to a cylinder of a printing press, so as to form a lithographic printing plate; and
performing printing with the lithographic printing plate.

DETAILED DESCRIPTION OF THE INVENTION

1. Packaged Body

Figure 1:
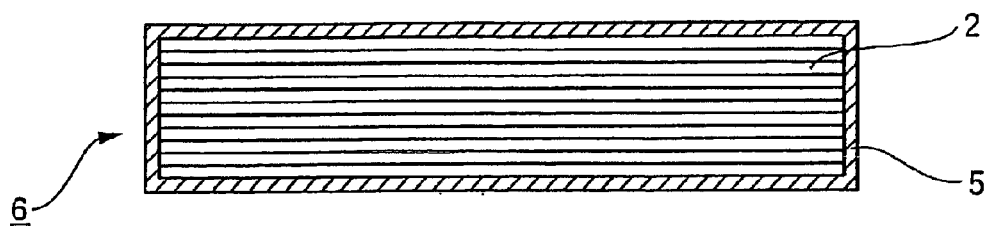
FIG. 1 is a cross sectional view of a packaged body.

The packaged body in the invention is the one packaging the laminate of lithographic printing plate precursors comprising a support having provided thereon an image-recording layer laminated in a manner that the surface of the side having an image-recording layer of one lithographic printing plate precursor and the surface of the side not having an image-recording layer of another lithographic printing plate precursor are directly brought into contact. The lithographic printing plate precursors of the invention are shipped, transported and preserved in this packaged form.

The number of lithographic printing plate precursors constituting one laminate is not especially restricted, but in view of the efficiencies of transportation and preservation and the easiness of mounting on an automatic plate making machine, for example, from 10 to 100 sheets are preferred. In the case where a laminate is constituted of from 10 to 100 sheets of lithographic printing plate precursors, it is preferred to fix the protecting boards (attachment boards) used at the top surface and the bottom surface of the laminate and the lithographic printing plate precursors with a fixing means, e.g., an adhesive tape, so that the lithographic printing plate precursors do not get out of position from each other. A bundle of laminates may be constituted of several thousands sheets of lithographic printing plate precursors. In the above laminate, a protecting board may be inserted every 20 to 100 sheets of lithographic printing plate precursors, or protecting boards may be arranged only at the top and bottom of the laminate. Protecting boards may be omitted in any of the above laminates.

The thus-constituted laminate is packaged with inner paper such as aluminum kraft paper, and then the folded parts of the inner paper are fixed with an adhesive tape, so that the inner paper does not carelessly unfold or does not slip out, whereby a packaged body of lithographic printing plate precursors is constituted. The packaged body may be encased in a shipping box for outer package or may be loaded onto a pallet, according to necessity. For example, besides ordinary corrugated board box packaging, skid type package of packaging the laminates of lithographic printing plate precursors loaded onto a skid, and paper pallet type package of packaging the laminates loaded onto a paper pallet are exemplified. In the above package structure, inner paper may be omitted.

2. Lithographic Printing Plate Precursor

The lithographic printing plate precursor in the invention comprises a support having provided thereon an image-recording layer containing an inorganic layered compound, or comprises a support having an image-recording layer and a protective layer provided in this order and the protective layer contains an inorganic layered compound.

Inorganic Layered Compound:

The inorganic layered compound for use in the invention comprises thin tabular particles, e.g., a mica group such as natural mica and synthetic mica represented by the following formula, and talc represented by formula $3MgO.4SiO.H_2O$, taeniolite, montmorillonite, saponite, hectorite, and zirconium phosphate are exemplified.

$$A(B,C)_{2-5}D_4O_{10}(OH,F,O)_2$$

wherein A is any of K, Na and Ca, B and C are any of Fe(II), Fe(III), Mn, Al, Mg and V, and D is Si or Al.

Out of the mica family, examples of the natural mica include muscovite, paragonite, phlogopite, biotite and lepidolite. Examples of the synthetic mica include non-swelling mica such as fluorophlogopite $KMg_3(AlSi_3O_{10})F_2$ and potassium tetrasilicic mica, and swelling mica such as Na-tetrasililic mica $NaMg_{2.5}(Si_4O_{10})F_2$, Na- or Li-taeniolite (Na, Li)$Mg_2Li(Si_4O_{10})F_2$, and montmorillonite-based Na- or Li-hectorite Na, Li)$_{1/8}Mg_{2/5}Li_{1/8}(Si_4O_{10})F_2$. Synthetic smectite is also useful.

In the present invention, among these inorganic layered compounds, fluorine-based swelling micas which are a synthetic inorganic layered compound are particularly useful. These swelling synthetic micas and the swelling clay minerals such as montmorillonite, saponite, hectorite and bentonite have a layered structure comprising unit crystalline lattice layers having a thickness of approximately from 10 to 15 Å, and the intra-lattice metallic atom substitution is considerably larger than that of other clay minerals. As a result, the lattice layer causes shortage in positive electric charge, and a cation such as $Na^+$, $Ca^{2+}$ and $Mg^{2+}$ is adsorbed between layers to compensate for the shortage. The cation intervening between these layers is called an exchangeable cation and is exchanged with various cations. Particularly, in the case where the cation between layers is $Li^+$ or $Na^+$, the bonding between layered crystalline lattices is weak due to small ionic radius, and great swelling with water occurs. When shearing is applied in this state, cleavage readily results and a stable sol is formed in water. This tendency is outstanding in bentonite and swelling synthetic mica, and these are useful in the present invention. In particular, swelling synthetic mica is preferred.

As for the shape of the inorganic layered compound for use in the present invention, the thickness is preferably as small as possible from the standpoint of controlling the dispersion, and the plane size is preferably as large as possible as long as the flatness of coated surface and the transparency to active light are not impaired. Therefore, the aspect ratio is 10 or more, preferably 20 or more, more preferably 100 or more, still more preferably 200 or more. The aspect ratio is a ratio of thickness to long diameter of a particle and can be measured, for example, from a projection view by a microphotograph of particles.

The particle size of the inorganic layered compound for use in the present invention is, in terms of average long diameter, from 0.3 to 20 μm, preferably from 0.5 to 10 μm, more preferably from 1 to 5 μm. The average thickness of the particle is 0.1 μm or less, preferably 0.05 μm or less, more preferably 0.01 μm or less. For example, out of inorganic layered compounds, the swelling synthetic mica as a representative compound has a size such that the thickness is from 1 to 50 nm and the plane size is approximately from 1 to 20 μm.

When such an inorganic layered compound particle having a large aspect ratio is incorporated into the protective layer, the coating strength is increased and the permeation of oxygen or water content can be effectively inhibited, so that the protective layer can be prevented from deterioration due to deformation and even when stored for a long time under high-humidity condition, the lithographic printing plate precursor can be free of reduction in the image formability due to change of humidity and exhibit excellent storage stability.

By using such an inorganic layered compound in an image-recording layer or a protective layer of the outermost surface layer of a lithographic printing plate precursor, it becomes possible to prevent lithographic printing plate precursors from being adhered to each other and being scratched even when interleaving sheets are not used in a packaged body of lithographic printing plate precursors, so that excellent aging stability and press life can be maintained. The inorganic layered compounds used for a packaged body preferably have an aspect ratio of 20 or more.

[Protective Layer]

In the present invention, the exposure is usually performed in air and the protective layer prevents low molecular compounds such as oxygen and basic substance present in air, which inhibit the image-forming reaction occurring upon exposure in the image recording layer, from mingling into the image recording layer and thereby prevents the inhibition of image-forming reaction at the exposure in air. Accordingly, the property required of the protective layer is low permeability to low molecular compounds such as oxygen. Furthermore, the protective layer preferably has good transparency to light used for exposure, excellent adhesion to the image recording layer, and easy removability during on-press development after exposure. Various studies have been heretofore made on the protective layer having such properties, and these are described in detail, for example, in U.S. Pat. No. 3,458,311 and JP-B-55-49729 (the term "JP-B" as used herein means an "examined Japanese patent publication").

In the protective layer, a binder is preferably used together with the inorganic layered compound.

The binder is not particularly limited as long as the inorganic layered particle has good dispersibility therein and a uniform film adhering to the image recording layer can be formed, and either a water-soluble polymer or a water-insoluble polymer may be appropriately selected and used. Specific examples of the binder include a water-soluble polymer such as polyvinyl alcohol, modified polyvinyl alcohol, polyvinylpyrrolidone, polyacrylic acid, polyacrylamide, partially saponified polyvinyl acetate, ethylene-vinyl alcohol copolymer, water-soluble cellulose derivative, gelatin, starch derivative and gum arabic, and a water-insoluble polymer such as polyvinylidene chloride, poly(meth)acrylonitrile, polysulfone, polyvinyl chloride, polyethylene, polycarbonate, polystyrene, polyamide and cellophane. These polymers may also be used in combination of two or more thereof, if desired.

Particularly, in view of easy removability of the protective layer remaining in the non-image area and handleability at the film formation, a water-soluble polymer is preferred and, for example, polyvinyl alcohol, polyvinylpyrrolidone, polyvinylimidazole, water-soluble acrylic resin (e.g., polyacrylic acid), gelatin and gum arabic are preferred. Among these, polyvinyl alcohol, polyvinylpyrrolidone, gelatin and gum arabic are more preferred, because such a polymer can be coated by using water as the solvent and can be easily removed by a fountain solution at the printing.

A part of the polyvinyl alcohol usable for the protective layer of the present invention may be replaced by an ester, an ether or an acetal or may have another copolymerization component as long as the polyvinyl alcohol contains an unsubstituted vinyl alcohol unit in a substantial amount for giving necessary water solubility. Examples of the polyvinyl alcohol include those having a hydrolysis degree of 71 to 100 mol % and a polymerization degree of 300 to 2,400.

Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd. Examples of the copolymer include chloroacetate or propionate of polyvinyl acetate having a hydrolysis degree of 88 to 100 mol %, polyvinyl formal, polyvinyl acetal, and a copolymer thereof.

In the lithographic printing plate precursors for use in the packaged body of the invention, it is preferred that an inorganic layered compound to be added to an image-recording layer or a protective layer of the outermost surface layer is added in a range that the center line average surface roughness (Ra) of the added layer becomes from 0.2 to 0.6 μm.

The addition amount differs according to the inorganic layered compound to be used, so that the specific addition amount cannot be determined unconditionally, but when the compound is added to an image-recording layer, the amount is in general preferably from 1 to 50 mass % of all the solids content in the image-recording layer, and more preferably from 5 to 30 mass %. (In this specification, mass % and parts by mass are equal to weight % and parts by weight, respectively.) When the compound is added to a protective layer, the amount is preferably from 1 to 70 mass % of all the solids content in the protective layer, and more preferably from 10 to 50 mass %. In this range of the addition amount, adhesion of lithographic printing plate precursors to each other and scratching can be effectively prevented, and excellent aging stability and press life can be maintained.

The addition amount of the inorganic layered compound in the lithographic printing plate precursor as claimed in any of claims 7 to 23 is preferably from 5/1 to 1/100 in mass ratio to the amount of the binder used in the protective layer. When two or more kinds of inorganic layered compounds are used in combination, it is preferred that the total amount of the inorganic layered compounds is also in the above mass ratio.

A general dispersion method for the inorganic layered compound is described below. From 5 to 10 parts by mass of the swelling layered compound described above as a preferred inorganic layered compound is added to 100 parts by mass of water, thoroughly blended and swelled with water, and then dispersed by a dispersing machine. Examples of the dispersing machine used here include various mills of dispersing the layered compound by directly applying mechanical force, a high-speed agitation-type dispersing machine having large shearing force, and a dispersing machine of giving highly intensified ultrasonic energy. Specific examples thereof include a ball mill, a sand grinder mill, a visco-mill, a colloid mill, a homogenizer, a dissolver, a polytron, a homomixer, a homoblender, a KD mill, a jet agitator, a capillary emulsifier, a liquid siren, an electromagnetic strain-type ultrasonic generator, and an emulsifier with Pullman's whistle. A dispersion containing from 5 to 10 mass % of the inorganic layered compound dispersed by the above-described method is in a highly viscous or gelled state, and its storage stability is extremely good. At the time of preparing a protective layer coating solution by using this dispersion, the dispersion is preferably diluted with water, thoroughly stirred and blended with a binder solution.

In the protective layer coating solution, known additives such as surfactant for enhancing the coatability and water-soluble plasticizer for improving the physical properties of film can be added in addition to the inorganic layered compound. Examples of the water-soluble plasticizer include propionamide, cyclohexanediol, glycerin and sorbitol. A water-soluble (meth)acrylic polymer may also be added. Furthermore, in this coating solution, known additives for enhancing adhesion to the image recording layer and aging stability of the coating solution may also be added.

The protective layer coating solution prepared in this way is coated on the image recording layer provided on the support, and then dried to form a protective layer. The coating solvent may be appropriately selected according to the binder but when a water-soluble polymer is used, distilled water or purified water is preferably used as the solvent. The coating method of the protective layer is not particularly limited, and known methods such as method described in U.S. Pat. No. 3,458,311 and JP-B-55-49729 may be applied. Specific examples of the coating method for the protective layer include a blade coating method, an air knife coating method, a gravure coating method, a roll coating method, a spray coating method, a dip coating method and a bar coating method.

The coating weight of the protective layer is preferably in the range of from 0.01 to 10 g/m² in dry coating weight, more preferably from 0.02 to 3 g/m², and still more preferably from 0.02 to 1 g/m².

Image-Recording Layer (1):

The image-recording layer of the lithographic printing plate precursor for use in the packaged body in the invention will be described in the first place. The image-recording layer is preferably a layer capable of removing by a printing ink and/or a fountain solution. Further, it is preferred that the image-recording layer contains (A) an actinic ray absorber, (B) a polymerization initiator, and (C) a polymerizable compound.

When the image-recording layer is the outermost surface layer of the lithographic printing plate precursor, it contains an inorganic layered compound as described above.

The image-recording layer will be described in detail below.

(A) Actinic Ray Absorber:

Actinic ray absorbers for use in the invention are compounds that absorb the rays radiated from an exposure light source, efficiently generate radicals from a polymerization initiator by a photon mode and/or a heat mode, to thereby contribute to the improvement of sensitivity of a lithographic printing plate precursor. As such actinic ray absorbers, infrared absorbers are preferably used when a lithographic printing plate precursor is subjected to imagewise exposure with an infrared laser, and sensitizing dyes absorbing lights of wavelengths of from 250 to 420 nm are preferably used when a lithographic printing plate precursor is imagewise exposed with an ultraviolet laser.

A1. Infrared Absorber:

The infrared absorbers for use in the invention are dyes or pigments preferably having an absorption maximum at the wavelengths of from 760 to 1,200 nm.

As for the dye, commercially available dyes and known dyes described in publications such as Senryo Binran (Handbook of Dyes), compiled by Yuki Gosei Kagaku Kyokai (1970) may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, a near infrared absorbing sensitizer described in U.S. Pat. No. 5,156,938 may be suitably used. Furthermore, a substituted arylbenzo(thio)pyrylium salt described in U.S. Pat. No. 3,881,924, a trimethinethiapyrylium salt described in JP-A-57-142645 (corresponding to U.S. Pat. No. 4,327,169), a pyrylium-based compound described in JP-A-58-181051, JP-A-58-220143, JP-A-59-41363, JP-A-59-84248, JP-59-84249, JP-A-59-146063 and JP-A-59-146061, a cyanine dye described in JP-A-59-216146, a pentamethinethiapyrylium salt described in U.S. Pat. No. 4,283,475, and a pyrylium compound described in JP-B-5-13514 and JP-B-5-19702 may also be preferably used. Other preferred examples of the dye include near infrared absorbing dyes represented by formulae (I) and (II) of U.S. Pat. No. 4,756,993.

Among these dyes, preferred are a cyanine dye, a squarylium dye, a pyrylium salt, a nickel thiolate complex and an indolenine cyanine dye, more preferred are a cyanine dye and an indolenine cyanine dye, still more preferred is a cyanine dye represented by the following formula (i):

Formula (i):

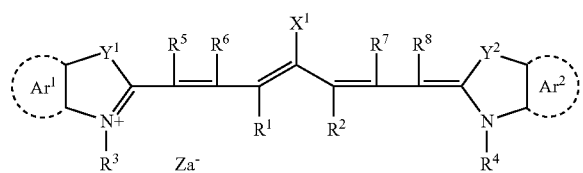

In formula (i), $X^1$ represents a hydrogen atom, a halogen atom, —$NPh_2$, $X^2$-$L^1$ or a group shown below:

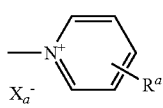

wherein $X^2$ represents an oxygen atom, a nitrogen atom or a sulfur atom, $L^1$ represents a hydrocarbon group having from 1 to 12 carbon atoms, an aromatic ring having a heteroatom, or a hydrocarbon group having from 1 to 12 carbon atoms and containing a heteroatom (the heteroatom as used herein indicates N, S, O, a halogen atom or Se), $X_a^-$ has the same definition as $Za^-$ described later, and $R^a$ represents a substituent selected from a hydrogen atom, an alkyl group, an aryl group, a substituted or unsubstituted amino group and a halogen atom. Ph represents a phenyl group.

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring, and preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms, and in view of availability of the raw material, preferably represents a hydrogen atom. $Za^-$ represents a counter anion, but when the cyanine dye represented by formula (i) has an anionic substituent in its structure and neutralization of electric charge is not necessary, $Za^-$ is not present. In view of storage stability of the coating solution for the recording layer, $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (i), which can be suitably used in the present invention, include those described in paragraphs [0017] to [0019] of JP-A-2001-133969.

Other preferred examples include a specific indolenine cyanine dye described in JP-A-2002-278057.

Infrared absorbers are preferably water-soluble, but in the case of not water-soluble, infrared absorbers can also be added as dispersion or by a method of dissolving them in a mixed solvent and the like.

As for the pigment used in the present invention, commercially available pigments and pigments described in Color Index (C.I.) Binran (C.I. Handbook), Saishin Ganryo Binran (Handbook of Newest Pigments), compiled by Nippon Ganryo Gijutsu Kyokai (1977), Saishin Ganryo Oyo Gijutsu (Newest Pigment Application Technology), CMC Shuppan (1986), and Insatsu Ink Gijutsu (Printing Ink Technology), CMC Shuppan (1984) can be used.

The kind of pigment includes a black pigment, a yellow pigment, an orange pigment, a brown pigment, a red pigment, a violet pigment, a blue pigment, a green pigment, a fluorescent pigment, a metal powder pigment and a polymer bond pigment. Specific examples of the pigment which can be used include an insoluble azo pigment, an azo lake pigment, a condensed azo pigment, a chelate azo pigment, a phthalocyanine-based pigment, an anthraquinone-based pigment, a perylene- or perynone-based pigment, a thioindigo-based pigment, a quinacridone-based pigment, a dioxazine-based pigment, an isoindolinone-based pigment, a quinophthalone-based pigment, a dyed lake pigment, an azine pigment, a nitroso pigment, a nitro pigment, a natural pigment, a fluorescent pigment, an inorganic pigment and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, silane coupling agent, epoxy compound or isocyanate) to the pigment surface. These surface-treating methods are described in Kinzoku Sekken no Seishitsu to Oyo (Properties and Application of Metal Soap), Saiwai Shobo, Insatsu Ink Gijutsu (Printing Ink Technology), CMC Shuppan (1984), and Saishin Ganryo Oyo Gijutsu (Newest Pigment Application Technology), CMC Shuppan (1986).

The particle diameter of the pigment is preferably from 0.01 to 10 μm, more preferably from 0.05 to 1 μm, still more preferably from 0.1 to 1 μm. Within this range, good stability of the pigment dispersion in the coating solution for the image recording layer and good uniformity of the image recording layer can be obtained.

For dispersing the pigment, a known dispersion technique used in the production of ink or toner may be used. Examples of the dispersing machine include an ultrasonic disperser, a sand mill, an attritor, a pearl mill, a super-mill, a ball mill, an impeller, a disperser, a KD mill, a colloid mill, a dynatron, a three-roll mill and a pressure kneader. These are described in detail in Saishin Ganryo Oyo Gijutsu (Newest Pigment Application Technology), CMC Shuppan (1986).

The amount of the infrared absorbent added to the image recording layer is preferably a necessary minimum amount so as to suppress the side effect of inhibiting the polymerization reaction.

The infrared absorbent can be added at a ratio of 0.001 to 50 mass %, preferably from 0.005 to 30 mass %, more preferably from 0.01 to 10 mass %, based on the entire solid content of the image recording layer. Within this range, high sensitivity can be obtained without adversely affecting the uniformity or film strength of the image recording layer.

Of these infrared absorbers described above, a cyanine dye represented by formula (i) is preferred.

A2. Sensitizing Dye:

Sensitizing dyes for use in the invention are compounds having absorption at the wavelengths in the range of from 250 to 420 nm, specifically benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino)phenyl styryl ketone, p-(dimethylamino)-phenyl, p-methyl styryl ketone, benzophenone, p-(dimethylamino)benzophenone (or Michler's ketone), p-(diethylamino)-benzophenone, and benzanthrone are exemplified.

Furthermore, preferred examples of the sensitizing dye for use in the present invention include a compound represented by formula (ii) described in JP-B-51-48516:

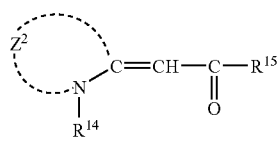

(ii)

wherein $R^{14}$ represents an alkyl group (e.g., methyl, ethyl, propyl) or a substituted alkyl group (e.g., 2-hydroxyethyl, 2-methoxyethyl, carboxymethyl, 2-carboxyethyl); $R^{15}$ represents an alkyl group (e.g., methyl, ethyl) or an aryl group (e.g., phenyl, p-hydroxyphenyl, naphthyl, thienyl); and $Z^2$ represents a nonmetallic atom group necessary for forming a nitrogen-containing heterocyclic nucleus usually used in a cyanine dye, for example, benzothiazoles (e.g., benzothiazole, 5-chlorobenzothiazole, 6-chlorobenzothiazole), naphthothiazoles (e.g., α-naphthothiazole, β-naphthothiazole), benzoselenazoles (e.g., benzoselenazole, 5-chlorobenzoselenazole, 6-methoxybenzoselenazole), naphthoselenazoles (e.g., α-naphthoselenazole, β-naphthoselenazole), benzoxazoles (e.g., benzoxazole, 5-methylbenzoxazole, 5-phenylbenzoxazole) and naphthoxazoles (e.g., α-naphthoxazole, β-naphthoxazole).

Specific examples of the compound represented by formula (ii) include those having a chemical structure constituted by combining these $Z^2$, $R^{14}$ and $R^{15}$. Many of such compounds are present as a known substance and therefore, the compound used may be appropriately selected from those known substances. Other preferred examples of the sensitizing dye for use in the present invention include a merocyanine dye described in JP-B-5-47095 and a ketocoumarin-based compound represented by the following formula (iii):

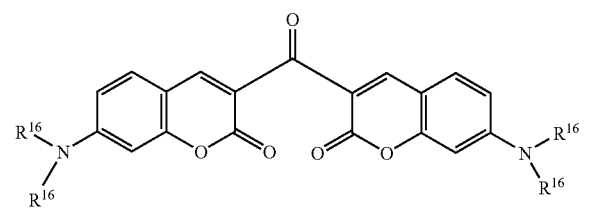

(iii)

wherein $R^{16}$ represents an alkyl group such as methyl group and ethyl group.

In addition, a merocyanine-based dye described in JP-A-2000-147763 can also be used as the sensitizing dye, and a sensitizing dye described in JP-A-2001-100412 is also preferred. Specific examples thereof include the following compounds.

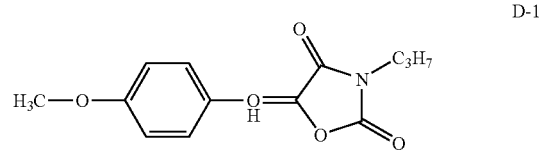

D-1

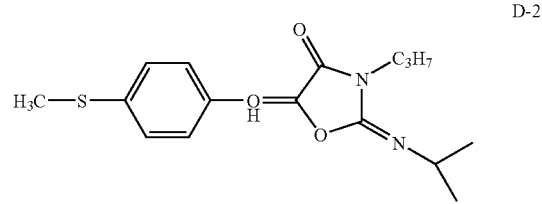

D-2

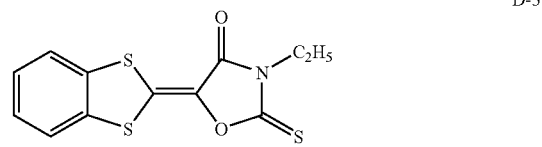

D-3

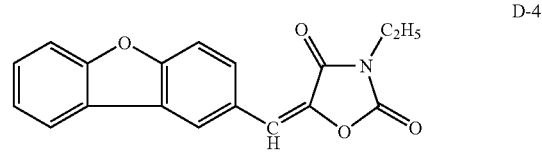

D-4

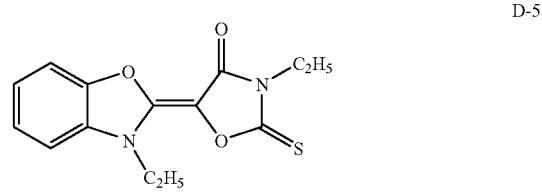

D-5

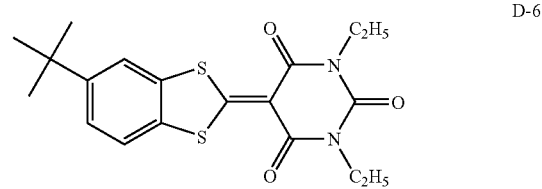

D-6

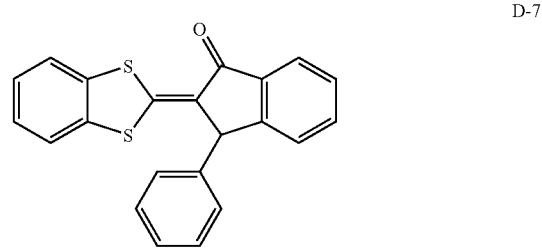

D-7

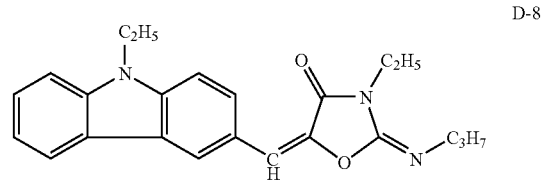

D-8

-continued

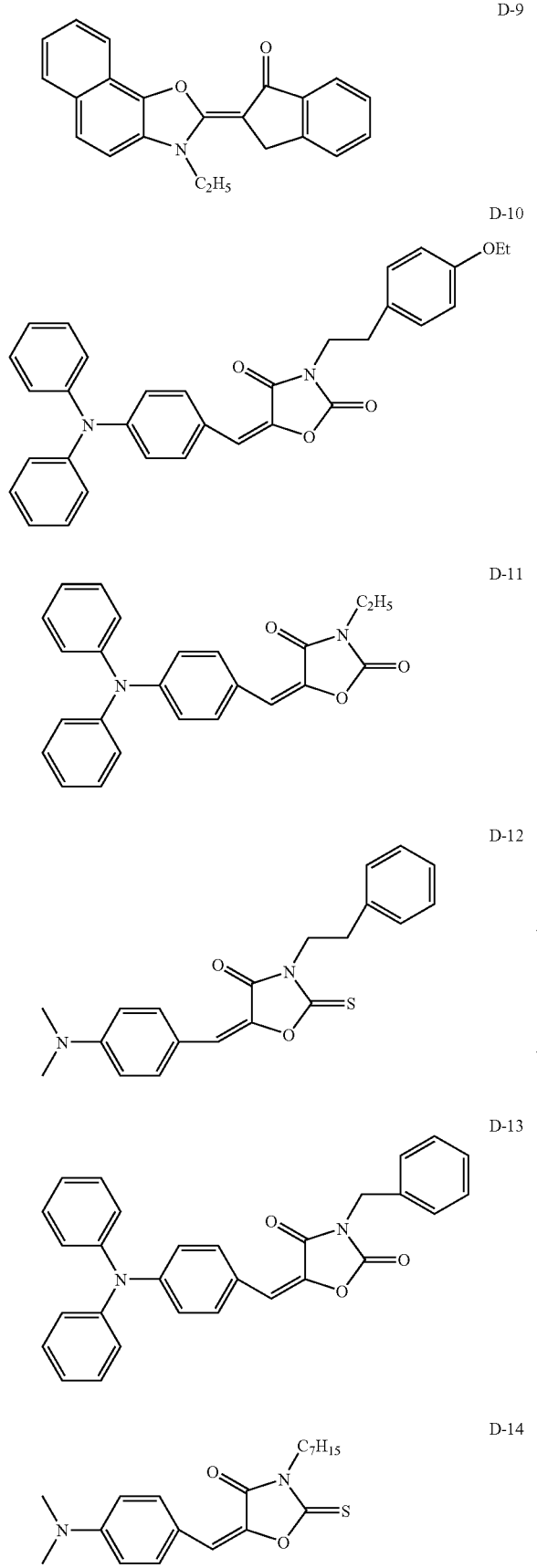

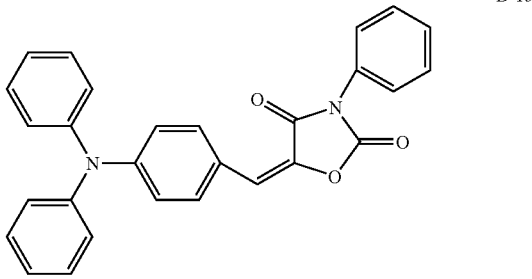

The sensitizing dye can be added at a ratio of preferably from 0.1 to 50 mass %, more preferably from 0.5 to 30 mass %, still more preferably from 0.8 to 20 mass %, based on all solid contents constituting the image recording layer.

(B) Polymerization Initiator:

The polymerization initiators that can be used in the invention are compounds capable of generating radicals by light or heat, or both of these energies, and initiating and accelerating the polymerization of a compound having a polymerizable unsaturated group. As the polymerization initiators usable in the invention, well-known thermal polymerization initiators, compounds having a bond small in bonding and dissociation energy, and photopolymerization initiators are exemplified.

As polymerization initiators as described above, e.g., organic halogen compounds, carbonyl compounds, organic peroxides, azo-based polymerization initiators, azide compounds, metallocene compounds, hexaarylbiimidazole compounds, organic boron compounds, disulfone compounds, oxime ester compounds, oxime ether compounds and onium salt compounds are exemplified.

Specific examples of the organohalogen compound include the compounds described in Wakabayashi et al., Bull. Chem. Soc. Japan, 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, Journal of Heterocyclic Chemistry, 1, No. 3 (1970). Among these, an oxazole compound substituted with a trihalomethyl group, and an S-triazine compound are preferred.

Furthermore, an s-triazine derivative having at least one mono-, di- or tri-halogenated methyl group bonded to the s-triazine ring is more preferred, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and the following compounds.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone and 1,1,1-trichloromethyl-(p-butylphenyl)ketone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone and 2,4-diisopropylthioxanthone; and benzoic acid ester derivatives such as ethyl p-dimethylaminobenzoate and ethyl p-diethylaminobenzoate.

Examples of the azo-based compound which can be used include azo compounds described in JP-A-8-108621.

Examples of the organoperoxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tertiary carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropyl-cumylperoxycarbonyl)benzophenone, carbonyl di(tert-butylperoxydihydrogendiphthalate) and carbonyl di(tert-hexylperoxydihydrogendiphthalate).

Examples of the metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl, bis(cyclopentadienyl)-bis(2,6-difluoro-3-(pyr-1-yl)phenyl)titanium and iron-allene complexes described in JP-A-1-304453 and JP-A-1-152109.

Examples of the hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

Examples of the organoboron compound include organoborates described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539, and Martin Kunz, Rad Tech '98. Proceeding Apr. 19-22, 1998, Chicago; organoboron sulfonium complexes and organoboron oxosulfonium complexes described in JP-A-6-157623, JP-A-6-175564 and JP-A-6-175561; organoboron iodonium complexes described in JP-A-6-175554 and JP-A-6-175553; organoboron phosphonium complexes described in JP-A-9-188710; and organoboron transition metal coordination complexes described in JP-A-6-348011, JP-A-7-128785, JP-A-7-140589, JP-A-7-306527 and JP-A-7-292014.

Examples of the disulfone compound include compounds described in JP-A-61-166544 and JP-A-2003-328465.

Examples of the oxime ester compound include compounds described in J. C. S. Perkin II, 1653-1660 (1979), J. C. S. Perkin II, 156-162 (1979), Journal of Photopolymer Science and Technology, 202-232 (1995), JP-A-2000-66385 and JP-A-2000-80068. Specific examples thereof include the compounds represented by the following structural formulae.

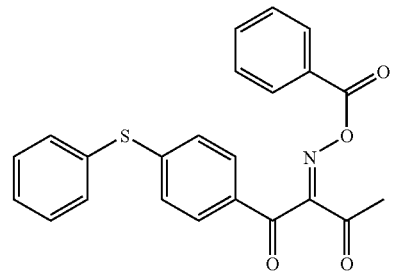

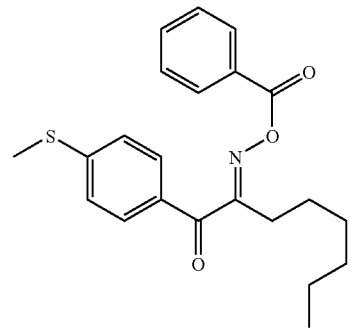

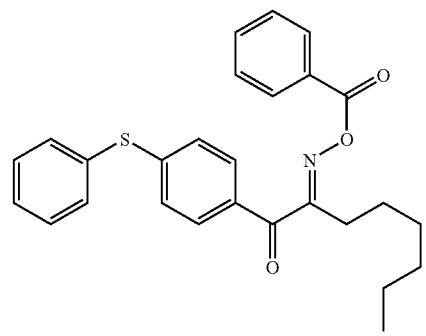

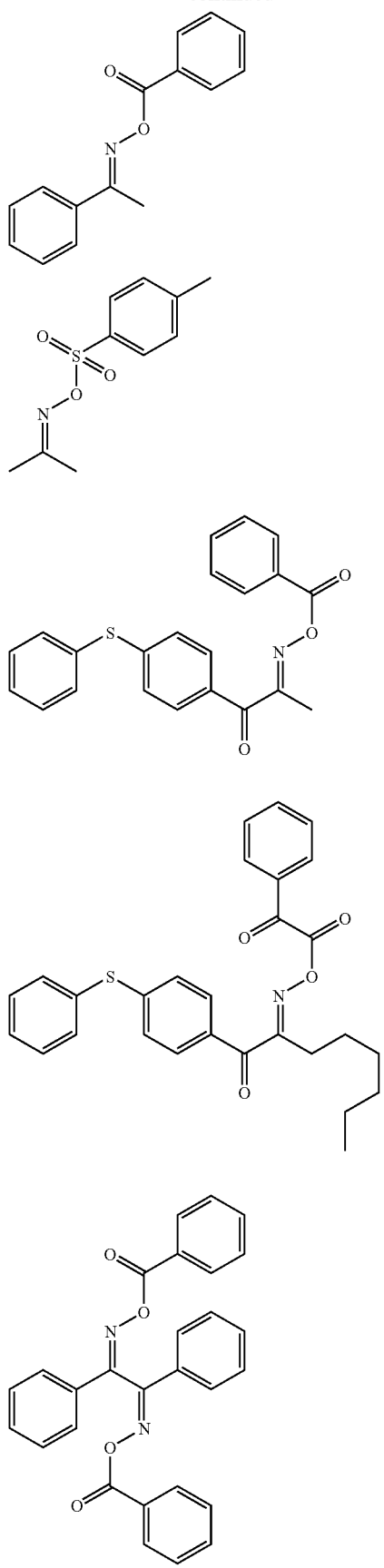
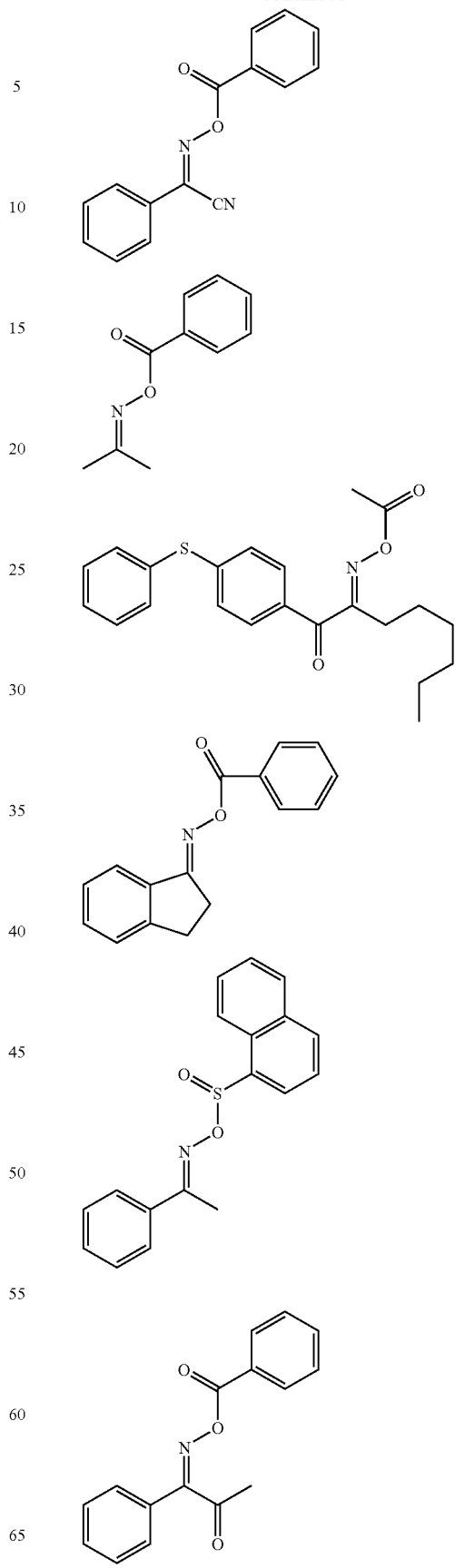

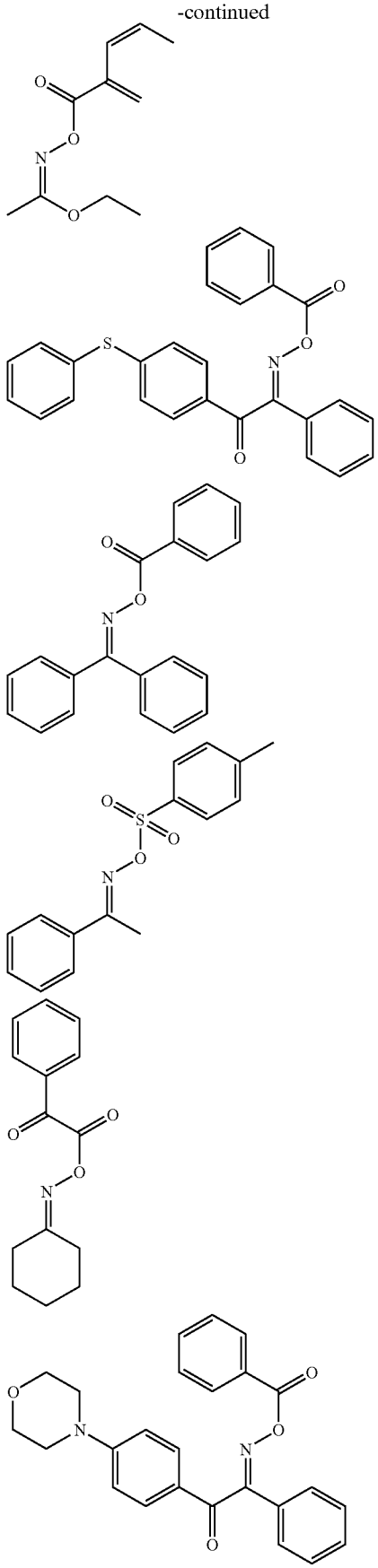
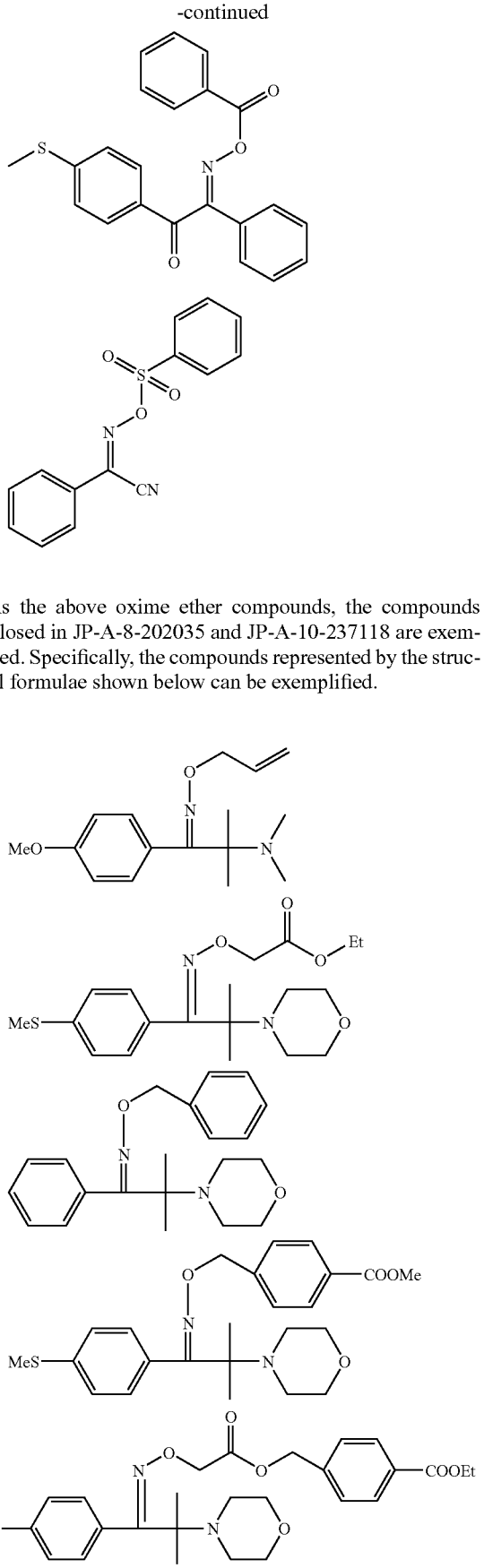
As the above oxime ether compounds, the compounds disclosed in JP-A-8-202035 and JP-A-10-237118 are exemplified. Specifically, the compounds represented by the structural formulae shown below can be exemplified.

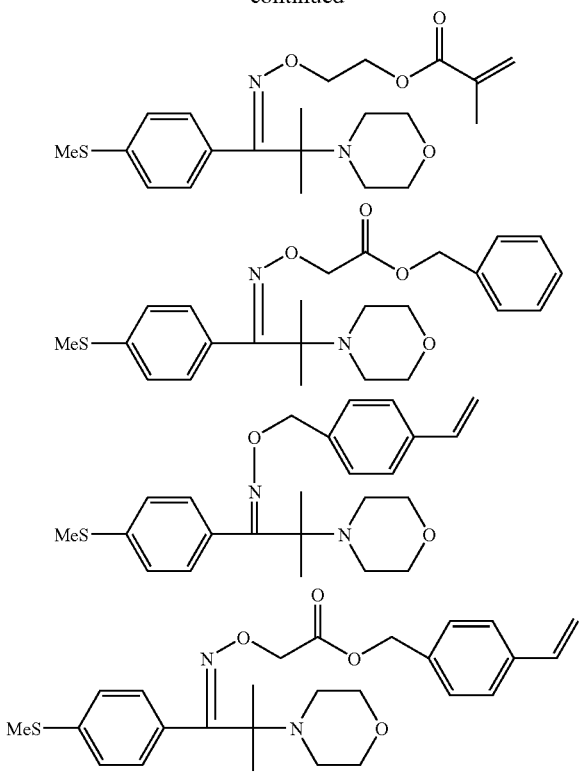

Examples of the onium salt compound include onium salts such as diazonium salts described in S. I. Schlesinger, Photogr. Sci. Eng., 18, 387 (1974) and T. S. Bal et al., Polymer, 21, 423 (1980); ammonium salts described in U.S. Pat. No. 4,069,055 and JP-A-4-365049; phosphonium salts described in U.S. Pat. Nos. 4,069,055 and 4,069,056; iodonium salts described in European Patent 104,143, U.S. Pat. Nos. 339,049 and 410,201, JP-A-2-150848 and JP-A-2-296514; sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581, selenonium salts described in J. V Crivello et al., Macromolecules, 10 (6), 1307 (1977) and J. V Crivello et al., J. Polymer Sci., Polymer Chem. Ed., 17, 1047 (1979); and arsonium salts described in C. S. Wen et al., Teh. Proc. Conf. Rad. Curing ASIA, page 478 (Tokyo, October 1988).

As preferred compounds in view of the reactivity and stability, the above oxime ester compounds and onium salts (e.g., a diazonium salt, an iodonium salt, and a sulfonium salt) are exemplified. In the invention, these onium salts function as ionic radical polymerization initiators not as acid generators.

The onium salt which is suitably used in the present invention is an onium salt represented by any one of the following formulae (RI-I) to (RI-III):

(RI-I)

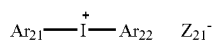
(RI-II)

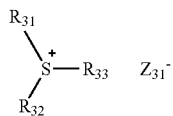
(RI-III)

In formula (RI-I), $Ar_{11}$ represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{11}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion and sulfinate ion are preferred in view of stability.

In formula (RI-II), $Ar_{21}$ and $Ar_{22}$ each independently represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{21}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and carboxylate ion are preferred in view of stability and reactivity.

In formula (RI-III), $R_{31}$, $R_{32}$ and $R_{33}$ each independently represents an aryl, alkyl, alkenyl or alkynyl group having 20 or less carbon atoms, which may have from 1 to 6 substituent(s), and in view of reactivity and stability, preferably represents an aryl group. Examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and carboxylate ion are preferred in view of stability and reactivity. In particular, carboxylate ion described in JP-A-2001-343742 is more preferred, and carboxylate ion described in JP-A-2002-148790 is still more preferred.

Specific examples of the onium salt compound suitable for the present invention are set forth below, but the present invention is not limited thereto.

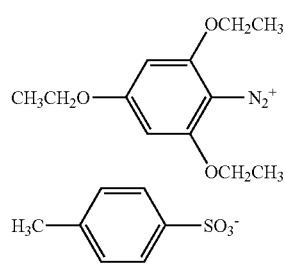
(N-1)

$PF_6^-$ (N-2)

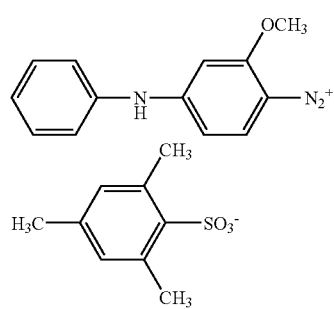
(N-3)

$ClO_4^-$ (N-4)

$PF_6^-$ (N-5)

(N-6)
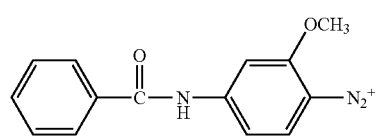
$CF_3SO_3^-$ $BF_4^-$ (N-7)

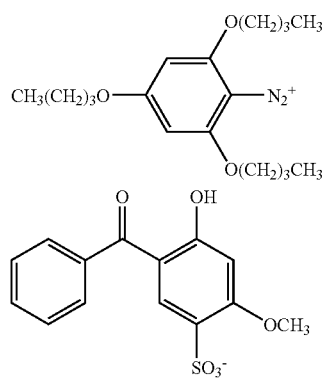
(N-8)

$ClO_4^-$ (N-9)

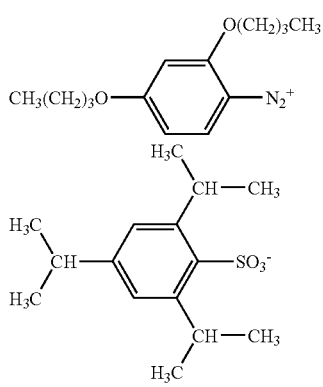
(N-10)

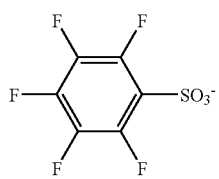
(N-11)

$PF_6^-$ (N-12)

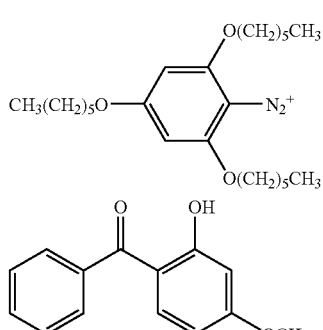
(N-13)

$ClO_4^-$ (N-14)

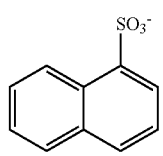
(N-15)

$PF_6^-$ (N-16)

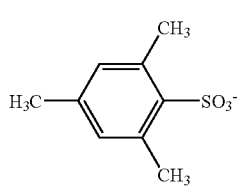
(N-17)

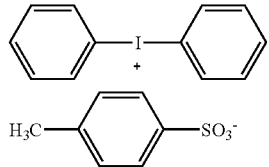
(I-1)

(I-2) PF$_6^-$
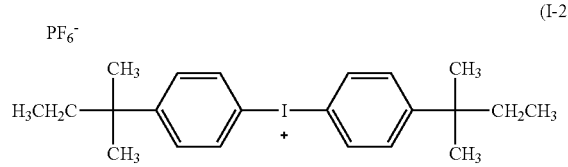
(I-3) PF$_6^-$
(I-4) 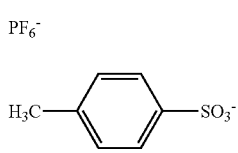
(I-5) ClO$_4^-$
(I-6) 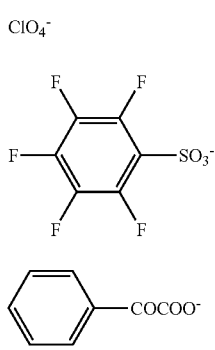
(I-7) 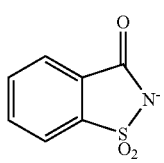
(I-8) CF$_3$SO$_3^-$
(I-9) 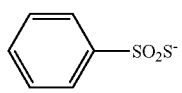
(I-10) 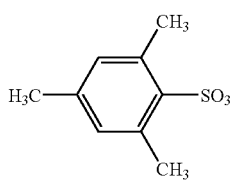
(I-11) 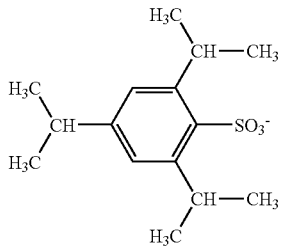
(I-12) 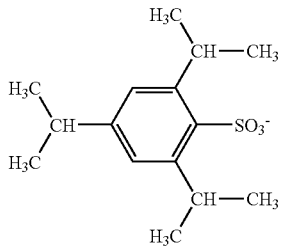
(I-13) 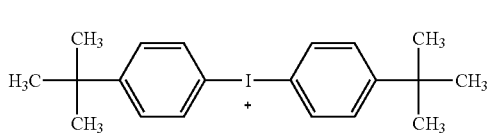
(I-13) 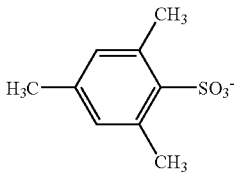
(I-14) ClO$_4^-$
(I-15) PF$_6^-$
(I-16) 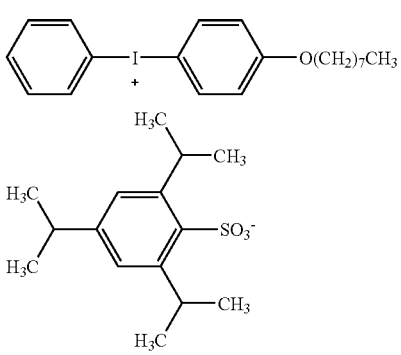
(I-17) CF$_3$COO$^-$
(I-18) CF$_3$SO$_3^-$
(I-19) 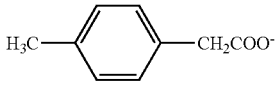
(I-20) 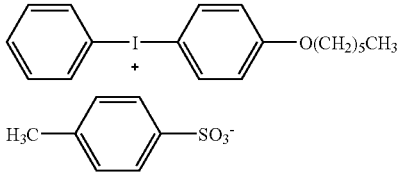
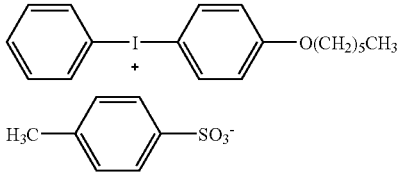
(I-21) 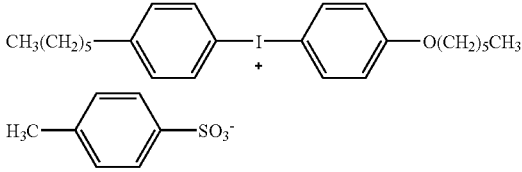
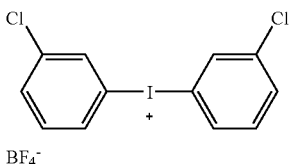
(I-22) 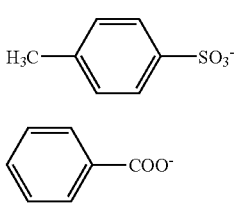
BF$_4^-$
(I-23) 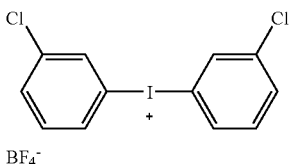
(I-18) 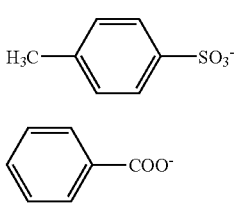

-continued
(S-1)
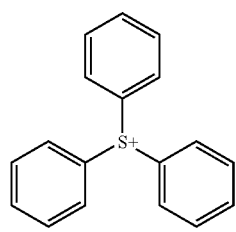
(S-2) PF$_6^-$
(S-3) ClO$_4^-$
(S-4)
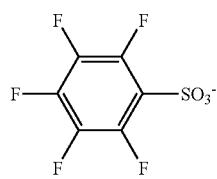
(S-5)
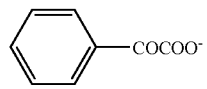
(S-6) CF$_3$SO$_3^-$
(S-7)
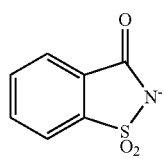
(S-8)
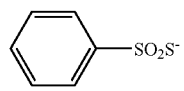
(S-9)
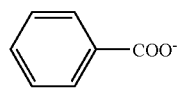
(S-10)
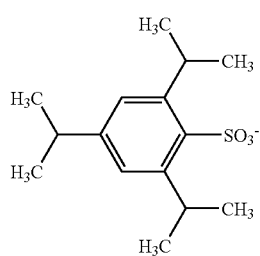
(S-11)
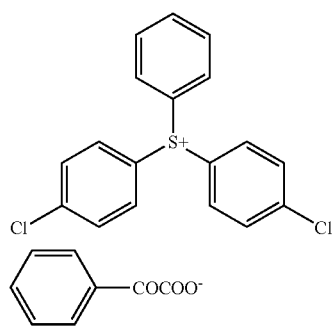
(S-12)
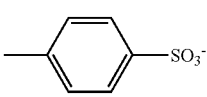
(S-13)
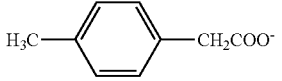
(S-14)
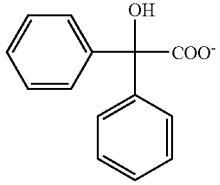
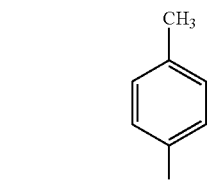
(S-15)
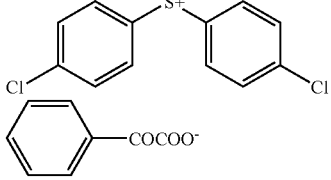
(S-16) BF$_4^-$
(S-17)
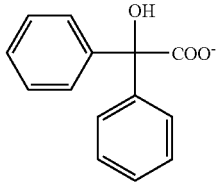
(S-18)
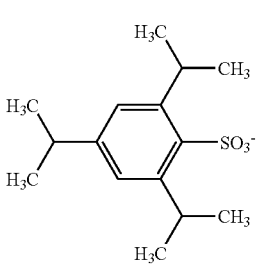
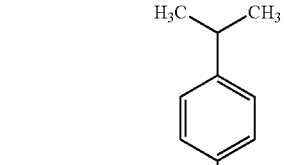
The maximum absorption wavelength of the polymerization initiators for use in the invention is preferably 400 nm or less, more preferably 360 nm or less, and most preferably 300 nm or less. By bringing an absorption wavelength into the ultraviolet region as above, the white light safety of a lithographic printing plate precursor is improved.

These polymerization initiators can be added in proportion of from 0.1 to 50 mass % to the total solids content constituting an image-recording layer, more preferably from 0.5 to 30 mass %, and especially preferably from 1 to 20 mass %. When the polymerization initiator is contained in this range, good sensitivity and soiling resistance of a non-image area at printing can be obtained. Polymerization initiators may be used one kind alone or two or more kinds may be used in combination. Polymerization initiators may be added with other components in the same layer, or other layer may be provided for the addition of polymerization initiators.

<(C) Polymerizable Compound>

The polymerizable compound which can be used in the present invention is an addition-polymerizable compound having at least one ethylenically unsaturated double bond and is selected from compounds having at least one, preferably two or more, ethylenically unsaturated bond(s). Such compounds are widely known in this industrial field and these known compounds can be used in the present invention without any particular limitation.

These compounds have a chemical mode such as a monomer, a prepolymer (that is, dimer, trimer or oligomer) or a mixture or copolymer thereof. Examples of the monomer and its copolymer include an unsaturated carboxylic acid (e.g., acrylic acid, methacrylic acid, itaconic acid, crotonic acid, isocrotonic acid, maleic acid), and esters and amides thereof. Among these, preferred are an ester of an unsaturated carboxylic acid with an aliphatic polyhydric alcohol compound, and an amide of an unsaturated carboxylic acid with an aliphatic polyvalent amine compound. Also, an addition reaction product of an unsaturated carboxylic acid ester or amide having a nucleophilic substituent such as hydroxyl group, amino group or mercapto group with a monofunctional or polyfunctional isocyanate or epoxy, and a dehydrating condensation reaction product with a monofunctional or polyfunctional carboxylic acid may be suitably used. Furthermore, an addition reaction product of an unsaturated carboxylic acid ester or amide having an electrophilic substituent such as isocyanate group or epoxy group with a monofunctional or polyfunctional alcohol, amine or thiol, and a displacement reaction product of an unsaturated carboxylic acid ester or amide having a desorptive substituent such as halogen group or tosyloxy group with a monofunctional or polyfunctional alcohol, amine or thiol may also be suitably used. Other than these, compounds where the unsaturated carboxylic acid of the above-described compound is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane and bis[p-(methacryloxyethoxy) phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Examples of other esters include aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetris-acrylamide, xylylenebisacrylamide and xylylenebismethacrylamide. Other preferred examples of the amide-type monomer include those having a cyclohexylene structure described in JP-B-54-21726.

A urethane-based addition-polymerizable compound produced by using an addition reaction of an isocyanate with a hydroxyl group is also preferred and specific examples thereof include a vinyl urethane compound having two or more polymerizable vinyl groups within one molecule described in JP-B-48-41708, which are obtained by adding a vinyl monomer having a hydroxyl group represented by the following formula (A) to a polyisocyanate compound having two or more isocyanate groups within one molecule:

$$CH_2=C(R_4)COOCH_2CH(R_5)OH \qquad (A)$$

(wherein $R_4$ and $R_5$ each represents H or $CH_3$).

In addition, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, by using addition-polymerizable compounds having an amino or sulfide structure within the molecule described in JP-A-63-277653, JP-A-63-260909 and JP-A-1-105238, a photopolymerizable composition having very excellent photosensitization speed can be obtained.

Other examples include a polyfunctional acrylate or methacrylate such as polyester acrylates described in JP-A-48-64183, JP-B-49-43191 and JP-B-52-30490 and epoxy acrylates obtained by reacting an epoxy resin with a (meth)acrylic acid. In addition, a specific unsaturated compound described in JP-B-46-43946, JP-B-1-40337 and JP-B-1-40336, and a vinyl phosphonic acid-based compound described in JP-A-2-25493 may be used.

In some cases, a structure containing a perfluoroalkyl group described in JP-A-61-22048 is suitably used. Furthermore, those described as a photocurable monomer or oligomer in Adhesion, Vol. 20, No. 7, pp. 300-308 (1984) may also be used.

Details of the usage of these addition-polymerizable compounds, such as structure, sole or combination use and amount added, can be freely selected in accordance with the performance design of final lithographic printing plate precursor and, for example, may be selected from the following standpoints.

In view of sensitivity, a structure having a large unsaturated group content per one molecule is preferred and in many cases, a bifunctional or greater functional compound is preferred. For increasing the strength of image area, namely, cured film, a trifunctional or greater functional compound is preferred. Also, a method of controlling both sensitivity and strength by using a combination of compounds differing in the functional number and in the polymerizable group (for example, an acrylic acid ester, a methacrylic acid ester, a styrene-based compound or a vinyl ether-based compound) is effective.

The selection and usage of the addition-polymerizable compound are important factors also for the compatibility and dispersibility with other components (e.g., water-insoluble polymer, initiator, colorant) in the image recording layer. For example, the compatibility may be improved in some cases by using a low purity compound or using two or more compounds in combination. Also, a specific structure may be selected for the purpose of enhancing the adhesion to the substrate, protective layer which is described later, or the like.

The above polymerizable compounds are used in a range of preferably from 5 to 80 mass % in an image-recording layer, and more preferably from 25 to 75 mass %. They may be used alone or two or more polymerizable compounds may be used in combination. Proper structure, proportion and addition amount of polymerizable compounds can be arbitrarily selected in view of the degree of polymerization hindrance by oxygen, resolution, a fogging property, refractive index change, and surface stickiness, and layer constitution and coating method such as under coating and top coating can also be adopted.

Other Components:

Besides the above components (A), (B) and (C), the image recording layer in the invention can contain, e.g., a binder polymer, a surfactant, a colorant, a printing out agent, a polymerization inhibitor (a thermal polymerization preventive), a higher fatty acid derivative, a plasticizer, inorganic fine particles, and a low molecular weight compound.

For the improvement of film properties and on-press developability of the image-recording layer, a binder polymer can be used in the invention. Conventionally well-known binder polymers can be used with no restriction, and linear organic polymers having film properties are preferably used. As the examples of such binder polymers, an acrylic resin, a polyvinyl acetal resin, a polyurethane resin, a polyurea resin, a polyimide resin, a polyamide resin, an epoxy resin, a methacrylic resin, a polystyrene resin, a novolak type phenolic resin, a polyester resin, a synthetic rubber and a natural rubber are exemplified.

As more preferred binder polymers, (meth)acrylic resins, i.e., polymers of (meth)acrylic acid esters, are exemplified. Of such polymers, copolymers of alkyl(meth)acrylate and a monomer of a (meth)acrylic acid ester in which the R moiety of —COOR has a —CH$_2$CH$_2$O— structure are preferred. The specific examples thereof are shown below, but the invention is not restricted thereto.

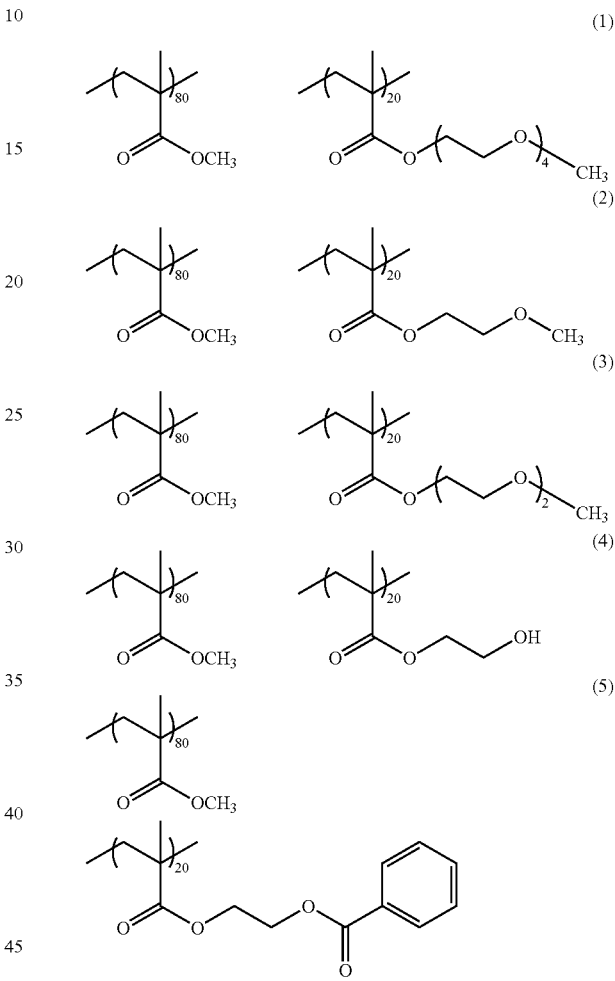

For heightening the film strength of image areas, it is preferred for binder polymers to have a crosslinking property. For imparting a crosslinking property to binder polymers, it is effective to introduce a crosslinkable functional group such as an ethylenic unsaturated bond into the main chain or side chain of binder polymers. A crosslinkable functional group may be introduced by copolymerization or by polymeric reaction.

As the examples of polymers having an ethylenic unsaturated bond in the main chain of a molecule, poly-1,4-butadiene and poly-1,4-isoprene are exemplified.

As the examples of polymers having an ethylenic unsaturated bond in the side chain of a molecule, polymers of ester or amide of an acrylic acid or a methacrylic acid are exemplified, i.e., polymers in which at least a part of the residue of the ester or amide (R of —COOR or CONHR) has an ethylenic unsaturated bond.

The examples of residues having an ethylenic unsaturated bond (the above R) include —(CH$_2$)$_n$CR$^1$═CR$^2$R$^3$, —(CH$_2$O)$_n$CH$_2$CR$^1$=CR$^2$R$^3$, —(CH$_2$CH$_2$O)$_n$CH$_2$CR$^1$=CR$^2$R$^3$, —(CH$_2$)$_n$NH—CO—O—CH$_2$CR$^1$=CR$^2$R$^3$, —(CH$_2$)$_n$—O—CO—CR$^1$=CR$^2$R$^3$, and (CH$_2$CH$_2$O)$_2$—X (in the formulae, R$^1$, R$^2$ and R$^3$ each represents a hydrogen atom, a halogen atom, an alkyl group having from 1 to 20 carbon atoms, an aryl group, an alkoxyl group or an aryloxy group, and R$^1$ and R$^2$ or R$^3$ may be bonded to each other to form a ring, n represents an integer of from 1 to 10, and X represents a dicyclopentadienyl residue).

The specific examples of ester residues include —CH$_2$CH=CH$_2$, —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$OCOC(CH$_3$)=CH$_2$, —CH$_2$CH$_2$OCOCH=CH$_2$, —CH$_2$CH$_2$—NH—COO—CH$_2$CH=CH$_2$, and —CH$_2$CH$_2$O—X (wherein X represents a dicyclopentadienyl residue).

The specific examples of amide residues include —CH$_2$CH=CH$_2$, —CH$_2$CH$_2$—Y (wherein Y represents a cyclohexene residue), and —CH$_2$CH$_2$—OCO—CH=CH$_2$.

When free radicals (polymerization initiating radicals or the grown radicals of a polymerizable compound in the polymerization process) are added to the crosslinkable functional groups of a binder polymer having a crosslinking property, addition polymerization occurs directly between the polymers or via the polymeric chains of the polymerizable compound, as a result, crosslinking is formed between the molecules of the polymers, and the binder polymer is hardened. Alternatively, the atoms in the polymer (e.g., the hydrogen atoms on the carbon atoms contiguous to the crosslinkable functional groups) are extracted by free radicals and polymer radicals are grown, and the polymer radicals are bonded to each other, whereby crosslinking is formed between the polymer molecules, so that the binder polymer is hardened.

The content of crosslinkable groups in a binder polymer (the content of radical polymerizable unsaturated double bonds by iodometry) is preferably from 0.1 to 10.0 mmol per 1 g of the binder polymer, more preferably from 1.0 to 7.0 mmol, and most preferably from 2.0 to 5.5 mmol. When the content of crosslinkable groups is in this range, good sensitivity and good aging stability can be obtained.

From the viewpoint of the improvement of the on-press developability of an unexposed area of an image-recording layer, it is preferred that binder polymers have high solubility or dispersibility in ink and/or a fountain solution.

For improving the solubility or dispersibility in ink, binder polymers are preferably lipophilic, and for improving the solubility or dispersibility in a fountain solution, binder polymers are preferably hydrophilic. Accordingly, it is also effective in the invention to use a lipophilic binder polymer and a hydrophilic binder polymer in combination.

As hydrophilic binder polymers, binder polymers having a hydrophilic group, e.g., a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group are preferably exemplified.

The specific examples of hydrophilic binder polymers include gum arabic, casein, gelatin, starch derivative, carboxymethyl cellulose and the sodium salt thereof, cellulose acetate, sodium alginate, vinyl acetate-maleic acid copolymers, styrene-maleic acid copolymers, polyacrylic acids and the salts thereof, polymethacrylic acids and the salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of 60 mol % or more, preferably 80 mol % or more, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide, polyvinyl pyrrolidone, alcohol-soluble nylon, and polyether of 2,2-bis(4-hydroxy-phenyl)propane and epichlorohydrin.

The binder polymers preferably have a mass average molecular weight of preferably 5,000 or higher, more preferably from 10,000 to 300,000, and a number average molecular weight of preferably 1,000 or higher, more preferably from 2,000 to 250,000. The polydisperse degree (mass average molecular weight/number average molecular weight) is preferably from 1.1 to 10.

The binder polymers may be any of random polymers, block polymers and graft polymers, but random polymers are preferred.

These binder polymers can be synthesized according to conventionally well-known methods. Binder polymers having a crosslinking group can be easily synthesized according to radical polymerization or polymeric reaction.

The binder polymers may be used alone or as a mixture of two or more.

The content of the binder polymers is preferably from 10 to 90 mass % to the total solids content of the image-recording layer, and more preferably from 20 to 80 mass %. When the binder polymers are used in this range, preferred strength of an image area and good image-forming property can be obtained.

It is preferred to use a polymerizable compound and the binder polymer in mass ratio of from 1/9 to 7/3.

In the invention, it is preferred to use a surfactant in an image-recording layer to accelerate the on-press developability at the time of initiating printing and to improve the conditions of coating surface. As the surfactants for these purposes, nonionic surfactants, anionic surfactants, cationic surfactants, ampholytic surfactants and fluorine surfactants are used. Surfactants may be used alone or two or more surfactants may be used in combination.

The nonionic surfactant for use in the present invention is not particularly limited and a conventionally known nonionic surfactant can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, a polyoxyethylene alkylamine, a triethanolamine fatty acid ester, a trialkylamine oxide, a polyethylene glycol and a copolymer of polyethylene glycol and polypropylene glycol.

The anionic surfactant for use in the present invention is not particularly limited and a conventionally known anionic surfactant can be used. Examples thereof include fatty acid salts, abietates, hydroxyalkanesulfonates, alkanesulfonates, dialkylsulfosuccinic ester salts, linear alkylbenzenesulfonates, branched alkylbenzenesulfonates, alkylnaphthalenesulfonates, alkylphenoxypolyoxyethylenepropylsulfonates, polyoxyethylenealkylsulfophenyl ether salts, an N-methyl-N-oleyltaurine sodium salt, a monoamide disodium N-alkylsulfosuccinate, petroleum sulfonates, a sulfated beef tallow oil, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene/maleic anhydride copolymerization products, partially saponified olefin/maleic anhydride copolymerization products, and naphthalenesulfonate formalin condensates.

The cationic surfactant for use in the present invention is not particularly limited and a conventionally known cationic surfactant can be used. Examples thereof include alkylamine salts, quaternary ammonium salts, polyoxyethylene alkylamine salts and polyethylene polyamine derivatives.

The amphoteric surfactant for use in the present invention is not particularly limited and a conventionally known amphoteric surfactant can be used. Examples thereof include carboxybetaines, aminocarboxylic acids, sulfobetaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester; an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, a fluorine-containing surfactant described in JP-A-62-170950, JP-A-62-226143 and JP-A-60-168144 may also be suitably used.

The surfactants can be used individually or in combination of two or more thereof.

The surfactant content is preferably from 0.001 to 10 mass %, more preferably from 0.01 to 5 mass %, in the image-recording layer.

In the present invention, a dye having large absorption in the visible light region can be used as a colorant for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and a dye described in JP-A-62-293247. Also, a pigment such as phthalocyanine-based pigment, azo-based pigment, carbon black and titanium oxide may be suitably used.

The colorant is preferably added, because the image area and the non-image area after image formation can be clearly distinguished. The amount of the colorant added is preferably from 0.01 to 10 mass % in the image-recording layer.

In the image-recording layer of the present invention, a compound of undergoing discoloration by the effect of an acid or a radical can be added so as to produce a print-out image. As such a compound, for example, various dyes such as diphenylmethane-based, triphenylmethane-based, thiazine-based, oxazine-based, xanthene-based, anthraquinone-based, iminoquinone-based, azo-based and azomethine-based dyes are effective.

Specific examples thereof include dyes such as Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red 5B [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminotriphenyl methane (Leuco Crystal Violet) and Pergascript Blue SRB (produced by Ciba Geigy).

Other suitable examples include leuco dyes known as a material for heat-sensitive or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye of undergoing discoloration by the effect of an acid or a radical is preferably added in an amount of 0.01 to 10 mass % in the image-recording layer.

In the image-recording layer of the present invention, a small amount of a thermopolymerization inhibitor is preferably added so as to prevent the radical polymerizable compound from undergoing unnecessary thermopolymerization during the preparation or storage of the image-recording layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The thermopolymerization inhibitor is preferably added in an amount of about 0.01 to about 5 mass % in the image-recording layer.

In the image-recording layer of the present invention, for example, a higher fatty acid derivative such as behenic acid or behenic acid amide may be added and localized on the surface of the image-recording layer during drying after coating so as to prevent polymerization inhibition by oxygen. The amount of the higher fatty acid derivative added is preferably from about 0.1 to about 10 mass % based on the entire solid content of the image-recording layer.

The image-recording layer of the present invention may contain a plasticizer. Suitable examples of the plasticizer include phthalic acid esters such as dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate. The plasticizer content is preferably about 30 mass % or less in the image-recording layer.

For heightening interfacial adhesion by surface roughening treatment, and for the improvement of the hardened layer strength of an image area and the on-press developability of a non-image area, the image-recording layer in the invention may contain inorganic fine particles.

As the inorganic fine particles, e.g., silica, alumina, magnesium oxide, titanium oxide, magnesium carbonate, calcium alginate and mixtures of these fine particles are preferably used.

The average particle size of the inorganic fine particles is preferably from 5 nm to 10 μm, and more preferably from 0.5 to 3 μm. When the average particle size is in this range, the inorganic fine particles are stably dispersed in the image-recording layer, and the layer strength of the image-recording layer can be sufficiently maintained, so that a non-image area difficult to be soiled and excellent in hydrophilicity can be formed.

These inorganic fine particles are easily available as commercial products of colloidal silica dispersion and the like.

The content of the inorganic fine particles is preferably 20 mass % or less to all the solids content of the image recording layer, and more preferably 10 mass % or less.

For the improvement of on-press developability, the image-recording layer in the invention may contain hydrophilic low molecular weight compounds. As the hydrophilic low molecular weight compounds, water-soluble organic compounds, such as glycols, e.g., ethylene glycol, diethylene glycol, triethylene glycol, propylene glycol, dipropylene glycol, tripropylene glycol, and ether or ester derivatives of these glycols, polyhydroxies, e.g., glycerol and pentaerythritol, organic amines, e.g., triethanolamine, diethanolamine and monoethanolamine, and salts of these organic amines, organic sulfonic acids, e.g., toluenesulfonic acid and benzene-sulfonic acid, and salts of these organic sulfonic acids, organic phosphonic acids, e.g., phenylphosphonic acid, and salts of phenylphosphonic acid, organic carboxylic acids, e.g., tartaric acid, oxalic acid, citric acid, malic acid, lactic acid, gluconic acid and amino acid, and salts of these organic carboxylic acids, and organic quaternary ammonium salts, e.g., tetraethylamine hydrochloride are exemplified.

Formation of Image-Recording Layer:

As the method of incorporating the constitutional components of image-recording layer into an image-recording layer, some embodiments can be used in the invention. One embodiment is a molecular dispersion type image-recording layer of dissolving the constitutional components in an appropriate solvent and coating the resulting solution as disclosed, e.g., in JP-A-2002-287334, and another embodiment is a microcapsule type image-recording layer of encapsulating all or a part of the constitutional components in microcapsules and incorporating into the image-recording layer as disclosed, e.g., in JP-A-2001-277740 and JP-A-2001-277742. In addition, in the microcapsule type image-recording layer, it is also possible to incorporate the constitutional components outside the microcapsules. Here, it is a preferred embodiment of the microcapsule type image-recording layer that hydrophobic constitutional components are encapsulated in microcapsules and hydrophilic constituents are incorporated outside the microcapsules. As a further embodiment, an image recording layer containing crosslinking resin particles, i.e., microgels, can be exemplified. The microgels can contain image-recording layer constituents in the inside and/or on the surface of the microgels. An embodiment where the microgels are reactive microgels having a polymerizable compound on the surface thereof is especially preferred from the viewpoints of image-forming sensitivity and press life. For achieving better on-press developability, it is preferred to contain microcapsules and/or microgels in an image-recording layer.

For the microencapsulation and/or microgelation of the constitutional components of the image-recording layer, well known methods can be used. For example, as the manufacturing method of microcapsules, a method making use of coacervation as disclosed in U.S. Pat. Nos. 2,800,457 and 2,800,458, an interfacial polymerization method as disclosed in U.S. Pat. No. 3,287,154, JP-B-38-19574 (the term "JP-B" as used herein refers to an "examined Japanese patent publication"), and JP-B-42-446, a method by the precipitation of a polymer as disclosed in U.S. Pat. Nos. 3,418,250 and 3,660,304, a method of using isocyanate polyol wall materials as disclosed in U.S. Pat. No. 3,796,669, a method of using isocyanate wall materials as disclosed in U.S. Pat. No. 3,914,511, a method of using urea-formaldehyde series or urea-formaldehyde-resorcinol series wall materials as disclosed in U.S. Pat. Nos. 4,001,140, 4,087,376 and 4,089,802, a method of using wall materials of melamine-formaldehyde resins, hydroxy cellulose and the like as disclosed in U.S. Pat. No. 4,025,445, an in situ method by monomer polymerization as disclosed in JP-B-36-9163 and JP-B-51-9079, a spray drying method as disclosed in British Patent 930,422 and U.S. Pat. No. 3,111,407, and an electrolytic dispersion cooling method as disclosed in British Patents 952,807 and 967,074 can be exemplified, but the invention is not restricted to these methods.

The microcapsule and/or microgel walls preferably used in the invention have a three dimensional crosslinking structure and a property of swelling with a solvent. From such a viewpoint, polyurea, polyurethane, polyester, polycarbonate, polyamide, and mixtures of these compounds are preferably used as the microcapsule and/or nicrogel wall materials, and polyurea and polyurethane are especially preferred. Further, a compound having a crosslinkable functional group such as an ethylenic unsaturated bond that can be introduced into the above binder polymers may be introduced into microcapsule and/or microgel walls.

The average particle size of the microcapsules and/or microgel is preferably from 0.01 to 3.0 µm, more preferably from 0.05 to 2.0 µm, and especially preferably from 0.10 to 1.0 µm. Good resolution and aging stability can be obtained in this range of the average particle size.

The image-recording layer in the invention is formed by coating a coating solution prepared by dispersing or dissolving the above necessary constituents in a solvent according to any of the above embodiments. As the solvents used here, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulforan, γ-butyrolactone, toluene, and water are exemplified, but the solvents are not limited thereto. These solvents are used alone or as a mixture. The concentration of the solids content of the coating solution is preferably from 1 to 50 mass %.

It is also possible to form the image-recording layer in the invention by preparing a plurality of coating solutions by dispersing or dissolving the same or different components described above in the same or different solvents, and repeating the coating and drying a plurality of times.

The coating weight of the image-recording layer (solids content) is preferably from 0.3 to 1.5 g/m$^2$, and more preferably from 0.5 to 1.5 g/m$^2$.

As the coating method, various coating methods can be used, e.g., bar coating, rotary coating, spray coating, curtain coating, dip coating, air knife coating, blade coating, and roll coating can be used.

Image-Recording Layer (2):

In the next place, the image-recording layer of the lithographic printing plate precursors described in claims 7 to 16 is explained. The image-recording layer contains (A) an actinic ray absorber, (B) a polymerization initiator, and (D) a binder polymer, and is capable of removing with a printing ink or a fountain solution or both of them.

The same actinic ray absorber (A) and polymerization initiator (B) as described in image-recording layer (1) can be used in image-recording layer (2).

(D) Binder Polymer:

The image-recording layer contains a polymer having an ethylene oxide group as the binder polymer.

Of such binder polymers, graft polymers having a main chain polymer and a side chain of polyethylene oxide (PEO), and block copolymers having both a PEO block and a non-PEO block are especially preferred.

It is preferred that the graft and block copolymers are amphipathic, that is, it is preferred to have both a hydrophilic segment and a hydrophobic segment, further, the graft and block copolymers themselves are preferably water-insoluble. Although the reason is not clear, the combination of a hydrophilic segment and a hydrophobic segment is important for widening the difference between an exposed area and an unexposed area.

The glass transition point Tg of the binder polymers for use in the invention is preferably in the range of from −10 to 220° C. or so, more preferably from 0 to 140° C. or so, and especially preferably from 10 to 100° C. or so. Binder polymers having Tg of the above range are solids, and preferably non-elastomeric. The binder polymers may be crosslinked but preferably not crosslinked. The glass transition point Tg of the main chain polymer of the graft copolymer and the non-PEO block of the block copolymer is preferably in the range of from 40 to 220° C. or so, more preferably from 50 to 140° C. or so, and especially preferably from 60 to 130° C. or so.

The number average molecular weight of the graft and block copolymers is preferably from 2,000 to 2,000,000 or so. The number average molecular weight (Mn) of the PEO segment is preferably in the range of from 500 to 10,000 or so, more preferably in the range of from 600 to 8,000 or so, and especially preferably in the range of from 750 to 4,000 or so. By making the Mn value about 500 or more, hydrophilic segments are sufficient, and aqueous development can be sufficiently accelerated. However, the ink receptivity in an image area decreases when the Mn value of the polyethylene oxide part is 10,000 or more.

The amount of PEO segments in the graft copolymer is generally from 0.5 to 60 mass % or so, preferably from 2 to 50 mass % or so, more preferably from 5 to 40 mass % or so, and especially preferably from 5 to 20 mass % or so. The amount of PEO segments in the block copolymer is generally from 5 to 60 mass % or so, preferably from 10 to 50 mass % or so, and more preferably from 10 to 30 mass % or so. When the graft and block copolymers are low in PEO segments, developability is liable to lower, on the other hand, an excess amount of PEO segments leads to the reduction of ink receptivity in an image area.

The binder polymer is present in an amount sufficient to maintain the image-recording layer as a film. The amount of the binder polymer is preferably 2 mass % or more to the image-recording layer, more preferably in the range of from 5 to 90 mass %, and still more preferably in the range of from 10 to 60 mass %. When the amount of the PEO segments in the binder polymer increases, aqueous developability is liable to be high. However, an excess amount of the PEO segments results in the reduction of ink receptivity in an image area.

It is preferred for the graft copolymer to have a hydrophobic high molecular skeleton and a plurality of pendent groups represented by the following formula.

In the formula, Q represents a bifunctional linking group; W is selected from the group consisting of a hydrophilic segment and a hydrophobic segment; and Y is selected from the group consisting of a hydrophilic segment and a hydrophobic segment, provided that when W is a hydrophilic segment, Y is selected from the group consisting of a hydrophilic segment and a hydrophobic segment, and when W is hydrophobic, Y is a hydrophilic segment.

The terminology of "graft" polymer or copolymer in the specification of the invention means a polymer having a group having a molecular weight of at least 200 as the side chain. Such a graft copolymer can be obtained by a grafting method using an anion, a cation, a nonion or a free radical, or by the polymerization or copolymerization of a monomer having such a group. The terminology of "polymer" in the specification of the invention means high molecular weight or low molecular weight polymers including an oligomer, a homopolymer and a copolymer. The terminology of "copolymer" means a polymer derived from two or more kinds of different monomers. The terminology of "skeleton" means an atomic chain in a polymer having a plurality of pendent groups. As the example of such a skeleton, a skeleton comprising carbon atoms alone obtained from the polymerization function of an olefin-based unsaturated monomer is exemplified.

Each unit of the graft copolymer preferably comprises a repeating unit represented by the following formula.

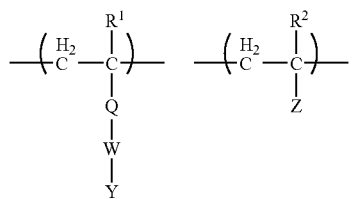

In the formula, $R^1$ and $R^2$ are each selected from the group consisting of H, alkyl, aryl, aralkyl, alkaryl, $COOR^5$, $R^6CO$, halogen and a cyano group. $R^1$ and $R^6$ each represents H or alkyl.

Q is selected from the group consisting of the following compounds.

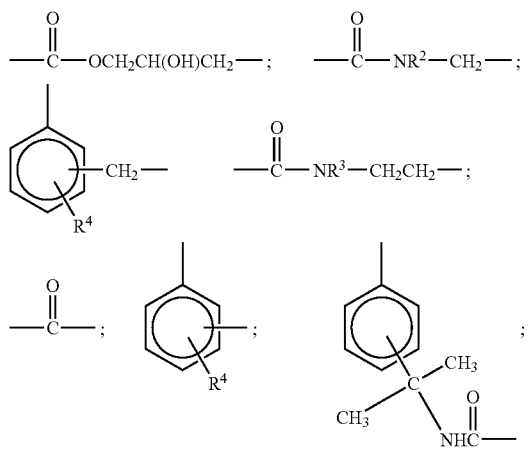

In the above formulae, $R^3$ is selected from the group consisting of H and alkyl.

$R^4$ is selected from the group consisting of H, alkyl, halogen, cyano, nitro, alkoxyl, alkoxycarbonyl, acyl, and the combinations of these groups.

W is selected from the group consisting of a hydrophilic segment and a hydrophobic segment.

Y is selected from the group consisting of a hydrophilic segment and a hydrophobic segment.

Z is selected from the group consisting of H, alkyl, halogen, cyano, acyloxy, alkoxyl, alkoxycarbonyl, hydroxyalkoxycarbonyl, acyl, aminocarbonyl, aryl and substituted aryl.

However, when W is a hydrophilic segment, Y is selected from the group consisting of a hydrophilic segment and a hydrophobic segment, and when W is hydrophobic, Y is a hydrophilic segment.

In some embodiment of the invention, the graft copolymer of the invention comprises primarily a hydrophobic main chain segment and primarily a hydrophilic branched segment.

In another embodiment of the invention, the graft copolymer of the invention comprises primarily a hydrophobic main chain segment, and a branched segment having both a hydrophilic segment and a hydrophobic segment.

The hydrophilic segment W of the graft copolymer of the invention is preferably a segment represented by the following formula.

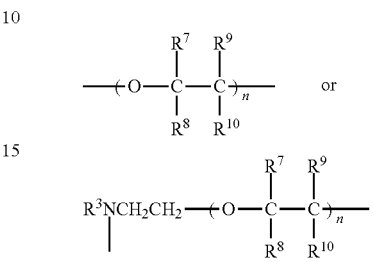

In the above formulae, $R^7$, $R^8$, $R^9$ and $R^{10}$ each represents hydrogen.

$R^3$ may be H or alkyl.

n is from 1 to 250, preferably from 2 to 120, and more preferably from 6 to 60.

The hydrophobic segment in W may be any of $—R^{12}—$, $—O—R^{12}—O—$, $—R^3N—R^{12}—NR^3—$, $—OOC—R^{12}—O—$ and $—COO—R^{12}—O—$, wherein each $R^{12}$ represents straight chain, branched chain or cyclic alkylene having from 6 to 120 carbon atoms, haloalkylene having from 6 to 120 carbon atoms, arylene having from 6 to 120 carbon atoms, alkarylene having from 6 to 120 carbon atoms, or aralkylene having from 6 to 120 carbon atoms, and $R^3$ may be H or alkyl.

The hydrophilic segment in Y may be any of H, $R^{15}$, OH, $OR^{16}$, COOH, $COOR^6$, $O_2CR^{16}$ and a segment represented by any of the following formulae.

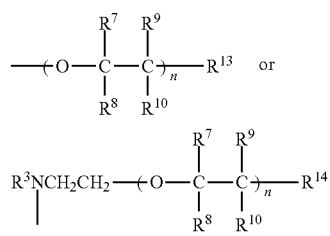

In the above formulae, $R^7$, $R^8$, $R^9$ and $R^{10}$ each represents hydrogen, $R^3$ may be any of H and alkyl, $R^{13}$, $R^{14}$, $R^{15}$ and $R^{16}$ each represents H, or alkyl having from 1 to 5 carbon atoms, and n is from 1 to 250, preferably from 2 to 120, and more preferably from 6 to 60.

The hydrophobic segment in Y may be any of straight chain, branched chain or cyclic alkyl having from 6 to 120 carbon atoms, haloalkyl having from 6 to 120 carbon atoms, aryl having from 6 to 120 carbon atoms, alkaryl having from 6 to 120 carbon atoms, aralkyl having from 6 to 120 carbon atoms, $OR^{17}$, $COOR^{17}$ and $O_2CR^{17}$, wherein $R^{17}$ represents alkyl having from 6 to 20 carbon atoms.

As a preferred specific example, the graft copolymer has a repeating unit represented by the following formula.

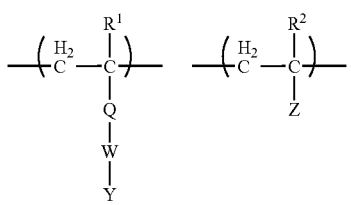

In the formula, $R^1$ and $R^2$ each represents H, alkyl, aryl, aralkyl, alkaryl, $COOR^5$, $R^6CO$, halogen or cyano, and $R^5$ and $R^6$ are each H or alkyl.

Q may be any one of the following compounds.

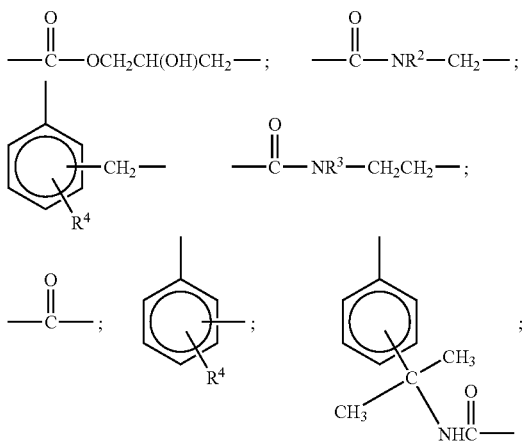

In the above formulae, $R^3$ may be any of H and alkyl.

Each $R^4$ may be any of H, alkyl, halogen, cyano, nitro, alkoxyl, alkoxycarbonyl, acyl, and the combinations of these groups.

W is selected from the group consisting of a hydrophilic segment and a hydrophobic segment.

Y is selected from the group consisting of a hydrophilic segment and a hydrophobic segment.

Z is selected from the group consisting of H, alkyl, halogen, cyano, acyloxy, alkoxyl, alkoxycarbonyl, hydroxyalkoxycarbonyl, acyl, aminocarbonyl, aryl and substituted aryl. The substituent of the substituted aryl may be any of alkyl, halogen, cyano, alkoxyl and alkoxycarbonyl, and the alkyl group is preferably an alkyl group having from 1 to 22 carbon atoms.

However, when W is a hydrophilic segment, Y is selected from the group consisting of a hydrophilic segment and a hydrophobic segment, and when W is hydrophobic, Y is a hydrophilic segment.

Segment W may be a hydrophilic segment or a hydrophobic segment.

The hydrophilic segment may be any of the segments represented by the following formulae.

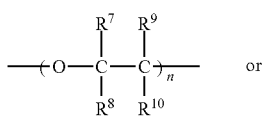 or

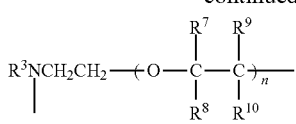

In the formulae, $R^7$, $R^8$, $R^9$ and $R^{10}$ each represents hydrogen.

$R^3$ may be any of H and alkyl.

n is from 1 to 250, preferably from 2 to 120, and more preferably from 6 to 60.

The hydrophobic segment may be any of $-R^{12}-$, $-O-R^{12}-O-$, $-R^3N-R^2-NR^3-$, $-OC-R^{12}-O-$ and $-COO-R^{12}-O-$, wherein each $R^{12}$ represents straight chain, branched chain or cyclic alkylene having from 6 to 120 carbon atoms, haloalkylene having from 6 to 120 carbon atoms, arylene having from 6 to 120 carbon atoms, alkarylene having from 6 to 120 carbon atoms, or aralkylene having from 6 to 120 carbon atoms, and $R^3$ may be H or alkyl.

Y may be a hydrophilic segment or a hydrophobic segment.

The hydrophilic segment may be any of H, $R^{15}$, OH, $OR^{16}$, COOH, $COOR^{16}$, $O_2CR^{16}$ and a segment represented by any of the following formulae.

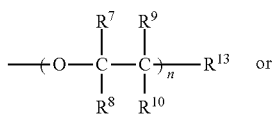 or

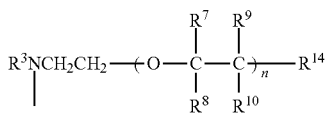

In the above formulae, $R^7$, $R^8$, $R^9$ and $R^{10}$ each represents hydrogen, $R^3$ may be any of H and alkyl, $R^{13}$, $R^{14}$, $R^{15}$ and $R^{16}$ each represents H, or alkyl having from 1 to 5 carbon atoms, and n is from 1 to 250, preferably from 2 to 120, and more preferably from 6 to 60.

The hydrophobic segment in Y may be any of straight chain, branched chain or cyclic alkyl having from 6 to 120 carbon atoms, haloalkyl having from 6 to 120 carbon atoms, aryl having from 6 to 120 carbon atoms, alkaryl having from 6 to 120 carbon atoms, aralkyl having from 6 to 120 carbon atoms, $OR^7$, $COOR^{17}$ and $O_2CR^7$, wherein $R^{17}$ represents alkyl having from 6 to 20 carbon atoms.

Another embodiment in which segment W—Y is represented by the following formula is also preferred.

Here, n is from 1 to 250, preferably from 2 to 120, and more preferably from 6 to 60.

In the preferred embodiment above, the graft copolymer has, e.g., a repeating unit represented by the following formula.

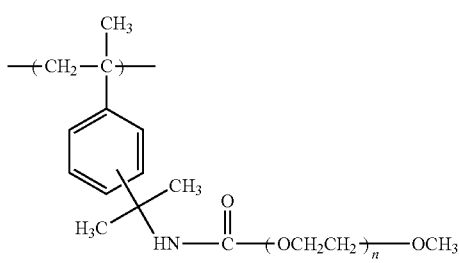

Here, n is from 1 to 250, preferably from 2 to 120, and more preferably from 6 to 60.

In another preferred embodiment, the graft copolymer has a repeating unit represented by the following formula.

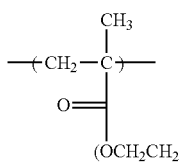 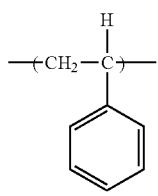

Here, n is from 1 to 250, preferably from 2 to 120, and more preferably from 6 to 60.

Another preferred embodiment is that the main chain polymer of the graft copolymer of the invention is comprised of a monomer unit selected from the group consisting of acrylic acid ester, methacrylic acid ester, styrene, acrylic acid, methacrylic acid, and combinations thereof. The monomer unit is more preferably methyl methacrylate, allyl methacrylate, or a combination thereof.

The graft copolymer having a hydrophobic segment and/or a hydrophilic segment can be synthesized according to the process comprising the following procedures (A) and (B).

Procedure (A):

A polymerizable graft monomer is synthesized by reacting the following components (i) and (ii).

(i) A compound represented by the following formula:

In the formula, W is selected from the group consisting of a hydrophilic segment and a hydrophobic segment, Y is selected from the group consisting of a hydrophilic segment and a hydrophobic segment, provided that when W is a hydrophilic segment, Y is selected from the group consisting of a hydrophilic segment and a hydrophobic segment, and when W is a hydrophobic segment, Y is a hydrophilic segment.

(ii) A polymerizable monomer selected from the group consisting of the compounds represented by the following formulae:

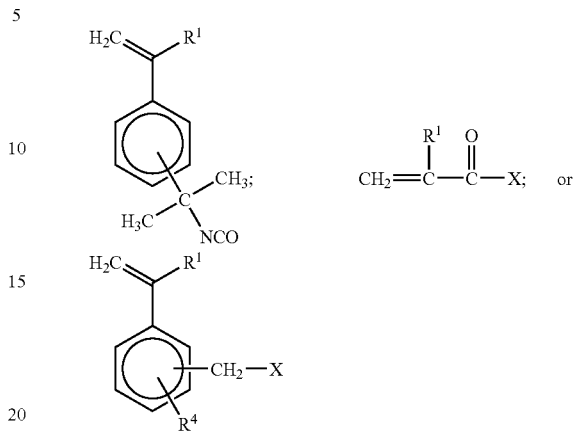

In the formulae, each $R^1$ is selected from the group consisting of H, alkyl, aryl, aralkyl, alkaryl, $COOR^5$, $R^6CO$, halogen and a cyano group. $R^5$ and $R^6$ each represents H or alkyl.

$R^4$ is selected from the group consisting of H, alkyl, halogen, cyano, nitro, alkoxyl, alkoxycarbonyl, acyl, and the combinations of these groups.

X is a separable group forming a polymerizable graft monomer by separation selected from glycidyloxy, and the group consisting of halogen, alkoxyl and aryloxy.

Procedure (B):

The synthesized polymerizable graft monomer and one or more comonomers are subjected to copolymerization with temperature and time sufficient to synthesize a graft copolymer. If necessary, the polymerizable graft monomer and the comonomers may be brought into contact in the presence of a catalyst.

As preferred comonomers, e.g., styrene, substituted styrene, α-methylstyrene, acrylic acid ester, methacrylic acid ester, acrylonitrile, acrylamide, methacrylamide, vinyl halide, vinyl ester, vinyl ether, and α-olefin can be exemplified.

Any monomers that can react with H—W—Y may be used as the preferred polymerizable monomer, e.g., polymerizable monomers such as m-isopropenyl, α,α-dimethylbenzyl isocyanate, acryloyl chloride, methacryloyl chloride are exemplified. The reaction is typically performed in the presence of a catalyst, e.g., a base, a tin compound, and a mixture thereof are preferably used. A Lewis acid or a protonic acid can be used if the reaction proceeds with an acid catalyst.

It is preferred that a compound represented by formula H—W—Y is one or more compounds represented by the following formulae.

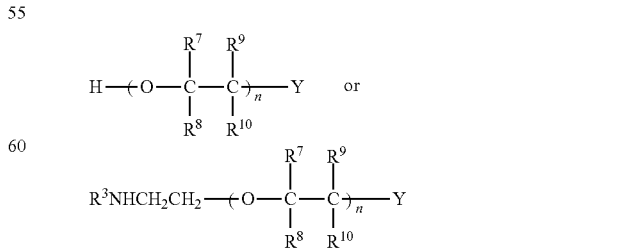

In the formulae, $R^7$, $R^8$, $R^9$ and $R^{10}$ each represents hydrogen.

$R^3$ may be H or alkyl.

Y may be any of alkyl, acyloxy, alkoxyl and carboxyl groups.

n is from 1 to 250, preferably from 2 to 120, and more preferably from 6 to 60.

The graft copolymer is typically obtained by free radical copolymerization of a graft monomer and a comonomer. The mass ratio of the comonomer and the graft monomer is preferably from 99/1 to 45/55 or so.

As another method, the graft copolymer can be synthesized by the synthesis of a copolymer capable of grafting in the first place by the copolymerization of the polymerizable monomer of the invention and one or more comonomers with sufficiently necessary temperature and time, and then grafting the resulting copolymer capable of grafting with a —W—Y group. Such grafting can be achieved by bringing the above copolymer capable of grafting into contact with the compound represented by formula H—W—Y in the presence of a catalyst.

Here, W may be a hydrophilic segment or a hydrophobic segment, Y may be a hydrophilic segment or a hydrophobic segment, provided that when W is a hydrophilic segment, Y may be a hydrophilic segment or a hydrophobic segment, and when W is a hydrophobic segment, Y is a hydrophilic segment.

The graft copolymer in the invention can be synthesized by the reaction of polyethylene glycol monoalkyl ether having a function of a hydroxyl group or an amino group and a polymer having reactivity to a hydroxyl group or an amino group such as acid chloride, isocyanate or an acid anhydride group. Further, the side chain may have a hydrophobic segment between the PEO segment and the main chain, or the PEO side chain may have hydrophobic segments at terminals. The graft copolymer of the invention may be synthesized according to the method disclosed in U.S. patent application Ser. No. 09/826,300.

The main chain polymer of the graft copolymer may be an addition type polymer or a condensation type polymer. The addition type polymer is preferably synthesized from acrylic acid and methacrylic acid ester, acrylic acid and methacrylic acid, acrylamides and methacrylamides, acrylonitrile and methacrylonitrile, styrene, vinyl phenol and combinations thereof. The addition type polymer is more preferably synthesized from styrene, methyl methacrylate, allyl acrylate, and allyl methacrylate, acrylic acid and methacrylic acid, and combinations thereof. As the condensation type polymer, polyurethanes, epoxy resins, polyesters, polyamides, and phenolic polymers, e.g., phenol-formaldehyde resin and pyrogallol-acetone resin are preferred.

The binder polymer may comprise a mixture of graft copolymers each of which comprises a main chain polymer and a polyethylene oxide side chain. The main chain polymer of each graft copolymer is selected from an addition type polymer and a condensation type polymer. As preferred addition type polymers, homopolymers and copolymers obtained from a monomer selected from the group consisting of acrylic acid ester and methacrylic acid ester including allyl acrylate and allyl methacrylate, acrylic acid and methacrylic acid, acrylamides and methacrylamides, acrylonitrile and methacrylonitrile, styrene, vinyl phenol and combinations thereof are exemplified. The examples of preferred condensation type polymers include polyurethanes, epoxy resins, polyesters, polyamides, and phenolic polymers, e.g., phenol-formaldehyde resin and pyrogallol-acetone resin.

The block copolymers in the invention can be synthesized according to ordinary methods such as anionic polymerization, cationic polymerization, and free radical polymerization. Atomic transfer radical polymerization (ATRF) and reversible addition fragmentation chain transfer polymerization (RAFT) are especially convenient methods. It is convenient to synthesize PEO block copolymer according to the ATRP method as described in M. Ranger et al., Journal of Polymer Science, Part A, Polymer Chemistry, Vol. 39, pp. 3861-74, "to obtain supermolecule assembly from a copolymer having definite two kinds of blocks synthesized by general purpose atomic transfer radical polymerization method" (2001).

At least one of non-polyethylene oxide blocks of the block copolymer may be an addition type polymer or a condensation type polymer. As addition type polymers, homopolymers or copolymers obtained from a monomer selected from acrylic acid ester and methacrylic acid ester such as allyl acrylate and allyl methacrylate, acrylic acid and methacrylic acid, acrylamides and methacrylamides, acrylonitrile and methacrylonitrile, styrene, and vinyl phenol are preferred. As condensation type polymers, polyurethanes, epoxy resins, polyesters, polyamides, and polyureas are preferred.

In one preferred embodiment of the invention, at least one non-polyethylene oxide block of the block copolymer does not have a polyalkylene oxide segment. As another preferred embodiment, at least one non-polyethylene oxide block comprises a homopolymer or a copolymer obtained from a monomer selected from the group consisting of methyl methacrylate, allyl acrylate and allyl methacrylate, acrylic acid and methacrylic acid, styrene, vinyl phenol, and combinations thereof.

As described above, the binder polymer may comprise a mixture of block copolymers each having at least one PEO block and at least one non-PEO block. Further, the binder polymer may comprise a mixture of a block copolymer and a graft copolymer as described above.

In another embodiment of the invention, the image-recording layer may contain discontinuous particles. The particles may contain a mixture of a plurality of copolymers including combinations of possible various monomer units. The discontinuous particles are preferably particles of the binder polymer suspended in the image-recording layer. An embodiment of the binder polymer has at least one graft copolymer is especially preferred. The particle size of the particles in a suspension solution may be from 60 to 300 nm or so. The existence of such discontinuous particles shows the tendency of accelerating the developability of an unexposed area.

Other Components:

Besides (A) an actinic ray absorber, (B) a polymerization initiator, and (D) a binder polymer, (C) a polymerizable compound can be incorporated into the image-recording layer in the invention. Further, if necessary, the image-recording layer may contain additives, e.g., a surfactant, a colorant, a printing-out agent, a polymerization inhibitor (a thermal polymerization preventive), a higher fatty acid derivative, a plasticizer, inorganic fine particles, and a low molecular weight hydrophilic compound. As a polymerizable compound (C) and these additives, the same compounds as those described in the explanation of the image-recording layer (1) can be used.

The image-recording layer can be formed in the same manner as described in the image-recording layer (1).

Image-Recording Layer (3):

In the next place, the image-recording layer of the lithographic printing plate precursors described in claims 17 to 23 is explained. The image-recording layer contains, as essential components, (E) an infrared absorber and (F) an iodonium salt. The components and the like of the image-recording layer containing these components are described in detail below.

(E) Infrared Absorber:

The infrared absorbers used in the lithographic printing plate precursors described in claims 17 to 23 are dyes or pigments having absorption maximum at wavelengths of 760 to 1,200 nm, and infrared absorbers whose absorbance at any wavelength of from 400 to 700 nm changes by 0.05 or more by the action of radicals can be used with no limitation.

The visibility of a printing plate becomes good when the variation in absorbance at any wavelength of from 400 to 700 nm is 0.05 or more, preferably 0.08 or more, more preferably 0.11 or more, and especially preferably 0.14 or more.

The visibility of a printing plate is improved when the variation in absorbance occurs in the visible region of from 400 to 700 nm, preferably from 450 to 680 nm, more preferably from 500 to 660 nm.

As dyes used as infrared absorbers, commercially available dyes and well-known dyes described in literatures, e.g., Senryo Binran (Dye Handbook), compiled by Yuki Gosei Kagaku Kyokai (1970) can be used. Specifically, azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyestuffs, pyrylium salts and metal thiolate complexes are exemplified.

As pigments for use in the invention, commercially available pigments and the pigments described in Color Index (C.I.) Binran (Color Index Bulletin), Shaishin Ganryo Binran (The Latest Pigment Handbook), compiled by Nippon Ganryo Gijutsu Kyokai (1977), Shaishin Ganryo Oyo Gijutsu (The Latest Pigment Applied Techniques), CMC Publishing Co. Ltd. (1986), and Insatsu Ink Gijutsu (Printing Ink Techniques), CMC Publishing Co. Ltd. (1984) can be used.

An infrared absorber having absorption maximum at wavelengths of from 400 to 700 nm changes to the oxidant of the infrared absorber by reaction with the radicals generated at the exposed area, whereby causes variation in tint, so that those susceptible to oxidation are preferably used in the invention. From such a point of view, the oxidation potential is preferably 0.45 V (vs. SCE) or less, more preferably 0.40 V (vs. SCE) or less, and still more preferably 0.35 V (vs. SCE) or less.

Although there is no specific greatest lower bound in the oxidation potential of infrared absorbers preferably used, the oxidation potential is preferably 0.10 V (vs. SCE) or more, and more preferably 0.15 V (vs. SCE) or more, in view of the stability in the combination with an iodonium salt (F).

As such infrared absorbers, those having an electron donating substituent at the chromophores of the absorbers are preferred to make the oxidation potential small. As preferred electron donating substituents, substituents having Hammett's $\sigma_{para}$ value of −0.10 or less are exemplified. Specifically, an alkyl group ($\sigma_{para}$ value: from −0.12 to −0.20 or so), e.g., a methyl group, an ethyl group, and a propyl group, a hydroxyl group ($\sigma_{para}$ value: −0.37), an alkoxyl group ($\sigma_{para}$ value: from −0.24 to −0.45 or so), e.g., a methoxy group, an ethoxy group, a propyloxy group, and a butoxy group, an aryloxy group ($\sigma_{para}$ value: −0.32 or so), e.g., a phenoxy group and a toluyloxy group, and a (substituted) amino group ($\sigma_{para}$ value: from −0.50 to −0.35), e.g., an amino group, a methylamino group, an ethylamino group, a butylamino group, a dimethylamino group, a diethylamino group, a phenylamino group, and a diphenylamino group are exemplified, and an alkoxyl group and a (substituted) amino group having a large electron donating property are especially preferred.

From the viewpoint of extending the conjugated system of a chromophore to lessen oxidation potential, substituents having an aromatic group linked via a hetero atom are also exemplified as preferred substituents. As the hetero atoms for linking an aromatic group, a nitrogen atom, an oxygen atom, a phosphorus atom, a sulfur atom and a selenium atom are exemplified, and an especially preferred hetero atom is a sulfur atom.

As the aromatic groups to be linked, a hydrocarbon aromatic group, e.g., a phenyl group, a naphthyl group and an anthranyl group, and a heterocyclic group, e.g., a furyl group, a thienyl group, a pyrazolyl group, a triazolyl group, an indolyl group, and a benzothiazolyl group are exemplified, and a heterocyclic group is especially preferred. A substituent may be substituted on these aromatic groups, and preferred substituents are those having Hammett's $\sigma_{para}$ value of −0.10 or less.

As the chromophores of infrared absorbers, polymethine dyestuffs, e.g., a cyanine dyestuff and a (thio)pyrylium dyestuff are preferred from the standpoints of absorption wavelength aptitude, solubility, stability, and potential characteristics, above all, a cyanine dyestuff is especially preferred, and from the viewpoints of absorption wavelength aptitude and potential aptitude, heptamethine cyanine dyestuffs having an indolenine skeleton, a benzindolenine skeleton, a benzothiazole skeleton, a benzoxazole skeleton, or a benzoselenazole skeleton are especially preferred. These polymethine dyestuffs are generally cationic dyestuffs whose chromophores have positive electric charge, and betaine type dyestuffs also having negative electric charge in the chromophores are also preferably used from the standpoint of making the oxidation potential small. As the examples of betaine type dyestuffs, those substituted with a (thio)-barbituric acid group on the polymethine chain, and those having a squarylium skeleton or a croconium skeleton incorporated into the polymethine chain are exemplified.

Of the dyestuffs having the chromophores as described above, the dyestuffs represented by any of the following formulae (D1) to (D5) are preferably used.

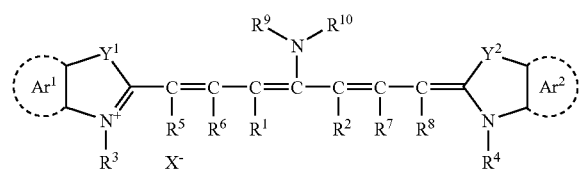

(D1)

In formula (D1), $R^1$ and $R^2$ each represents a hydrogen atom or a hydrocarbon group having from 1 to 12 carbon atoms, and $R^1$ and $R^2$ may be bonded to each other to form a cyclic structure, and the cyclic structure formed is preferably a 5- or 6-membered ring; $Ar^1$ and $Ar^2$, which may be the same or different, each represents an aromatic hydrocarbon group which may have a substituent, as preferred aromatic hydrocarbon groups, a benzene ring and a naphthalene ring are exemplified, and as preferred substituents, a hydrocarbon group having 12 or less carbon atoms, a halogen atom, and an alkoxyl group having 12 or less carbon atoms are exemplified; $Y^1$ and $Y^2$, which may be the same or different, each represents a sulfur atom or a dialkylmethylene group having 12 or less carbon atoms; $R^3$ and $R^4$, which may be the same or different, each represents a hydrocarbon group having 20 or less carbon atoms which may have a substituent, and as preferred substituents, an alkoxyl group having 12 or less carbon atoms, a carboxyl group and a sulfo group are exemplified; $R^5$, $R^6$, $R^7$ and $R^8$, which may be the same or different, each represents a hydrogen atom or a hydrocarbon group having 12 or less carbon atoms, and a hydrogen atom is preferred for easy availability; $R^9$ and $R^{10}$, which may be the same or different, each represents an aromatic hydrocarbon group having from 6 to 10 carbon atoms which may have a substituent, an alkyl group having from 1 to 8 carbon atoms, or a hydrogen atom, and $R^9$ and $R^{10}$ may be bonded to each other to form a cyclic structure, and as the cyclic structure, the following structures are exemplified.

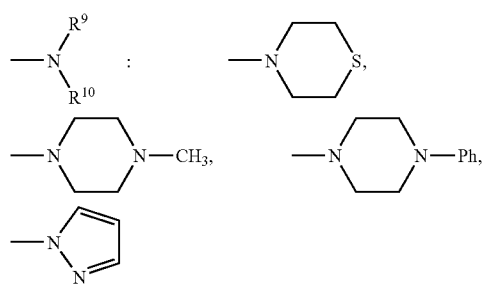

In the above formulae, $X^-$ represents a counter anion, provided that when any of $R^1$ to $R^8$ is substituted with a sulfo group, $X^-$ is not necessary. The preferred examples of $X^-$ are a halogen ion, a perchlorate ion, a tetrafluoroborate ion, a hexafluorophosphate ion, and a sulfonate ion for the stability of an image-recording layer coating solution, and a perchlorate ion, a hexafluorophosphate ion, and an arylsulfonate ion are particularly preferred.

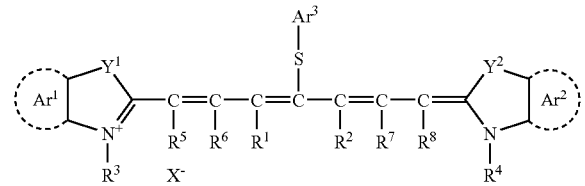

(D2)

In formula (D2), $R^1$ to $R^8$, $Ar^1$, $Ar^2$, $Y^1$, $Y^2$ and $X^-$ respectively have the same meaning as those in formula (D1); and $Ar^3$ represents a monocyclic or polycyclic heterocyclic group having at least one of a nitrogen atom, an oxygen atom and a sulfur atom. Preferred heterocyclic groups are selected from the group consisting of a thiazole series, a benzothiazole series, a naphthothiazole series, a thianaphtheno-7',6',4,5-thiazole series, an oxazole series, a benzoxazole series, a naphthoxazole series, a selenazole series, a benzoselenazole series, a naphthoselenazole series, a thiazoline series, a 2-quinoline series, a 4-quinoline series, a 1-isoquinoline series, a 3-isoquinoline series, a benzimidazole series, a 3,3-dialkylbenzindolenine series, a 2-pyridine series, a 4-pyridine series, a 3,3-dialkylbenz[e]indole series, a tetrazole series, a triazole series, a pyrimidine series, and a thiadiazole series. As particularly preferred heterocyclic groups, the following structures are exemplified.

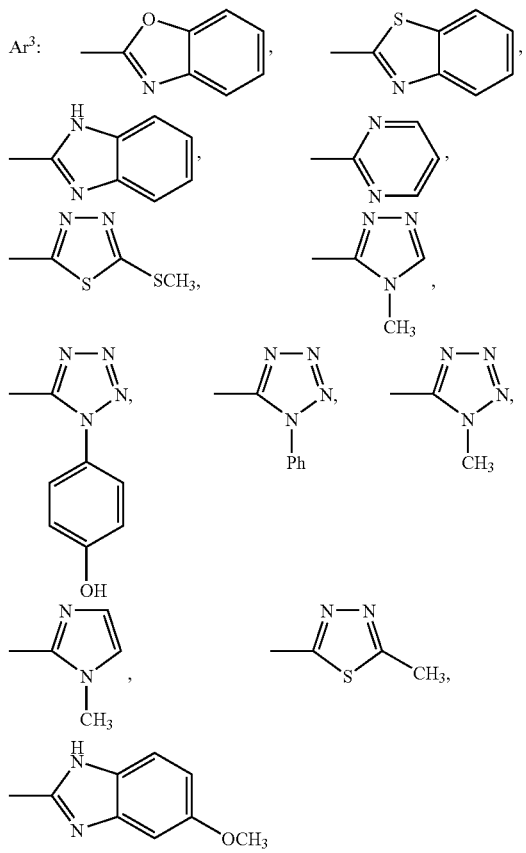

(D3)

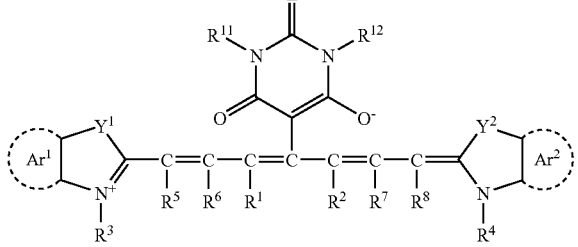

In formula (D3), $R^1$ to $R^8$, $Ar^1$, $Ar^2$, $Y^1$ and $Y^2$ respectively have the same meaning as those in formula (D1); $R^{11}$ and $R^{12}$, which may be the same or different, each represents a hydrogen atom, an allyl group, a cyclohexyl group, or an alkyl group having from 1 to 8 carbon atoms; and Z represents an oxygen atom or a sulfur atom.

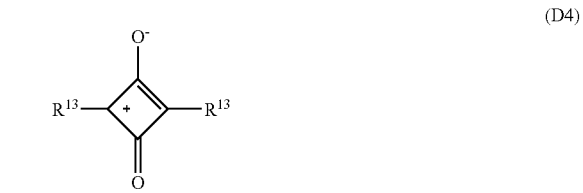

(D4)

In formula (D4), $R^{13}$ represents a substituent having the structure shown below; $R^{14}$ and $R^{15}$ each represents an alkyl group having from 1 to 8 carbon atoms; and $Y^3$ represents an oxygen atom or a sulfur atom.

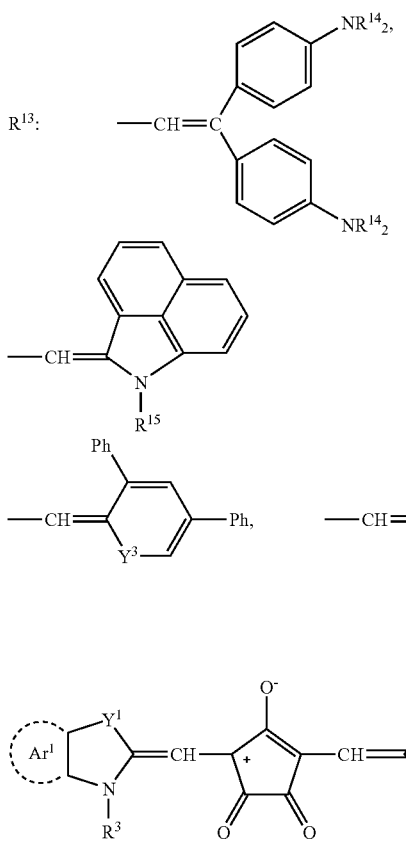

In formula (D5), $R^3$, $R^4$, $Ar^1$, $Ar^2$, $Y^1$ and $Y^2$ respectively have the same meaning as those in formula (D1).

Of the dyestuffs having the chromophores as above, the dyestuffs represented by formulae (D1) to (D3) are more preferred, and the dyestuff represented by formula (D1) is particularly preferred.

The oxidation potential of an infrared absorber in the invention is a value measured by potentiometry using a hydrogen electrode, a glass electrode, and a quinhydrone electrode as the indicator electrodes, and a saturated calomel electrode and a silver-silver chloride electrode as the reference electrodes in a polar solvent, e.g., acetonitrile or methanol, and the obtained value is converted to the value in terms of a normal calomel electrode.

The specific examples of infrared absorbers ([IR-1] to [IR-12]) having an oxidation potential of 0.45 V (vs. SCE) or less that can be preferably used in the invention are shown below with the oxidation potential, but the invention is not restricted to these infrared absorbers.

Incidentally, the oxidation potential of the following infrared absorber was the value measured by using a rotating disc electrode of Pt as the indicator electrode, and an Ag/AgCl (silver-silver chloride) counter electrode as the reference electrode in a polar solvent (0.1 M Et$_4$NClO$_4$/MeCN), and the obtained value was converted to the value in terms of a normal calomel electrode as the reference electrode.

| Infrared Absorber | Structure | Oxidation Potential (V vs. SCE) |
|---|---|---|
| IR-1 | | 0.20 |
| IR-2 | | 0.22 |

-continued

| Infrared Absorber | Structure | Oxidation Potential (V vs. SCE) |
|---|---|---|
| IR-3 | | 0.24 |
| IR-4 | | 0.27 |
| IR-5 | | 0.27 |
| IR-6 | | 0.30 |
| IR-7 | | 0.30 |
| IR-8 | | 0.35 |

| Infrared Absorber | Structure | Oxidation Potential (V vs. SCE) |
|---|---|---|
| IR-9 | | 0.35 |
| IR-10 | | 0.35 |
| IR-11 | | 0.40 |
| IR-12 | | 0.44 |

When an infrared absorber having a low oxidation potential as above is used, the hardening property of the image-recording layer is conspicuously improved as compared with the time of using an infrared absorber having a high oxidation potential. Although the reason for this fact is not clear, it is thought that by using an infrared absorber low in oxidation potential with an ionic radical generator, the decomposition of radicals are accelerated, so that the polymerization reaction proceeds rapidly and an image area excellent in strength is formed presumably.

Infrared absorbers may be used alone, or two or more kinds may be used in combination. In addition, general purpose infrared absorbers having an oxidation potential exceeding 0.45 V (vs. SCE) can be used in combination within the range of not impairing the effect of the invention. In this case, the content of the general purpose infrared absorbers is preferably 40 mass % or less in all the solids content of the infrared absorbers.

As infrared absorbers that can be used in combination, the dyes and pigments disclosed in JP-A-7-285275 and JP-A-10-268512 can be exemplified.

When the lithographic printing plate precursors in the invention are used as on-development type lithographic printing plates, if the printing plate before exposure is colored, there are cases where the color is contaminated in ink and/or a fountain solution to thereby change the tint of a printed matter and reduce quality. For avoiding such a problem, it is preferred that a printing plate before exposure is colorless or light-colored (preferably colorless). Accordingly, the case of coloration where the absorbance at any wavelength of from 400 to 700 nm of an infrared absorber increases at least by 0.05 or more is preferred to the case of discoloration where the absorbance decreases by 0.05 or more.

The addition amount of infrared absorbers is preferably in the range of from 0.01 to 50 mass % to all the solids content of the image-recording layer, more preferably from 0.1 to 20 mass %, and especially preferably from 1 to 10 mass %.

When a recording material is manufactured using these infrared absorbers, it is preferred that the optical density at maximum absorption in the infrared region is preferably in the range of from 0.05 to 3.0. Since optical density is determined by the addition amount of the infrared absorbers and the thickness of the image-recording layer, prescribed optical density can be obtained by controlling both conditions. The optical density of an image-recording layer can be measured according to ordinary methods. For example, a method of forming an image-recording layer having an arbitrarily determined dry thickness necessary as a lithographic printing plate on a transparent or white support, and measuring the optical density with a transmission type optical densitometer, and a method of forming an image-recording layer on a reflective support, e.g., an aluminum support, and measuring the reflection density are exemplified.

(F) Iodonium Salt:

An iodonium salt is a radical generator that generates radicals by light or heat, or both energies, and also has functions of initiating and accelerating the polymerization of a compound having a polymerizable unsaturated group and, at the same time, oxidizing an infrared absorber to change to an infrared absorber oxidant having absorption maximum at wavelengths of from 400 to 700 nm. An iodonium salt compound preferably used in the invention is represented by the following formula (RI-IV):

$$Ar^{41}-I^+-Ar^{42}Z^{41-} \quad \text{(RI-IV)}$$

In formula (RI-IV), $Ar^{41}$ and $Ar^{42}$ each represents an aryl group having 20 or less carbon atoms which may have a substituent.

As the examples of the substituents in the case where the aryl group has a substituent, a halogen atom, a nitro group, an alkyl group having 12 or less carbon atoms, an alkoxyl group having 12 or less carbon atoms, and an aryloxy group having 12 or less carbon atoms are exemplified. Of the substituents, those having an electron donating substituent are preferred for their good coloring property. As preferred electron donating substituents, substituents having Hammett's $\sigma_{para}$ value of −0.10 or less are exemplified.

Specifically, an alkyl group ($\sigma_{para}$ value: from −0.12 to −0.20 or so), e.g., a methyl group, an ethyl group, and a propyl group, a hydroxyl group ($\sigma_{para}$ value: −0.37), an alkoxyl group ($\sigma_{para}$ value: from −0.24 to −0.45 or so), e.g., a methoxy group, an ethoxy group, a propyloxy group, and a butoxy group, an aryloxy group ($\sigma_{para}$ value: −0.32 or so), e.g., a phenoxy group and a toluyloxy group, and a (substituted) amino group ($\sigma_{para}$ value: from −0.50 to −0.35), e.g., an amino group, a methylamino group, an ethylamino group, a butylamino group, a dimethylamino group, a diethylamino group, a phenylamino group, and a diphenylamino group are exemplified, and an alkoxyl group and a (substituted) amino group having a large electron donating property are especially preferred.

$Z41^-$ represents a counter ion selected from the group consisting of an organic anion, e.g., R—COO$^-$, R—SO$_3^-$, R—SO$_2^-$, R—PO$_3$H$^-$, R—OPO$_3$H$^-$, R—PO$_2$H$^-$ and R—OPO$_2$H$^-$ (where R represents a hydrocarbon group having from 1 to 30 carbon atoms, which may have a substituent), and an inorganic anion, e.g., F$^-$, Cl$^-$, Br$^-$, I$^-$, ClO$_4^-$, BF$_4^-$, PF$_6^-$, SbF$_6^-$, AsF$_6^-$, H$_2$PO$_3^-$, H$_2$PO$_4^-$, HSO$_3^-$, HSO$_4^-$ and NO$_3^-$. Of these anions, R—SO$_3^-$, R—PO$_3$H$^-$, R—OPO$_3$H$^-$, ClO$_4^-$, BF$_4^-$, PF$_6^-$, and NO$_3^-$ are preferred for good on-developability, and R—SO$_3^-$ having a hydrocarbon group substituted with a fluorine atom is especially preferred.

As the specific examples of the iodonium salt compounds represented by formula (RI-IV) that can be preferably used in the invention, compounds (I-2) to (I-6), (I-11), (I-12), (I-15), (I-20) and (I-21) described above as the specific examples of the compound represented by formula (RI-II) are exemplified, but it should not be construed that the invention is restricted to these compounds.

The maximum absorption wavelength of iodonium salt (F) for use in the invention is preferably 400 nm or less, more preferably 330 nm or less, and still more preferably 270 nm or less. By bringing an absorption wavelength into the ultraviolet region as above, an image-recording material can be handled under a white light.

The addition amount of these iodonium salt compounds is preferably from 0.1 to 50 mass % based on all the solids content of the materials of the image-recording layer, more preferably from 0.5 to 30 mass %, and still more preferably from 1 to 20 mass %. Iodonium salt compounds may be used alone, or two or more compounds may be used in combination.

Infrared absorber (E) and iodonium salt (F) in the invention are added to the image-recording layer, but these components may be further added to other layers, e.g., a protective layer and an undercoat layer. Both components may be microencapsulated and added to the image-recording layer or other layers.

Elements for Forming Printing Image:

As the element for forming a print image, the image-recording layer in the invention can use at least either (A) an image-forming element utilizing radical or cationic polymerization, or (B) an image-forming element utilizing thermal fusion and thermal reaction of a hydrophobitizing precursor. When element (A) is used, a polymerization system image-recording layer is obtained, and when element (B) is used, an image-recording layer of a hydrophobitizing precursor is obtained. These elements are described below.

(I) Image-Forming Element Using Polymerization:

Since polymerization system element is high in image-forming sensitivity, exposure energy can be effectively shared for the formation of a printing out image, so that polymerization system element is preferred for obtaining a printing out image having a good visibility.

The polymerization system element comprises a polymerizable compound and a polymerization initiator as primary components.

Polymerizable Compound:

As the polymerizable compounds to be used, polymerizable compounds (C) in the above description of the image-recording layer of the lithographic printing plate precursor for use in a packaged body are exemplified. In addition to the above, as the specific examples of the compounds having a vinyl ether group of polymerizable compound (C), the compounds disclosed in JP-A-2002-29162 are exemplified. As the specific examples, tetramethylene glycol divinyl ether, trimethylolpropane trivinyl ether, tetraethylene glycol divinyl ether, pentaerythritol divinyl ether, pentaerythritol trivinyl ether, pentaerythritol tetravinyl ether, 1,4-bis[2-(vinyloxy)ethyloxy]benzene, 1,2-bis[2-(vinyloxy)ethyloxy]benzene, 1,3-bis[2-(vinyloxy)ethyloxy]benzene, 1,3,5-tris[2-(vinyloxy)ethyloxy]benzene, 4,4'-bis[2-(vinyloxy)ethyloxy]-biphenyl, 4,4'-bis[2-(vinyloxy)ethyloxy]diphenyl ether, 4,4'-bis[2-(vinyloxy)ethyloxy]diphenylmethane, 1,4-bis[2-(vinyloxy)ethyloxy]naphthalene, 2,5-bis[2-(vinyloxy)ethyloxy]furan, 2,5-bis[2-(vinyloxy)ethyloxy]thiophene, 2,5-bis[2-(vinyloxy)ethyloxy]imidazole, 2,2-bis{4-[2-(vinyloxy)ethyloxy]phenyl}propane (bis[vinyloxyethyl]ether of bisphenol A), 2,2-bis[4-(vinyloxymethyloxy)phenyl]propane, and 2,2-bis[4-(vinyloxy)phenyl]propane are exemplified.

These polymerizable compounds can be used in the same manner and the addition amount as the above polymerizable compound (A).

Polymerization Initiator:

A polymerization initiator used generates a radical or an acid by the action of heat of the infrared absorber absorbed infrared rays and/or light, and initiates radical or cationic polymerization of the polymerizable compound. The radical polymerization initiators (radical generators) in the invention are selected from conventionally well-known polymerization initiators and compounds having a bond small in bonding and dissociation energy, and can be used in combination with the above iodonium salt compounds. For example, an onium salt, a triazine compound having a trihalomethyl group, a peroxide, an azo-based polymerization initiator, an azide compound, a quinonediazide compound, a metallocene compound, and an organic borate compound are exemplified, but the following onium compounds are preferably used.

As the onium compounds preferably used in the invention as radical generators in combination with iodonium salt compounds, a diazonium salt, a sulfonium salt, an ammonium salt, and a pyridinium salt are exemplified, and a diazonium salt and a sulfonium salt are especially preferably used. The combination with a sulfonium salt is especially preferred for the reason that the press life can be improved.

The diazonium salts and sulfonium salts preferably used in the invention are the compounds represented by formulae (RI-I) and (RI-III) in the above description of the image-recording layer of the lithographic printing plate precursor for use in a packaged body.

The addition amount of the radical generator for use in combination with the iodonium salt compound is preferably from 0.1 to 300 mass % to the addition amount of the iodonium salt compound, more preferably from 1 to 200 mass %, and still more preferably from 5 to 100 mass %.

Other Components:

If necessary, additives such as a binder polymer, a surfactant, a colorant, a polymerization inhibitor, a higher fatty acid derivative, a plasticizer, inorganic fine particles and a low molecular weight hydrophilic compound may further be added to the polymerization system image-recording layer of the invention. These additives are described below.

Conventionally well-known binder polymers can be used in the polymerization system image-recording layer in the invention with no restriction, and linear organic polymers having a film-forming property are preferably used. The examples of such binder polymers include acrylic resins, polyvinyl acetal resins, polyurethane resins, polyurea resins, polyimide resins, polyamide resins, epoxy resins, methacrylic resins, polystyrene resins, novolak type phenolic resins, polyester resin, synthetic rubber and natural rubber.

It is preferred that binder polymers have a crosslinking property for the purpose of improving the layer strength of an image area. For giving a crosslinkable property to binder polymers, it is effective to introduce a crosslinkable functional group such as an ethylenic unsaturated bond into the main chain or side chain of the polymers. The crosslinkable functional group may be introduced by copolymerization.

As the examples of the polymers having an ethylenic unsaturated bond in the main chain of the molecule, poly-1,4-butadiene and poly-1,4-isoprene are exemplified.

As the examples of the polymers having an ethylenic unsaturated bond in the side chain of the molecule, polymers of esters or amides of acrylic acid or methacrylic acid wherein the residue of the ester or amide (R of —COOR or —CONHR) has an ethylenic unsaturated bond are exemplified.

The examples of the residues having an ethylenic unsaturated bond (the above R) include —$(CH_2)_n CR^1$=$CR^2 R^3$, —$(CH_2 O)_n CH_2 CR^1$=$CR^2 R^3$, —$(CH_2 CH_2 O)_n CH_2 CR^1$=$CR^2 R^3$, —$(CH_2)_n NH$—CO—O—$CH_2 CR^1$=$CR^2 R^3$, —$(CH_2)_n$—O—CO—$CR^1$=$CR^2 R^3$ and —$(CH_2 CH_2 O)_2$—X (wherein $R^1$, $R^2$ and $R^3$ each represents a hydrogen atom, a halogen atom, an alkyl group having from 1 to 20 carbon atoms, an aryl group, an alkoxyl group or an aryloxy group, and $R^1$ and $R^2$ or $R^3$ may be bonded to each other to form a ring, n represents an integer of from 1 to 10, and X represents a dicyclopentadienyl residue).

The specific examples of the ester residues include —$CH_2 CH$=$CH_2$ (disclosed in JP-B-7-21633), —$CH_2 CH_2 O$—$CH_2 CH$=$CH_2$, —$CH_2 C(CH_3)$=$CH_2$, —$CH_2 CH$=$CH$—$C_6 H_5$, —$CH_2 CH_2 OCOCH$=$CH$—$C_6 H_5$, —$CH_2 CH_2$—NHCOO—$CH_2 CH$=$CH_2$ and —$CH_2 CH_2 O$—X (wherein X represents a dicyclopentadienyl residue).

The examples of the amido residues include —$CH_2 CH$=$CH_2$, —$CH_2 CH_2$—Y (wherein Y represents a cyclohexene residue), and —$CH_2 CH_2$—OCO—CH=$CH_2$.

When free radicals (polymerization initiating radicals or the grown radicals of a polymerizable compound in the polymerization process) are added to the crosslinkable functional groups of a binder polymer having a crosslinking property, addition polymerization occurs directly between the polymers or via the polymeric chains of the polymerizable compound, as a result, crosslinking is formed between the molecules of the polymers, and the binder polymer is hardened. Alternatively, the atoms in the polymer (e.g., the hydrogen atoms on the carbon atoms contiguous to the crosslinkable functional groups) are extracted by free radicals and polymer radicals are grown, and the polymer radicals are bonded to each other, whereby crosslinking is formed between the polymer molecules, so that the binder polymer is hardened.

The content of crosslinkable groups in a binder polymer (the content of radical polymerizable unsaturated double bonds by iodometry) is preferably from 0.1 to 10.0 mmol per 1 g of the binder polymer, more preferably from 1.0 to 7.0 mmol, and most preferably from 2.0 to 5.5 mmol. When the content of crosslinkable groups is in this range, good sensitivity and good aging stability can be obtained.

From the viewpoint of the improvement of the on-press developability, it is preferred that binder polymers have high solubility or dispersibility in ink and/or a fountain solution.

For improving the solubility or dispersibility in ink, binder polymers are preferably lipophilic, and for improving the solubility or dispersibility in a fountain solution, binder polymers are preferably hydrophilic. Accordingly, it is also effective in the invention to use a lipophilic binder polymer and a hydrophilic binder polymer in combination.

As hydrophilic binder polymers, binder polymers having a hydrophilic group, e.g., a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group are preferably exemplified.

The specific examples of hydrophilic binder polymers include gum arabic, casein, gelatin, starch derivative, soya gum, carboxymethyl cellulose and the sodium salt thereof, cellulose acetate, sodium alginate, vinyl acetate-maleic acid copolymers, styrene-maleic acid copolymers, polyacrylic acids and the salts thereof, polymethacrylic acids and the salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of 60 mol % or more, preferably 80 mol % or more, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide, alcohol-soluble nylon, polyether of 2,2-bis(4-hydroxyphenyl)propane and epichlorohydrin, homopolymers and copolymers of 2-acrylamide-2-methyl-1-propanesulfonic acid, and homopolymers and copolymers of 2-methacryloyloxyethyl-sulfonic acid.

The binder polymers preferably have a mass average molecular weight of preferably 5,000 or higher, more preferably from 10,000 to 300,000, and a number average molecular weight of preferably 1,000 or higher, more preferably from 2,000 to 250,000. The polydisperse degree (mass average molecular weight/number average molecular weight) is preferably from 1.1 to 10.

The binder polymers may be any of random polymers, block polymers and graft polymers, but random polymers are preferred. The binder polymers may be used alone or as a mixture of two or more.

The content of the binder polymers is preferably from 10 to 90 mass % to the total solids content of the image-recording layer, more preferably from 20 to 80 mass %, and still more preferably from 30 to 70 mass %. When the binder polymers are used in this range, preferred strength of an image area and good image-forming property can be obtained.

It is preferred to use a polymerizable compound and the binder polymer in mass ratio of from 1/9 to 7/3.

Additives:

As the additives that can be used in the polymerization system image recording, e.g., a surfactant, a polymerization inhibitor, a higher fatty acid derivative, a plasticizer, inorganic fine particles, and a low molecular weight compound, the compounds described in the above explanation of the image-recording layer of the lithographic printing plate precursor for use in a packaged body are exemplified. Preferably, the image-recording layer does not contain a compound that changes its color by an ancion of an acid, base or radical.

Formation of Polymerization System Image-Recording Layer:

As the method of incorporating the constitutional components of image-recording layer into an image-recording layer, some embodiments can be used in the invention. One embodiment is a molecular dispersion type image-recording layer of dissolving the constitutional components in an appropriate solvent and coating the resulting solution as disclosed, e.g., in JP-A-2002-287334, and another embodiment is a microcapsule type image-recording layer of encapsulating all or a part of the constitutional components in microcapsules and incorporating into the image-recording layer as disclosed, e.g., in JP-A-2001-277740 and JP-A-2001-277742. In addition, in the microcapsule type image-recording layer, it is also possible to incorporate the constitutional components outside the microcapsules. Here, it is a preferred embodiment of the microcapsule type image-recording layer that hydrophobic constitutional components are encapsulated in microcapsules and hydrophilic constituents are incorporated outside the microcapsules. Further, infrared absorber (E) and iodonium salt (F) can also be microencapsulated. As a further embodiment, an image recording layer containing crosslinking resin particles, i.e., microgels, can be exemplified. The microgels can contain a part of image recording layer constituents in the inside and/or on the surface of the microgels. An embodiment where the microgels are reactive microgels having a polymerizable compound on the surface thereof is especially preferred from the viewpoints of image-forming sensitivity and press life.

For achieving better on-press developability, it is preferred that the image-recording layer is a microcapsule type or a microgel type image-recording layer.

The methods for the microencapsulation or microgelation of the constitutional components of the image-recording layer, the preferred average sizes of microcapsules and microgels, the methods of preparation and coating of the image-recording layer coating solution are the same as described in the above explanation of the image-recording layer of the lithographic printing plate precursor for use in a packaged body.

The coating amount of the image-recording layer (solids content) on a support obtained after coating and drying varies according to use, but generally preferably from 0.3 to 3.0 g/m$^2$. In this range of the coating amount, good sensitivity and good film characteristics of the image-recording layer can be obtained.

(II) Image-Forming Element of Hydrophobitizing Precursor:
<Hydrophobitizing Precursor>

Hydrophobilizing precursors in the invention are fine particles capable of converting a hydrophilic image-recording layer to hydrophobic upon heating. Such fine particles are preferably at least one kind of fine particles selected from thermoplastic polymer fine particles and thermo-reactive polymer fine particles. Further, the fine particles may be microgels or microcapsules encapsulating a compound having a thermo-reactive group.

As the thermoplastic polymer fine particles used in the invention, the thermoplastic polymer fine particles described in Research Disclosure, No. 33303, January (1992), JP-A-9-123387, JP-A-9-131850, JP-A-9-171249 JP-A-9-171250, and EP 931647 can be preferably exemplified. The specific examples of the polymers constituting these polymer fine particles include homopolymers or copolymers of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures thereof. Of these polymers, polystyrene and polymethyl methacrylate are more preferred.

The average particle size of the thermoplastic polymer fine particles for use in the invention is preferably from 0.01 to 2.0 μm. As the synthesizing methods of these thermoplastic polymer fine particles, a method of dissolving the above compounds in a water-insoluble organic solvent, mixing and emulsifying the resulting solution with an aqueous solution containing a dispersant, and applying heat to the emulsion to thereby solidify the emulsion to a fine particle state with volatizing the organic solvent (a dissolution dispersion method) can be used, in addition to an emulsion polymerization method and a suspension polymerization method.

As the thermo-reactive polymer fine particles used in the invention, thermosetting polymer fine particles and polymer fine particles having a thermo-reactive group are exemplified.

As the thermosetting polymer fine particles, resins having a phenolic skeleton, urea resins (e.g., resins obtained by the resinification of urea or urea derivatives, e.g., methoxymethylated urea, with aldehydes, e.g., formaldehyde), melamine resins (e.g., resins obtained by the resinification of melamine or melamine derivatives with aldehydes, e.g., formaldehyde), alkyd resins, unsaturated polyester resins, polyurethane resins, and epoxy resins can be exemplified. Of these resins, resins having a phenolic skeleton, melamine resins, urea resins and epoxy resins are especially preferred.

As preferred resins having a phenolic skeleton, e.g., phenolic resins obtained by resinifying phenol or cresol with aldehydes, e.g., formaldehyde, hydroxystyrene resins, and polymers and copolymers of methacrylamide or acrylamide or methacrylate or acrylate having a phenolic skeleton such as N-(p-hydroxyphenyl)methacrylamide and p-hydroxyphenyl methacrylate can be exemplified.

The average particle size of the thermosetting polymer fine particles for use in the invention is preferably from 0.01 to 2.0 µm. These thermosetting polymer fine particles can be easily obtained by a dissolution dispersion method, but a thermosetting polymer may be made fine particles when the thermosetting polymer is synthesized. The invention is not limited to these methods.

As the thermo-reactive group of the polymer fine particles having a thermo-reactive group used in the invention, functional groups showing any reaction can be used so long as chemical bonds are formed. Ethylenic unsaturated groups showing a radical polymerization reaction (e.g., an acryloyl group, a methacryloyl group, a vinyl group, an allyl group, etc.), cationic polymerizable groups (e.g., a vinyl group, a vinyloxy group, etc.), isocyanate groups showing an addition reaction or blocks thereof, epoxy groups, vinyloxy groups and functional groups having active hydrogen atoms of the other side compounds of the reaction (e.g., an amino group, a hydroxyl group, a carboxyl group, etc.), carboxyl groups showing a condensation reaction and hydroxyl groups and amino groups of the other side compounds of the reaction, and acid anhydrides showing a ring opening addition reaction and amino groups and hydroxyl groups of the other side compounds of the reaction can be preferably exemplified.

These functional groups may be introduced into polymer fine particles in the time of polymerization or they may be added after polymerization by a polymeric reaction.

When functional groups are introduced in the time of polymerization, it is preferred that the monomers having these functional groups are emulsion polymerized or suspension polymerized. The specific examples of the monomers having the functional groups include allyl methacrylate, allyl acrylate, vinyl methacrylate, vinyl acrylate, 2-(vinyloxy)ethyl methacrylate, p-vinyloxystyrene, p-[2-(vinyloxy)ethyl]-styrene, glycidyl methacrylate, glycidyl acrylate, 2-isocyanate ethyl methacrylate or block isocyanate thereof by alcohol, 2-isocyanate ethyl acrylate or block isocyanate thereof by alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate, but the invention is not limited to these compounds.

In the invention, copolymers of these monomers and monomers copolymerizable with these monomers not having thermo-reactive groups can also be used. As the examples of copolymerizable monomers not having thermo-reactive groups, styrene, alkyl acrylate, alkyl methacrylate, acrylonitrile and vinyl acetate can be exemplified, for instance, but monomers not having thermo-reactive groups are not limited to these monomers.

As the polymeric reaction used in the case where the thermo-reactive groups are introduced after polymerization, the polymeric reactions disclosed in WO 96/34316 can be exemplified.

Of the above polymer fine particles having thermo-reactive groups, polymers that are coalesced with each other by heat are preferred, and those having hydrophilic surfaces and dispersible in water are particularly preferred. It is preferred that the contact angle of a film (a water droplet in air) prepared by coating only polymer fine particles and drying by a temperature lower than the solidification temperature is lower than the contact angle of a film (a water droplet in air) prepared by drying by a temperature higher than the solidification temperature. For making the surfaces of polymer fine particles hydrophilic, it is effective to let a hydrophilic polymer or oligomer, e.g., polyvinyl alcohol or polyethylene glycol, or a hydrophilic low molecular weight compound be adsorbed onto the surfaces of the polymer fine particles. However, the methods of surface hydrophilization treatment are not restricted thereto.

The solidification temperature of these polymer fine particles having thermo-reactive groups is preferably 70° C. or higher, but considering the aging stability, 100° C. or higher is more preferred. The average particle size of the polymer fine particles is preferably from 0.01 to 2.0 µm, more preferably from 0.05 to 2.0 µm, and especially preferably from 0.1 to 1.0 µm. Good resolution and aging stability can be obtained in this range of average particle size.

As the thermo-reactive groups in the microcapsules or the microgels containing a compound having a thermo-reactive group for use in the invention, the same thermo-reactive groups as used in the polymer fine particles having thermo-reactive groups are preferably exemplified.

As the compound having thermo-reactive groups contained in the microcapsules or microgels, the same compounds as the polymerizable compounds described above are preferably used.

Besides the polymerizable compounds, compounds having an epoxy group can also be exemplified as preferred compounds. As the compound having an epoxy group, compounds having two or more epoxy groups are preferred, and glycidyl ether compounds obtained by the reaction of polyhydric alcohol or polyhydric phenol with epichlorohydrin and prepolymers thereof, polymers and copolymers of glycidyl acrylate or glycidyl methacrylate can be exemplified.

The specific examples thereof include propylene glycol diglycidyl ether, tripropylene glycol diglycidyl ether, polypropylene glycol diglycidyl ether, neopentyl glycol diglycidyl ether, trimethylolpropane triglycidyl ether, diglycidyl ether of hydrogenated bisphenol A, hydroquinone diglycidyl ether, resorcinol diglycidyl ether, diglycidyl ether of bisphenol A or epichlorohydrin polyaddition products, diglycidyl ether of bisphenol F or epichlorohydrin polyaddition products, diglycidyl ether of halogenated bisphenol A or epichlorohydrin polyaddition products, diglycidyl ether of biphenyl-type bisphenol or epichlorohydrin polyaddition products, glycidyl etherified products of novolak resins, methyl methacrylate/glycidyl methacrylate copolymers, and ethyl methacrylate/glycidyl methacrylate copolymers.

Commercially available products of these compounds include, e.g., Epicote 1001 (molecular weight: about 900, epoxy equivalence: 450-500, manufactured by Japan Epoxy Resin Co., Ltd.), Epicote 1002 (molecular weight: about 1,600, epoxy equivalence: 600-700), Epicote 1004 (molecular weight: about 1,060, epoxy equivalence: 875-975), Epicote 1007 (molecular weight: about 2,900, epoxy equivalence: 2,000), Epicote 1009 (molecular weight: about 3,750, epoxy equivalence: 3,000), Epicote 1010 (molecular weight: about 5,500, epoxy equivalence: 4,000), Epicote 1100L (epoxy equivalence: 4,000), Epicote YX31575 (epoxy equivalence: 1,200), Sumiepoxy ESCN-195XHN, ESCN-195XL and ESCN-195XF (manufactured by Sumitomo Chemical Co., Ltd.), etc.

As the isocyanate compounds preferably used in the invention, tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate, and blocked products of these compounds with alcohol or amine can be exemplified.

As preferred amine compounds, ethylenediamine, diethylenetriamine, triethylenetetramine, hexamethylene-diamine, propylenediamine and polyethyleneimine are exemplified.

As the compounds having a hydroxyl group preferably usable in the invention, compounds having methylol groups at terminals, polyhydric alcohols such as pentaerythritol, and bisphenol-polyphenols are exemplified.

As the compounds having a carboxyl group preferably usable in the invention, aromatic polycarboxylic acids, e.g., pyromellitic acid, trimellitic acid, and phthalic acid, and aliphatic polycarboxylic acids, e.g., adipic acid are exemplified. As the preferred acid anhydrides preferably used in the invention, pyromellitic anhydride and benzophenone-tetracarboxylic anhydride are exemplified.

The compounds having a thermo-reactive group can be microencapsulated and microgelated by the well-known methods described above in the polymerization system image-recording layer.

Other Components:

For the purpose of improving on-press developability and the layer strength of the image-recording layer itself, the image-recording layer in the invention can contain a hydrophilic resin. As the hydrophilic resins, resins having a hydrophilic group, e.g., a hydroxyl group, an amino group, a carboxyl group, a phosphoric acid group, a sulfonic acid group, and an amido group are preferred. Further, since hydrophilic resins are crosslinked by the reaction with the thermo-reactive group of a hydrophobitizing precursor to thereby increase image strength and resistance to press, it is preferred that the hydrophilic resins have a group reactive with thermo-reactive groups. For example, when hydrophobitizing precursors have a vinyloxy group or an epoxy group, hydrophilic resins having a hydroxyl group, a carboxyl group, a phosphoric acid group or a sulfonic acid group are preferred. Hydrophilic resins having a hydroxyl group or a carboxyl group are particularly preferred.

As the specific examples of the hydrophilic resins, the polymers described above as the hydrophilic binder polymers in the binder polymers can be exemplified. The addition amount of the hydrophilic resins in the image-recording layer is preferably 20 mass % or less, and more preferably 10 mass % or less.

The hydrophilic resins may be crosslinked in advance in such a degree that an unexposed area can be subjected to on-press development. The examples of the crosslinking agents include aldehydes, e.g., glyoxal, melamine-formaldehyde resin, and urea-formaldehyde resin, methylol compounds, e.g., N-methylolurea, N-methylolmelamine, and methylolated polyamide resin, active vinyl compounds, e.g., divinylsulfone and bis(β-hydroxyethylsulfonic acid), epoxy compounds, e.g., epichlorohydrin, polyethylene glycol diglycidyl ether, polyamide, polyamine, epichlorohydrin addition product, and polyamide-epichlorohydrin resin, ester compounds, e.g., monochloroacetic acid ester and thioglycolic acid ester, polycarboxylic acids, e.g., polyacrylic acid and methyl vinyl ether/maleic acid copolymer, inorganic crosslinking agents, e.g., boric acid, titanyl sulfate, Cu, Al, Sn, V, Cr salts, and modified polyamide-polyimide resins. In addition, crosslinking catalysts such as ammonium chloride, silane coupling agents, and titanate coupling agents can be used in combination.

The image-recording layer in the invention can contain reaction accelerators for initiating or accelerating the reaction of the thermo-reactive groups. As such reaction accelerators, the above-described polymerization initiators can be exemplified.

The reaction accelerators can be used in combination of two or more. The reaction accelerators may be directly added to an image-recording layer coating solution, or may be added to the polymer fine particles. The content of the reaction accelerators in the image-recording layer is preferably from 0.01 to 20 mass % of the total solids content of the image-recording layer, and more preferably from 0.1 to 10 mass %. When the reaction accelerator is added in this range, on-press developability is not impaired and good reaction initiation or accelerating effect can be ensured.

In the image-recording layer utilizing hydrophobitizing precursor series, polyfunctional monomers can be added to the matrix of the image-recording layer for further increasing the press life. As the polyfunctional monomers, the polymerizable compounds exemplified above can be used. Trimethylolpropane triacrylate and pentaerythritol triacrylate are preferred above all.

Further, the hydrophobitizing precursor series image-recording layer can contain additives such as the surfactants, colorants, polymerization inhibitors, higher fatty acid derivatives, plasticizers, inorganic fine particles and low molecular weight hydrophilic compounds described in the explanation of the image-recording layer of the lithographic printing plate precursors for use in a packaged body, if necessary.

Formation of Hydrophobitizing Precursor Series Image Recording Layer:

Similarly to the case of the radical polymerization system image-recording layer, the hydrophobitizing precursor series image-recording layer in the invention is formed by preparing a coating solution by dispersing or dissolving the above necessary components in a solvent, and coating the resulting coating solution on a support and drying.

The coating weight (solids content) of the image recording layer on a support obtained after coating and drying is generally preferably from 0.5 to 5.0 g/m$^2$, although it differs according to uses.

A lithographic printing plate precursor capable of on-press development can be manufactured by using the hydrophobitizing precursor series image-recording layer.

On the other hand, by giving sufficient resistance to press to the hydrophobitizing precursor series image recording layer (a hydrophilic layer having a crosslinking structure) even when the image-recording layer is unexposed, the lithographic printing plate precursor in the invention can be applied to a non-processing (non-development) type lithographic printing plate precursor.

It is preferred for a hydrophilic layer having such a crosslinking structure to contain at least one kind of a hydrophilic resin having a crosslinking structure and an inorganic hydrophilic binder resin formed by sol/gel conversion. Of these resins, the hydrophilic resin is described first. By the addition of the hydrophilic resin, the affinity of the hydrophilic components in emulsion ink is increased and, at the same time, the film strength of the image-recording layer itself is also improved. As the hydrophilic resins, those having a hydrophilic group, e.g., hydroxyl, carboxyl, hydroxyethyl, hydroxypropyl, amino, aminoethyl, aminopropyl and carboxymethyl, are preferred.

As the specific examples of the hydrophilic resins, the polymers described above as the hydrophilic binder polymers in the binder polymers can be exemplified. By using these binder polymers by crosslinking, a hydrophilic layer having a crosslinking structure can be obtained. As crosslinking agents used for forming a crosslinking structure, the compounds exemplified above as the crosslinking agents are used.

As preferred embodiment of non-processing (non-development) type image-recording layer, an image-recording layer containing an inorganic hydrophilic binder resin formed by sol/gel conversion can also be exemplified. Preferred sol/gel convertible binder resins are polymers wherein the bonding groups of polyvalent elements form a network structure, i.e., a three-dimensional crosslinking structure, via oxygen atoms and, at the same time, polyvalent metals also have hydroxyl groups and alkoxyl groups not bonded and they are mixed and form resinous structure. The systems are in a sol state at a stage abundant in alkoxyl groups and hydroxyl groups, and the network resinous structure comes to heighten with the advancement of dehydration condensation. The polyvalent bonding elements of the compounds having sol/gel convertible hydroxyl groups and alkoxyl groups are aluminum, silicon, titanium and zirconium, and all of which can be used in the invention. More preferred sol/gel convertible systems are those using silicon, and particularly preferred system is a sol/gel convertible system containing a silane compound having at least one silanol group. A sol/gel convertible system using silicon is described below. Sol/gel conversions using aluminum, titanium and zirconium can also be carried out by the substitution of the silicon in the following description with respective elements.

Sol/gel convertible binder resins are preferably resins having a siloxane bond and a silanol group, and a coating solution of sol system containing a compound having at least one silanol group is used in the image-recording layer in the invention. Condensation and gelation of the silanol group progress during coating and drying processes, and the structure of a siloxane skeleton is formed.

An image-recording layer containing a sol/gel convertible binder resin and the above hydrophilic resins and crosslinking agents can be used in combination for the purpose of the improvement of physical properties, e.g., layer strength and the flexibility of the layer, and the betterment of coating property.

A siloxane resin for forming a gel structure is represented by the following formula (I), and a silane compound having at least one silanol group is represented by the following formula (II). A material added to an image recording layer need not be a silane compound represented by formula (II) alone and, in general, the material may comprise an oligomer of a silane compound partially condensed, or may be a mixture of a silane compound represented by formula (II) and the oligomer.

Formula (I)

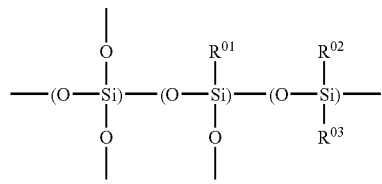

A siloxane resin represented by formula (I) is formed by sol/gel conversion from the dispersion containing at least one silane compound represented by formula (II). In formula (I), at least one of $R^{01}$, $R^{02}$ and $R^{03}$ represents a hydroxyl group, and the remaining represent an organic residue selected from $R^0$ and Y in formula (II).

$$(R^0)_n Si(Y)_{4-n} \quad (II)$$

In formula (II), $R^1$ represents a hydroxyl group, a hydrocarbon group or a heterocyclic group; Y represents a hydrogen atom, a halogen atom, $-OR^1$, $-OCOR^2$ or $-N(R^3)(R^4)$; $R^1$ and $R^2$ each represents a hydrocarbon group; $R^3$ and $R^4$, which may be the same or different, each represents a hydrocarbon group or a hydrogen atom; and n represents 0, 1, 2 or 3.

$R^0$ represents, as the hydrocarbon group or the heterocyclic group, e.g., a straight chain or branched alkyl group having from 1 to 12 carbon atoms which may be substituted (e.g., a methyl group, an ethyl group, a propyl group, a butyl group, a pentyl group, a hexyl group, a heptyl group, an octyl group, a nonyl group, a decyl group, a dodecyl group, etc.; as the substituents of these groups, a halogen atom (a chlorine atom, a fluorine atom, a bromine atom), a hydroxyl group, a thiol group, a carboxyl group, a sulfo group, a cyano group, an epoxy group, an —OR' group (R' represents a methyl group, an ethyl group, a propyl group, a butyl group, a heptyl group, a hexyl group, an octyl group, a decyl group, a propenyl group, a butenyl group, a hexenyl group, an octenyl group, a 2-hydroxyethyl group, a 3-chloropropyl group, a 2-cyanoethyl group, an N,N-dimethylaminoethyl group, a 2-bromoethyl group, a 2-(2-methoxyethyl)oxyethyl group, a 2-methoxycarbonylethyl group, a 3-carboxyethyl group, a 3-carboxypropyl group, a benzyl group), an —OCOR" group (R" has the same meaning as R' above), a —COOR" group, a —COR" group, an —N(R''')(R''') group (R''' represents a hydrogen atom or the same meaning as R', and two R''' may be the same or different), an —NHCONHR" group, an —NHCOOR" group, an –Si(R")$_3$ group, and a —CONHR" group can be exemplified, and a plurality of substituents may be substituted on the alkyl group), a straight chain or branched alkenyl group having from 2 to 12 carbon atoms which may be substituted (e.g., a vinyl group, a propenyl group, a butenyl group, a pentenyl group, a hexenyl group, an octenyl group, a decenyl group, a dodecenyl group, etc.; as the substituents of these groups, the same groups described above as the substituents of the alkyl group can be exemplified), an aralkyl group having from 7 to 14 carbon atoms which may be substituted (e.g., a benzyl group, a phenethyl group, a 3-phenylpropyl group, a naphthylmethyl group, a 2-naphthylethyl group; as the substituents of these groups, the same groups described above as the substituents of the alkyl group can be exemplified, and a plurality of substituents may be substituted on the aralkyl group), an alicyclic group having from 5 to 10 carbon atoms which may be substituted (e.g., a cyclopentyl group, a cyclohexyl group, a 2-cyclohexylethyl group, a norbornyl group, an adamantyl group, etc.; as the substituents of these groups, the same groups described above as the substituents of the alkyl group can be exemplified, and a plurality of substituents may be substituted), an aryl group having from 6 to 12 carbon atoms which may be substituted (e.g., a phenyl group, a naphthyl group, as the substituents of these groups, the same groups described above as the substituents of the alkyl group can be exemplified, and a plurality of substituents may be substituted), or a heterocyclic group containing at least one atom selected from a nitrogen atom, an oxygen atom and a sulfur atom which may be condensed (e.g., a pyran ring, a furan ring, a thiophene ring, a morpholine ring, a pyrrole ring, a thiazole ring, an oxazole ring, a pyridine ring, a piperidine ring, a pyrrolidone ring, a benzothiazole ring, a benzoxazole ring, a quinoline ring, a tetrahydrofuran ring, etc.;

each of which may have a substituent, as the substituents of these groups, the same groups described above as the substituents of the alkyl group can be exemplified, and a plurality of substituents may be substituted).

The substituents of the —$OR^1$ group, —$OCOR^2$ group or —$N(R^3)(R^4)$ group represented by Y in formula (II) are as follows. In the —$OR^1$ group, $R^1$ represents an aliphatic group having from 1 to 10 carbon atoms which may be substituted (e.g., a methyl group, an ethyl group, a propyl group, a butyl group, a heptyl group, a hexyl group, a pentyl group, an octyl group, a nonyl group, a decyl group, a propenyl group, a butenyl group, a heptenyl group, a hexenyl group, an octenyl group, a decenyl group, a 2-hydroxyethyl group, a 2-hydroxypropyl group, a 2-methoxyethyl group, a 2-(2-methoxyethyl)oxyethyl group, a 2-(N,N-dimethylamino)ethyl group, a 2-methoxypropyl group, a 2-cyanoethyl group, a 3-methyloxypropyl group, a 2-chloroethyl group, a cyclohexyl group, a cyclopentyl group, a cyclooctyl group, a chlorocyclohexyl group, a methoxycyclohexyl group, a benzyl group, a phenethyl group, a dimethoxybenzyl group, a methylbenzyl group, a bromobenzyl group, etc.).

In the —$OCOR^2$ group, $R^2$ represents an aliphatic group of the same meaning as $R^1$ has, or an aromatic group having from 6 to 12 carbon atoms which may be substituted (as the aromatic group, those described above in the aryl group represented by R can be exemplified). In the —$N(R^3)(R^4)$ group, $R^3$ and $R^4$, which may be the same or different, each represents a hydrogen atom or an aliphatic group having from 1 to 10 carbon atoms which may be substituted (e.g., the same groups described in $R^1$ of the —$OR^1$ group can be exemplified). More preferably, the total number of the carbon atoms of $R^3$ and $R^4$ is not more than 16. As the specific examples of the silane compound represented by formula (II), the following compounds can be exemplified, but the present invention is not limited to these compounds.

Tetrachlorosilane, tetramethoxysilane, tetraethoxysilane, tetraisopropoxysilane, tetra-n-propylsilane, methyltrichlorosilane, methyltrimethoxysilane, methyltriethoxysilane, ethyltrichlorosilane, ethyltrimethoxysilane, ethyltriethoxysilane, n-propyltrichlorosilane, n-propyltrimethoxysilane, n-hexyltrimethoxysilane, n-decyltrimethoxysilane, phenyltrichlorosilane, phenyltrimethoxysilane, dimethoxyditriethoxysilane, dimethyldichlorosilane, dimethyldimethoxysilane, diphenyldimethoxysilane, phenylmethyldimethoxysilane, triethoxyhydrosilane, trimethoxyhydrosilane, vinyltrichlorosilane, vinyltrimethoxysilane, trifluoropropyltrimethoxysilane, γ-glycidoxypropylmethyldimethoxysilane, γ-glycidoxypropylmethyldiethoxysilane, γ-glycidoxypropyltriethoxysilane, γ-methacryloxypropyltrimethoxysilane, γ-aminopropylmethyldimethoxysilane, γ-aminopropyltriethoxysilane, γ-mercaptopropylmethyldimethoxysilane, γ-mercaptopropyltrimethoxysilane, γ-mercaptopropyltriethoxysilane, and B-(3,4-epoxycyclohexyl)ethyltrimethoxysilane.

Together with a silane compound represented by formula (II), metallic compounds capable of conjoining with resins to form a film at the time of sol/gel conversion, e.g., Ti, Zn, Sn, Zr, Al, etc., can be used in the image-recording layer in combination. The examples of the metallic compounds for use for this purpose include, e.g., $Ti(OR")_4$, $TiCl_4$, $Zn(OR")_2$, $Zn(CH_3COCHCOCH_3)_2$, $Sn(OR")_4$, $Sn(CH_3COCHCOCH_3)_4$, $Sn(OCOR")_4$, $SnCl_4$, $Zr(OR")_4$, $Zr(CH_3COCHCOCH_3)_4$, $(NH_4)_2ZrO(CO_3)_2$, $Al(OR")_3$, $Al(CH_3COCHCOCH_3)$, etc. (wherein R" represents a methyl group, an ethyl group, a propyl group, a butyl group, a pentyl group, a hexyl group).

For accelerating hydrolysis and polycondensation reaction of the silane compound represented by formula (II) and the above metallic compound to be used in combination, it is preferred to use an acidic catalyst or a basic catalyst together. As the catalyst, an acidic or basic compound may be used as it is, or may be dissolved in water or a solvent such as alcohol (hereinafter referred to as the acidic catalyst or the basic catalyst). The concentration of the catalyst is not particularly restricted but when the concentration is high, hydrolysis and polycondensation reaction are liable to become fast. However, when the basic catalyst in high concentration is used, a precipitate is formed in some cases, so that the concentration of the basic catalyst is preferably 1N (in terms of the concentration in an aqueous solution) or less.

The specific examples of the acidic catalysts include hydroghalogenic acid such as hydrochloric acid, carboxylic acids such as nitric acid, sulfuric acid, sulfurous acid, hydrogen sulfide, perchloric acid, hydrogen peroxide, carbonic acid, formic acid and acetic acid, and and sulfonic acid such as benzenesulfonic acid. The specific examples of the basic catalysts include ammoniacal bases such as aqueous ammonia, and amines such as ethylamine and aniline, but the catalysts are not limited to these compounds.

As described above, an image-recording layer produced by the sol/gel method is particularly preferred as the constitution of the image-recording layer according to the present invention. The details of the sol/gel method are described in Sumio Sakka, Sol/Gel Ho no Kagaku (Chemistry of Sol/Gel Method), Agune Shofu-Sha (1988) and Hiroshi Hirashima, Saishin Sol/Gel Ho ni yoru Kino-Sei Hakumaku Sakusei Gijutsu (Producing Techniques of Functional Thin Films by the Latest Sol/Gel Methods), Sogo Gijutsu Center (1992).

The addition amount of the hydrophilic resins to the image recording layer having a crosslinking structure is preferably from 5 to 70 mass % of the solids content of the image-recording layer, more preferably from 5 to 50 mass %.

Support:

Supports for use in the lithographic printing plate precursor in the invention are not particularly limited and any supports can be used so long as they are dimensionally stable and plate-like materials. For example, paper, paper laminated with plastics (e.g., polyethylene, polypropylene, polystyrene, etc.), metal plates (e.g., aluminum, zinc, copper, etc.), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper and plastic films laminated or deposited with the above metals can be exemplified as the materials of the support. Preferred supports are a polyester film and an aluminum plate. Above all, aluminum sheets, which are dimensionally stable and comparatively inexpensive, are preferred.

Aluminum plates are a pure aluminum plate, alloy plates containing aluminum as a main component and a trace amount of different elements, and aluminum or aluminum alloy thin films laminated with plastics. The examples of different elements contained in aluminum alloys include silicon, iron, manganese, copper, magnesium, chromium, zinc, bismuth, nickel, titanium, etc. The different element content in aluminum alloys is preferably 10 mass % or less. In the invention, a pure aluminum plate is preferred but 100% pure aluminum is difficult to produce from the refining technique, accordingly, an extremely small amount of different elements may be contained. Thus, the compositions of aluminum plates used in the invention are not specified, and aluminum plates of conventionally well known and commonly used materials can be optionally used.

A support for use in the invention has a thickness of preferably from 0.1 to 0.6 mm, more preferably from 0.15 to 0.4 mm, and still more preferably from 0.2 to 0.3 mm.

Prior to the use of an aluminum plate, it is preferred for the aluminum plate to be subjected to surface treatment, e.g., surface roughening treatment and anodizing treatment. By surface treatment, the improvement of hydrophilicity and the security of the adhesion of an image-recording layer and a support become easy. Prior to the surface roughening treatment of an aluminum plate, if necessary, degreasing treatment with a surfactant, an organic solvent or an alkaline aqueous solution is carried out to remove the rolling oil on the surface of an aluminum plate.

Surface roughening treatment of the surface of an aluminum plate is performed by various methods, e.g., mechanical surface roughening treatment, electrochemical surface roughening treatment (surface roughening treatment of electrochemically dissolving the surface), and chemical surface roughening treatment (surface roughening treatment of chemically selectively dissolving the surface) are exemplified.

As the method of mechanical surface roughening treatment, well-known methods, e.g., a ball rubbing method, a brush abrading method, a blast abrading method, or a buffing method, can be used.

As the method of electrochemical surface roughening treatment, a method of roughening in an electrolyte containing an acid such as a hydrochloric acid or a nitric acid by alternating current or direct current can be used. Further, a method of using mixed acids can be used as disclosed in JP-A-54-63902.

The aluminum plate subjected to surface roughening treatment is, if necessary, subjected to alkali etching treatment with an aqueous solution of potassium hydroxide or sodium hydroxide and neutralizing treatment and then, if necessary, to anodizing treatment to increase the abrasion resistance of the surface.

Various electrolytes can be used in the anodizing treatment of an aluminum plate for forming porous oxide film, and sulfuric acid, hydrochloric acid, oxalic acid, chromic acid and mixed acids of these acids are generally used. The concentrations of these electrolytes are arbitrarily determined according to the kinds of electrolytes.

Anodizing treatment conditions vary according to electrolytes used and cannot be specified unconditionally, but in general preferably the concentration of an electrolytic solution is from 1 to 80 mass %, the liquid temperature is from 5 to 70° C., the electric current density is from 5 to 60 A/dm$^2$, the voltage is from 1 to 100 V, electrolytic time is from 10 seconds to 5 minutes. The amount of the anodic oxide film formed is preferably from 1.0 to 5.0 g/m$^2$, more preferably from 1.5 to 4.0 g/m$^2$. In this range of the amount of the anodic oxide film, good press life and good scratch resistance of the non-image area of the lithographic printing plate can be obtained.

As the supports for use in the invention, supports subjected to surface treatments as above and having an anodic oxide film may be used as they are, but for further improving the adhesion with the upper layer, a hydrophilic property, soiling resistance and a heat insulating property, enlarging treatment of the micro-pores of the anodic oxide film, sealing treatment of the micro-pores, and hydrophilization treatment of the surface by immersion in an aqueous solution containing a hydrophilic compound as disclosed in JP-A-2001-253181 and JP-A-2001-322365 can be arbitrarily performed, if necessary.

As the hydrophilizing process, alkali metal silicate methods as disclosed in U.S. Pat. Nos. 2,714,066, 3,181,461, 3,280,734 and 3,902,734 are known. These methods comprise immersion processing of a support in an aqueous solution of sodium silicate, or electrolytic processing. In addition, a method of processing an aluminum plate with potassium fluorozirconate as disclosed in JP-B-36-22063, and methods of processing with polyvinylphosphonic acid as disclosed in U.S. Pat. Nos. 3,276,868, 4,153,461 and 4,689,272 are exemplified.

When a polyester film insufficient in a hydrophilic property of surface is used as a support in the invention, it is preferred to coat a hydrophilic layer to make the surface hydrophilic. As the hydrophilic layers, a hydrophilic layer provided by coating a coating solution containing the colloid of oxide or hydroxide of at least one element selected from beryllium, magnesium, aluminum, silicon, titanium, boron, germanium, tin, zirconium, iron, vanadium, antimony and transition metals as disclosed in JP-A-2001-199175, a hydrophilic layer having an organic hydrophilic matrix obtained by the crosslinking or pseudo-crosslinking of an organic hydrophilic polymer as disclosed in JP-A-2002-79772, a hydrophilic layer having an inorganic hydrophilic matrix obtained by sol/gel conversion comprising hydrolysis and condensation reaction of polyalkoxysilane, titanate, zirconate or aluminate, and a hydrophilic layer comprising an inorganic thin film having a surface containing a metallic oxide are preferred. Of these hydrophilic layers, a hydrophilic layer provided by coating a coating solution containing the colloid of oxide or hydroxide of silicon is preferred.

When a polyester film is used as a support in the invention, it is preferred to provide an antistatic layer on the hydrophilic layer side of the support, or on the opposite side to the hydrophilic layer, or on both sides. When an antistatic layer is provided between a support and a hydrophilic layer, the antistatic layer also contributes to the adhesion of the hydrophilic layer and the support. The polymer layers containing the dispersion of metallic oxide fine particles and a matting agent as disclosed in JP-A-2002-79772 can be used as the antistatic layers.

It is preferred that a support for use in the invention has a central line average surface roughness of from 0.10 to 1.2 μm. In this range of average surface roughness, good adhesion of the support and an image-recording layer, good press life and good soiling resistance can be obtained.

The color density of a support is preferably from 0.15 to 0.65 in terms of a reflection density value. A good image forming property due to antihalation in the time of image exposure and a good plate-detecting property after development can be obtained when the color density of a support is in this range.

Back Coat Layer:

After surface treatment of a support or after forming an undercoat layer, if necessary, a backcoat can be provided on the back surface of the support.

As the backcoat, e.g., coating layers comprising organic polymer compounds as disclosed in JP-A-5-45885, and coating layers comprising metallic oxides obtained by hydrolysis and polycondensation of organic or inorganic metallic compounds as disclosed in JP-A-6-35174 are preferably used. Alkoxy compounds of silicon, e.g., Si(OCH$_3$)$_4$, Si(OC$_2$H$_5$)$_4$, Si(OC$_3$H$_7$)$_4$, Si(OC$_4$H$_9$)$_4$, are preferably used for the inexpensiveness and easy availability of the materials.

Undercoat Layer:

In the lithographic printing plate precursor in the invention, if necessary, an undercoat layer can be provided between an image-recording layer and a support. In particular in the on-press development type lithographic printing plate precursor, the image-recording layer comes to be easily peeled off the support at an unexposed area by an undercoat layer, so that on-press developability is improved. In the case of infrared laser exposure, since an undercoat layer functions as a heat insulating layer, the heat generated by exposure does not diffuse to the support and is efficiently utilized, so that the improvement of sensitivity can be contrived.

As the undercoat layer, specifically the silane coupling agent having an addition polymerizable ethylenic double bond reactive group disclosed in JP-A-10-282679, and the phosphorus compounds having an ethylenic double bond reactive group disclosed in JP-A-2-304441 are preferred.

As particularly preferred undercoat layer, polymer resins obtained by copolymerizing a monomer having an adsorptive group/a monomer having a hydrophilic group/a monomer having a crosslinking group can be exemplified.

The essential component of polymer undercoating is an adsorptive group onto a hydrophilic support surface. The presence or absence of adsorptivity onto a hydrophilic support surface can be judged by the following method.

A coating solution obtained by dissolving a test compound in an easily dissolving solvent is prepared, and the coating solution is coated on a support in a dry weight of 30 mg/m² and dried. The support coated with the test compound is thoroughly washed with the easily dissolving solvent, and the amount of the residue of the test compound not removed by washing is measured, from which the amount of the compound adsorbed onto the support is computed. The residual amount may be determined by directly measurement, or may be computed from the determination of the test compound dissolved in the washing solution. The determination of the compound can be performed by fluorescent X-ray measurement, reflectance spectroscopic absorbance measurement, and liquid chromatography measurement. A compound having adsorptivity onto a support is a compound that remains by 0.5 mg/m² or more after washing as above.

Adsorptive groups onto a hydrophilic support surface are functional groups capable of causing chemical bonding (e.g., ionic bonding, hydrogen bonding, coordinate bonding, bonding by intermolecular force) with the substances present on a hydrophilic support surface (e.g., metal, metallic oxide) or functional groups (e.g., a hydroxyl group). The adsorptive groups are preferably an acid radical or a cationic group.

The acid radical has an acid dissociation constant (pKa) of preferably 7 or less. The examples of acid radicals include a phenolic hydroxyl group, a carboxyl group, $-PO_3H_2$, $-OPO_3H_2$, $-CONHSO_2-$, $-SO_2NHSO_2-$ and $-COCH_2COCH_3$, and phosphoric acid group ($-OPO_3H_2$ and $-PO_3H_2$) are especially preferred. These acid radicals may be metal salts.

The cationic groups are preferably onium groups. The examples of onium groups include an ammonium group, a phosphonium group, an arsonium group, a stibonium group, an oxonium group, a sulfonium group, a selenonium group, a stannonium group, and an iodonium group. An ammonium group, a phosphonium group and a sulfonium group are preferred, and an ammonium group and a phosphonium group are more preferred, and an ammonium group is most preferred.

As especially preferred examples of monomers having an adsorptive group, the compounds represented by the following formula (III) or (IV) are exemplified.

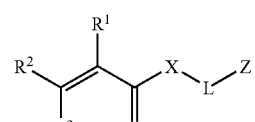

(III)

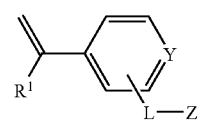

(IV)

In formula (III), $R^1$, $R^2$ and $R^3$ each represents a hydrogen atom, a halogen atom, or an alkyl group having from 1 to 6 carbon atoms. $R^1$, $R^2$ and $R^3$ each preferably represents a hydrogen atom or an alkyl group having from 1 to 6 carbon atoms, more preferably represents a hydrogen atom or an alkyl group having from 1 to 3 carbon atoms, and most preferably a hydrogen atom or a methyl group. $R^2$ and $R^3$ each especially preferably represents a hydrogen atom.

In formula (III), X represents an oxygen atom ($-O-$) or an imino group ($-NH-$), and X more preferably represents an oxygen atom. In formula (III), L represents a divalent linking group. L preferably represents a divalent aliphatic group (an alkylene group, a substituted alkylene group, an alkenylene group, a substituted alkenylene group, an alkynylene group, a substituted alkynylene group), a divalent aromatic group (an arylene group, a substituted arylene group), or a divalent heterocyclic group, or combinations of these groups with an oxygen atom ($-O-$), a sulfur atom ($-S-$), imino ($-NH-$), substituted imino ($-NR-$, where R represents an aliphatic group, an aromatic group or a heterocyclic group), or carbonyl ($-CO-$).

The aliphatic group may have a cyclic structure or a branched structure. The carbon atoms of the aliphatic group is preferably from 1 to 20, more preferably from 1 to 15, and most preferably from 1 to 10. As the aliphatic group, a saturated aliphatic group is preferred to an unsaturated aliphatic group. The aliphatic group may have a substituent, e.g., a halogen atom, a hydroxyl group, an aromatic group and a heterocyclic group.

The number of carbon atoms of the aromatic group is preferably from 6 to 20, more preferably from 6 to 15, and most preferably from 6 to 10. The aromatic group may have a substituent, e.g., a halogen atom, a hydroxyl group, an aliphatic group, an aromatic group and a heterocyclic group are exemplified as the examples of the substituents.

The heterocyclic group preferably has a 5- or 6-membered ring as a heterocyclic ring. Other heterocyclic ring, an aliphatic ring or an aromatic ring may be condensed with the heterocyclic ring. The heterocyclic ring may have a substituent, e.g., a halogen atom, a hydroxyl group, an oxo group ($=O$), a thioxo group ($=S$), an imino group ($=NH$), a substituted imino group ($=N-R$, where R represents an aliphatic group, an aromatic group or a heterocyclic group), an aliphatic group, an aromatic group, and a heterocyclic group are exemplified as the examples of the substituents.

L is preferably a divalent linking group containing a plurality of polyoxyalkylene structures. The polyoxyalkylene structures are more preferably polyoxyethylene structures. In other words, it is preferred for L to contain $-(OCH_2CH_2)_n-$ (n is an integer of 2 or more).

In formula (III), Z represents a functional group adsorptive to a hydrophilic support surface. Y represents a carbon atom or a nitrogen atom. In the case where Y is a nitrogen atom and L is linked on Y to form a quaternary pyridinium group, the group itself shows adsorptivity, so that Z is not essential.

The adsorptive functional group is as described above.

In formula (IV), $R^1$, Y, L and Z have the same meaning as in formula (III).

The representative examples of the compounds represented by formula (III) or (IV) are shown below.

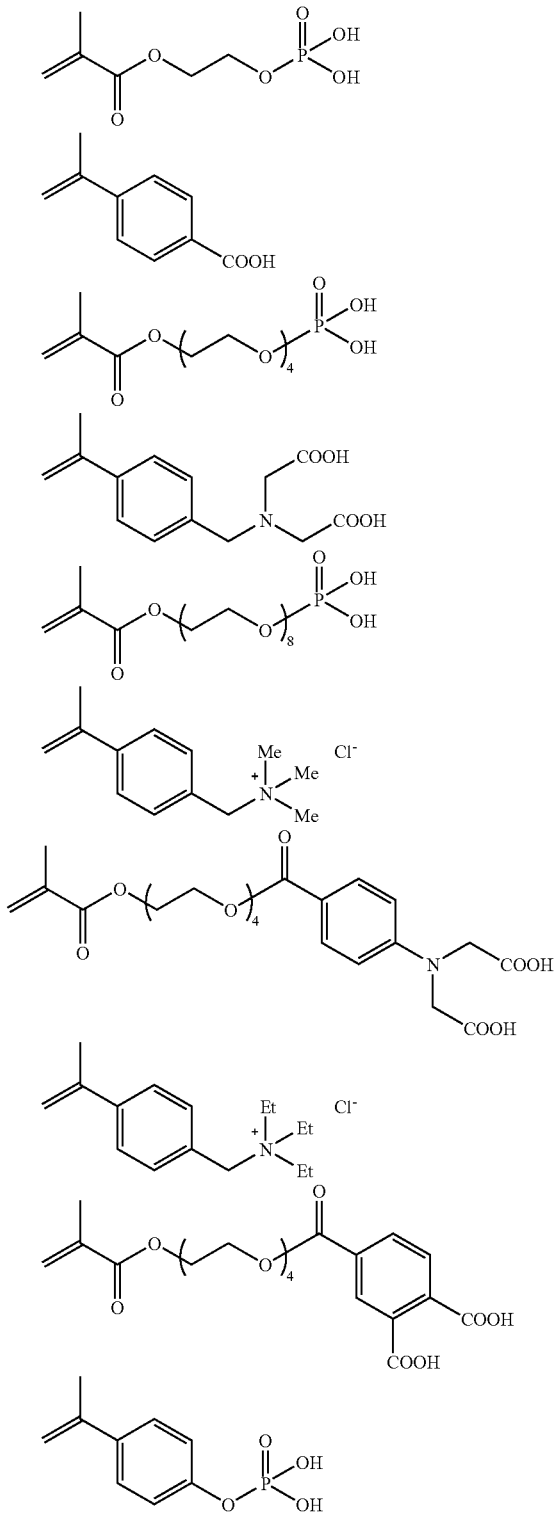

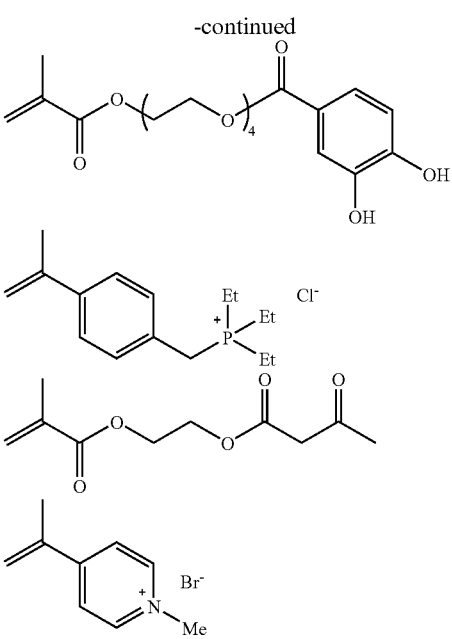

As preferred hydrophilic groups of the polymeric undercoating usable in the invention, those having a sulfonic acid group showing a high hydrophilic property are exemplified. Specifically, sodium salts and amine salts of methallyloxybenzenesulfonic acid, allyloxybenzenesulfonic acid, allylsulfonic acid, vinylsulfonic acid, p-styrenesulfonic acid, methallylsulfonic acid, acrylamido-t-butylsulfonic acid, 2-acrylamido-2-methylpropanesulfonic acid, and (3-acryloyloxypropyl)butylsulfonic acid are exemplified. Sodium 2-acrylamido-2-methylpropanesulfonate is preferred for the hydrophilic performance and easy handling on synthesis.

It is preferred that the polymer resins for the undercoat layer in the invention have a crosslinking property for the improvement of adhesion with the image area. For making the polymer resins for the undercoat layer crosslinkable, a method of introducing a crosslinking functional group, e.g., ethylenic unsaturated bond, to the side chain of the polymer, and a method of forming a salt structure by a substituent having counter charge of the polar substituent of the polymer resin and a compound having an ethylenic unsaturated bond can be used.

As the examples of polymers having an ethylenic unsaturated bond in the side chain of a molecule, polymers of ester or amide of an acrylic acid or a methacrylic acid are exemplified, i.e., polymers in which the residue of the ester or amide (R of —COOR or CONHR) has an ethylenic unsaturated bond.

The examples of residues having an ethylenic unsaturated bond (the above R) include —$(CH_2)_n CR^1=CR^2R^3$, —$(CH_2O)_n CH_2CR^1=CR^2R^3$, —$(CH_2CH_2O)_n CH_2CR^1=CR^2R^3$, —$(CH_2)_n NH—CO—O—CH_2CR^1=CR^2R^3$, —$(CH_2)_n—O—CO—CR^1=CR^2R^3$, and $(CH_2CH_2O)_2—X$ (in the formulae, $R^1$, $R^2$ and $R^3$ each represents a hydrogen atom, a halogen atom, an alkyl group having from 1 to 20 carbon atoms, an aryl group, an alkoxyl group or an aryloxy group, and $R^1$ and $R^2$ or $R^3$ may be bonded to each other to form a ring, n represents an integer of from 1 to 10, and X represents a dicyclopentadienyl residue).

The specific examples of ester residues include —$CH_2CH=CH_2$ (disclosed in JP-B-7-21633), —$CH_2CH_2O—CH_2CH=CH_2$, —$CH_2C(CH_3)=CH_2$, —$CH_2CH=CH—C_6H_5$, —$CH_2CH_2OCOCH=CH—C_6H_5$, —CH$_2$CH$_2$—NHCOO—CH$_2$CH=CH$_2$, and —CH$_2$CH$_2$O—X (wherein X represents a dicyclopentadienyl residue).

The specific examples of amide residues include —CH$_2$CH=CH$_2$, —CH$_2$CH$_2$—Y (wherein Y represents a cyclohexene residue), and —CH$_2$CH$_2$OCO—CH=CH$_2$.

The content of crosslinkable groups in the polymer resin for the undercoat layer (the content of radical polymerizable unsaturated double bonds by iodometry) is preferably from 0.01 to 10.0 mmol per gram of the polymer resin, more preferably from 0.1 to 7.0 mmol, and most preferably from 0.2 to 5.5 mmol. When the content of crosslinkable groups is in this range, the compatibility of good sensitivity with soiling resistance, and good preservation stability can be ensured.

The polymer resin for the undercoat layer preferably has a mass average molecular weight of preferably 5,000 or higher, more preferably from 10,000 to 300,000, and a number average molecular weight of preferably 1,000 or higher, more preferably from 2,000 to 250,000. The polydisperse degree (mass average molecular weight/number average molecular weight) is preferably from 1.1 to 10.

The polymer resins for the undercoat layer may be any of a random polymer, a block polymer and a graft polymer, but a random polymer is preferred.

As the copolymer substituents of the polymers for the undercoating usable in the invention, conventionally well known copolymer substituents can be used with no limitation. As the hydrophilic copolymer substituents, polymers having a hydrophilic group, e.g., a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group are preferably exemplified.

The specific examples include sodium alginate, vinyl acetate-maleic acid copolymers, styrene-maleic acid copolymers, polyacrylic acids and the salts thereof, polymethacrylic acids and the salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of 60 mol % or more, preferably 80 mol % or more, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide, polyvinyl pyrrolidone, alcohol-soluble nylon, and polyether of 2,2-bis(4-hydroxyphenyl)propane and epichlorohydrin.

The polymer resin for the undercoat layer may be used alone, or two or more polymer resin may be used as mixture. Two or more compounds having a functional group adsorptive onto a hydrophilic support surface may be used in combination.

The coating amount of the undercoat layer (solids content) is preferably from 0.1 to 100 mg/m$^2$, more preferably from 1 to 30 mg/m$^2$.

3. Lithographic Printing Method

In the lithographic printing method of the invention, the above lithographic printing plate precursor of the invention is imagewise exposed by exposure through a transparent original having a line image and a dot image, or by laser scanning exposure by digital data. As exposure light sources, e.g., a carbon arc lamp, a high-pressure mercury lamp, a xenon lamp, a metal halide lamp, a fluorescent lamp, a tungsten lamp, a halogen lamp, an ultraviolet laser, a visible laser and an infrared laser are exemplified. Lasers are especially preferred, e.g., a solid state laser and a semiconductor laser radiating infrared rays of from 760 to 1,200 nm, and a semiconductor laser radiating rays of from 250 to 420 nm are exemplified.

In the lithographic printing plate precursors as claimed in claims 17 to 23, a solid state laser and a semiconductor laser radiating infrared rays of from 760 to 1,200 nm are used.

When a laser is used, it is preferred to perform imagewise scanning exposure according to digital data. For expediting exposure time, it is preferred to use a multi-beam laser device.

When an infrared laser is used, the exposure time per a pixel is preferably not longer than 20 μsec. The quantity of irradiation energy is preferably from 10 to 300 mJ/cm$^2$.

When an ultraviolet laser is used, the staying time on pixels is preferably as short as possible for suppressing the competitive reaction with oxygen, preferably 1 msec or less, more preferably 500 μsec or less, and most preferably 100 μsec or less. The quantity of irradiation energy is preferably from 0.1 to 10 mJ/cm$^2$.

In the lithographic printing method in the invention, as described above, after the lithographic printing plate precursor of the invention is imagewise exposed with laser beams, printing can be carried out by supplying oil ink and an aqueous component without being subjected to development process.

Specifically, a method of subjecting a lithographic printing plate precursor to laser exposure, and then mounting the exposed printing plate precursor on a printing press without undergoing development process and perform printing, and a method of mounting a lithographic printing plate precursor on a printing press, and then exposing the printing plate precursor with laser beams on the printing press, and perform printing without subjecting to development process are exemplified.

When a lithographic printing plate precursor is imagewise exposed with laser beams and printing is performed by supplying oil ink and aqueous component without being subjected to development process such as wet development process, the image-recording layer hardened by exposure forms an oil ink-accepting area having a lipophilic surface at the exposed area of the image-recording layer in the case of an on-press development type lithographic printing plate precursor. On the other hand, unhardened image-recording layer is dissolved or dispersed with the supplied oil ink and/or aqueous component and removed at the unexposed area, whereby a hydrophilic surface is bared at that area. As a result, the aqueous component adheres to the bared hydrophilic surface, the oily ink adheres to the image-recording layer in the exposed area, and printing is initiated.

In the case of a non-processing type lithographic printing plate precursor, since the unexposed area has a hydrophilic surface and the exposed area has been converted to a lipophilic surface, when an aqueous component and/or oil ink are fed, the aqueous component is adhered to the unexposed area and oil ink is adhered to the exposed area selectively, so that it is possible to immediately perform printing.

Here, the one supplied first to the printing plate may be an aqueous component or may be oil ink. However, for preventing the aqueous component from becoming dirty by the image-recording layer at the unexposed area, it is preferred to supply oil ink first in the on-press type lithographic printing plate precursor of the invention. As the aqueous component and the oil ink, a fountain solution and printing ink used in ordinary lithographic printing are respectively used.

Thus, the lithographic printing plate precursor is subjected to on-press development on an offset press and used as it is in printing of a plenty of sheets.

EXAMPLE

The invention will be described with reference to Examples, but the invention is not limited thereto.

Manufacture of Support:

For removing the rolling oil of the surface, an aluminum plate having a thickness of 0.3 mm (material 1050) was subjected to degreasing treatment with a 10 mass % sodium laminate aqueous solution at 50° C. for 30 seconds, and then the aluminum surface was subjected to brush-graining with three nylon brushes planted with hairs having a hair diameter of 0.3 mm and a suspension of pumice stone and water of a median diameter of 25 μm (the specific gravity: 1.1 g/cm³), and the surface of the plate was thoroughly washed with water. The plate was immersed in a 25 mass % sodium hydroxide aqueous solution at 45° C. for 9 seconds for etching, and washed with water. After water washing, the plate was further immersed in a 20 mass % nitric acid aqueous solution at 60° C. for 20 seconds, followed by washing with water. The etched amount of the surface by graining was about 3 g/m².

Electrochemical surface roughening treatment was performed continuously by alternating voltage of 60 Hz. The electrolyte at this time was an aqueous solution containing 1 mass % of a nitric acid (containing a 0.5 mass % of an aluminum ion) and the liquid temperature was 50° C. As the alternating current electric source waveform, trapezoidal rectangular waveform alternating current was used, the time TP required for the electric current value to reach the peak from 0 was 0.8 msec, the duty ratio was 1/1, and electrochemical surface roughening treatment was performed with a carbon electrode as the counter electrode. Ferrite was used as the auxiliary anode. The electric current density was 30 A/dm² at a peak value of electric current, and 5% of the electric current from the electric source was diverted to the auxiliary anode. The quantity of electricity in nitric acid electrolysis was 175 C/dm² in the quantity of electricity with aluminum plate as the anode. The aluminum plate was then washed with water by spraying.

Subsequently, electrochemical surface roughening treatment of the aluminum plate was performed with an electrolyte of a 0.5 mass % hydrochloric acid aqueous solution (containing 0.5 mass % of an aluminum ion) at a liquid temperature of 50° C. on the condition of the quantity of electricity of 50 C/dm² with the aluminum plate as the anode in the same manner as in the nitric acid electrolysis. The plate was then washed with water by spraying. The plate was provided with 2.5 g/m² of an anodic oxide film with a 15 mass % sulfuric acid (containing 0.5 mass % of an aluminum ion) as the electrolyte by the electric current density of 15 A/dm², washed and dried to prepare support A. The central line average surface roughness (Ra) of the plate measured with a needle having a diameter of 2 μm was 0.51 μm.

Undercoat layer coating solution (1) was coated on the above support A to prepare a support having an undercoat layer to be used in the following experiment. A support having a dry coating weight of 10 mg/m² was prepared as support B, and a support having a dry coating weight of 6 mg/m² as support C.

| Undercoat layer coating solution (1): | |
|---|---|
| Undercoat compound (1) | 0.017 g |
| Methanol | 9.00 g |
| Water | 1.00 g |

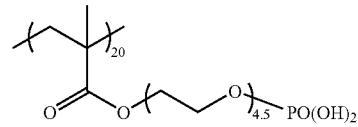
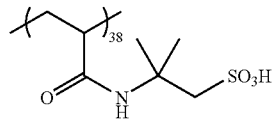
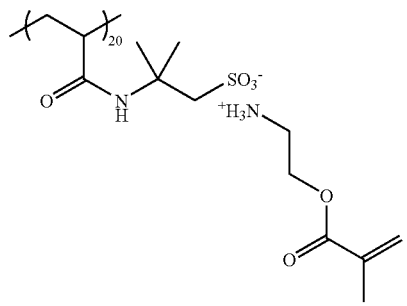
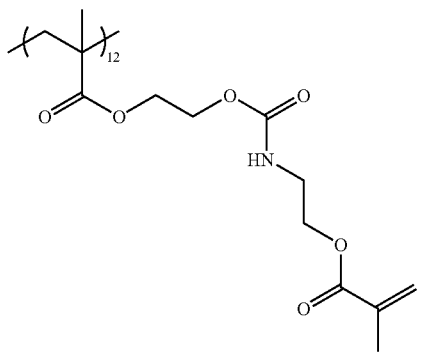
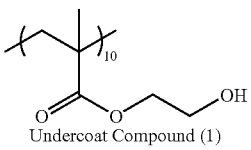

Undercoat Compound (1)

Example 1

(1) Manufacture of Lithographic Printing Plate Precursor

The image-recording layer coating solution (1) having the composition shown below was coated on support B with bar coating, dried at 100° C. for 60 seconds in an oven to form an image-recording layer having a dry coating weight of 1.0 g/m², whereby lithographic printing plate precursor (1) was obtained. The central line average roughness (Ra) of the surface of the lithographic printing plate precursor having the image recording layer measured with a needle having a diameter of 2 μm was 0.40 μm, and the surface roughness of the side opposite to the side on which the image-recording layer was coated was 0.25 μM.

Image-recording layer coating solution (1):

| | |
|---|---|
| Binder polymer (1) | 0.162 g |
| Polymerization initiator (1) | 0.100 g |
| Infrared absorber (1) | 0.030 g |
| Polymerizable compound, Aronix M-215 (manufactured by Toa Gosei Co., Ltd.) | 0.385 g |
| Fluorine surfactant (1) | 0.044 g |
| Inorganic layered compound dispersion (1) prepared as follows | 3.125 g |
| Methyl ethyl ketone | 1.091 g |
| 1-Methyl-2-propanol | 8.609 g |
| Water | 2.425 g |
| Microcapsules (1) synthesized as follows | 2.640 g |

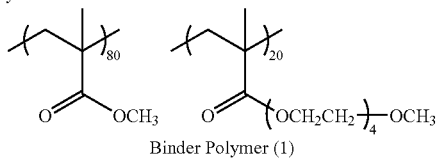

Binder Polymer (1)

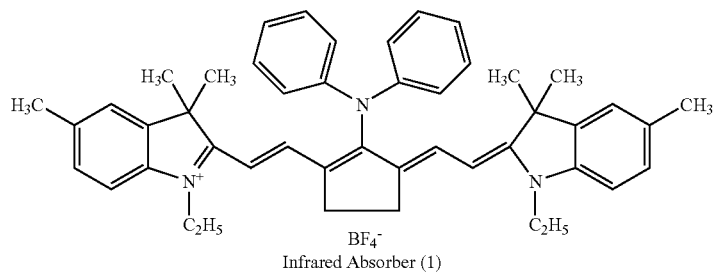

Infrared Absorber (1)

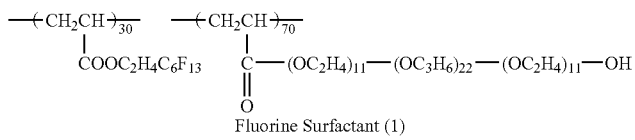

Fluorine Surfactant (1)

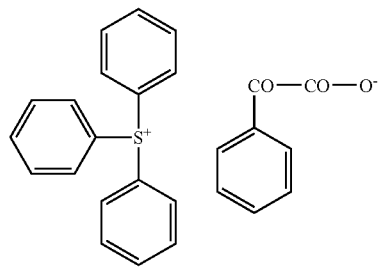

Polymerization Initiator (1)

Synthesis of Microcapsule (1):

As the oil phase component, 10 g of the addition product of trimethylolpropane and xylene diisocyanate (Takenate D-10N, a 75 mass % ethyl acetate solution, manufactured by Mitsui Takeda Chemicals Inc.), 6.00 g of Aronix M-215 (manufactured by To a Gosei Co., Ltd.), and 0.12 g of Pionin A-41C (manufactured by Takemoto Oil & Fat) were dissolved in 16.67 g of ethyl acetaate. As the aqueous phase component, 37.5 g of a 4 mass % aqueous solution of PVA-205 was prepared. The oil phase component and the aqueous phase component were mixed, and emulsified with a homogenizer at 12,000 rpm for 10 minutes. The obtained emulsified product was added to 25 g of distilled water, stirred at room temperature for 30 minutes, and then stirred at 40° C. for 2 hours. The concentration of the solids content of the obtained microcapsule solution was diluted with distilled water to reach 15 mass %. The average particle size of the obtained microcapsule solution was 0.2 μm.

Preparation of Inorganic Layered Compound Dispersion (1):

To 193.6 g of ion exchange water was added 6.4 g of synthetic mica Somasif ME-100 (manufactured by CO—OP CHEMICAL CO., LTD.), and the mixture was dispersed with a homogenizer until the average particle size (a laser scattering method) reached 3 μm.

Figure 2:
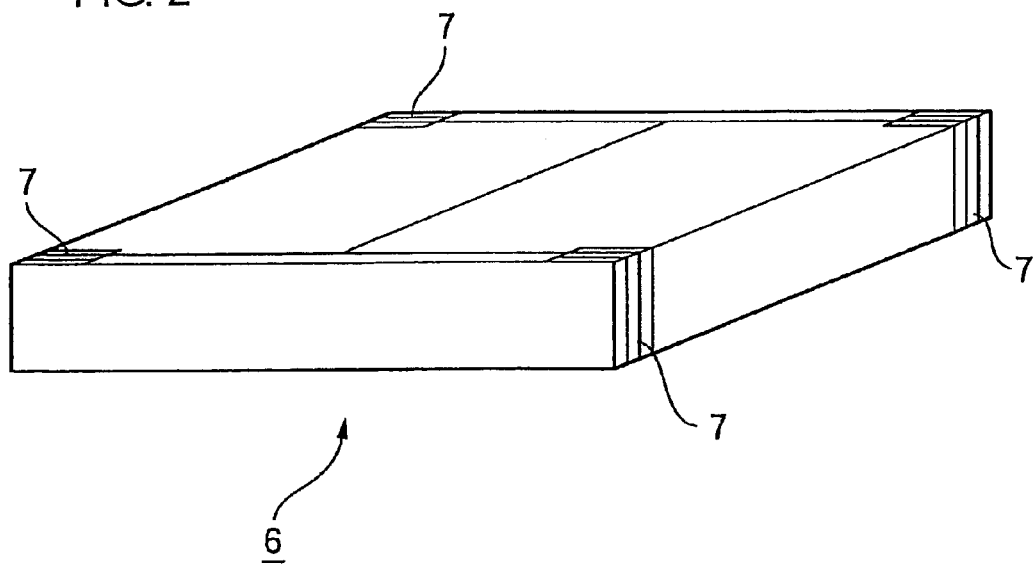
FIG. 2 is a packaged body viewed diagonally.

(2) Manufacture of Packaged Body:

Fifty sheets of the obtained lithographic printing plate precursors were laminated in a manner that the surface of the side having an image-recording layer of one lithographic printing plate precursor and the surface of the side not having an image-recording layer of another lithographic printing plate precursor were directly brought into contact as shown in FIG. 1. The laminate was packaged with kraft paper lined with an aluminum foil and fixed with an adhesive tape as shown in FIG. 2, whereby a packaged body was manufactured.

Example 2

The image-recording layer coating solution (2) having the composition shown below was coated on the same support B as in Example 1 with bar coating, dried at 100° C. for 60 seconds in the oven to form an image-recording layer having a dry coating weight of 1.0 g/m². Subsequently, the protective layer coating solution (1) having the composition shown below was coated on the above image-recording layer with wire bar coating and dried at 120° C. for 60 seconds in the oven, whereby lithographic printing plate precursor (2) with a protective layer having a dry coating weight of 0.20 g/m² was obtained. The central line average roughness (Ra) of the surface of the lithographic printing plate precursor having the protective layer measured with a needle having a diameter of 2 μm was 0.28 μm, and the surface roughness of the side opposite to the image-recording layer was 0.25 μm. The obtained lithographic printing plate precursors were made a packaged body according to the same manner as in Example 1.

| Image-recording layer coating solution (2): | |
|---|---|
| Binder polymer (1) | 0.162 g |
| Polymerization initiator (2) shown below | 0.100 g |
| Infrared absorber (1) | 0.030 g |
| Polymerizable compound, Aronix M-215 (manufactured by Toa Gosei Co., Ltd.) | 0.385 g |
| Fluorine surfactant (1) | 0.044 g |
| Methyl ethyl ketone | 1.091 g |
| 1-Methyl-2-propanol | 8.609 g |
| Water | 2.425 g |
| Microcapsules (1) | 2.640 g |

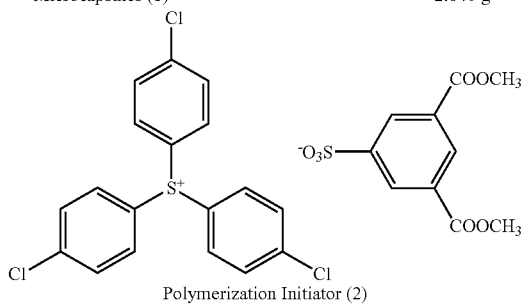

Polymerization Initiator (2)

| Protective layer coating solution (1): | |
|---|---|
| Inorganic layered compound dispersion (1) | 1.5 g |
| Polyvinyl alcohol PVA 105 (degree of saponification: 98.5 mol %, degree of polymerization: 500, manufactured by Kuraray Co., Ltd.) | 0.06 g |
| Vinylpyrrolidone-vinyl acetate copolymer LUVITEC VA64W (copolymerization ratio: 6/4, manufactured by ISP Co.) | 0.01 g |
| Surfactant, EMALEX 710 (manufactured by Nihon Emulsion Co.) | 0.01 g |
| Ion exchange water | 6.0 g |

Example 3

Lithographic printing plate precursor (3) was manufactured in the same manner as in Example 2, except that the dry coating weight of the protective layer was changed from 0.20 g/m² to 1.0 g/m². The central line average roughness (Ra) of the surface of the lithographic printing plate precursor having the protective layer measured with a needle having a diameter of 2 μM was 0.20 μm, and the surface roughness of the side opposite to the image-recording layer was 0.25 sun. The obtained lithographic printing plate precursors were made a packaged body according to the same manner as in Example 1.

Example 4

Lithographic printing plate precursor (4) was manufactured in the same manner as in Example 2, except that inorganic layered compound dispersion (1) used in the protective layer coating solution was changed to inorganic layered compound dispersion (2). The central line average roughness (Ra) of the surface of the lithographic printing plate precursor having the protective layer measured with a needle having a diameter of 2 μm was 0.28 μm, and the surface roughness of the side opposite to the image-recording layer was 0.25 μm. The obtained lithographic printing plate precursors were made a packaged body according to the same manner as in Example 1.

Preparation of Inorganic Layered Compound Dispersion (2):
To 193.6 g of ion exchange water was added 6.4 g of Bengel (refined montmorillonite, manufactured by HOJUN), and the mixture was dispersed with a homogenizer until the average particle size (a laser scattering method) reached 2.1 μm.

Example 5

Lithographic printing plate precursor (5) was manufactured in the same manner as in Example 2, except that inorganic layered compound dispersion (1) used in the protective layer coating solution was changed to inorganic layered compound dispersion (3). The central line average roughness (Ra) of the surface of the lithographic printing plate precursor having the protective layer measured with a needle having a diameter of 2 μm was 0.27 μm, and the surface roughness of the side opposite to the image-recording layer was 0.25 μM. The obtained lithographic printing plate precursors were made a packaged body according to the same manner as in Example 1.

Preparation of Inorganic Layered Compound Dispersion (3):
To 193.6 g of ion exchange water was added 6.4 g of Bengel W-100 (anionic polymer complex refined montmorillonite, manufactured by HOJUN Co., Ltd.), and the mixture was dispersed with a homogenizer until the average particle size (a laser scattering method) reached 1.8 μm.

Example 6

Lithographic printing plate precursor (6) was manufactured in the same manner as in Example 2, except that inorganic layered compound dispersion (1) used in the protective layer coating solution was changed to inorganic layered compound dispersion (4). The central line average roughness (Ra) of the surface of the lithographic printing plate precursor having the protective layer measured with a needle having a diameter of 2 μm was 0.23 μm, and the surface roughness of the side opposite to the image-recording layer was 0.25 μm. The obtained lithographic printing plate precursors were made a packaged body according to the same manner as in Example 1.

Preparation of Inorganic Layered Compound Dispersion (4):
To 193.6 g of ion exchange water was added 6.4 g of Kunipia G (sodium montmorillonite, manufactured by Kunimine Industries Co., Ltd.), and the mixture was dispersed with a homogenizer until the average particle size (a laser scattering method) reached 1.8 μm.

Example 7

Lithographic printing plate precursor (7) was manufactured in the same manner as in Example 2, except that the dry coating weight of the protective layer was changed from 0.20 g/m² to 2.4 g/m². The central line average roughness (Ra) of the surface of the lithographic printing plate precursor having the protective layer measured with a needle having a diameter of 2 μm was 0.20 μm, and the surface roughness of the side opposite to the image-recording layer was 0.25 μm. The obtained lithographic printing plate precursors were made a packaged body according to the same manner as in Example 1.

Example 8

Lithographic printing plate precursor (8) was manufactured in the same manner as in Example 1, except that nylon brushes planted with hairs having a hair diameter of 0.3 mm used in manufacturing the support was changed to nylon brushes planted with hairs having a hair diameter of 0.72 mm. The central line average roughness (Ra) of the surface of the lithographic printing plate precursor having the protective layer measured with a needle having a diameter of 2 μm was 0.60 μm, and the surface roughness of the side opposite to the image-recording layer was 0.25 μm. The obtained lithographic printing plate precursors were made a packaged body according to the same manner as in Example 1.

Comparative Example 1

Lithographic printing plate precursor (R1) was manufactured in the same manner as in Example 3, except that inorganic layered compound dispersion (1) used in the protective layer coating solution was excluded. The central line average roughness (Ra) of the surface of the lithographic printing plate precursor having the protective layer measured with a needle having a diameter of 2 μm was 0.15 μm, and the surface roughness of the side opposite to the image-recording layer was 0.25 μm. The obtained lithographic printing plate precursors were made a packaged body according to the same manner as in Example 1.

Comparative Example 2

Lithographic printing plate precursor (R2) was manufactured in the same manner as in Example 1, except that inorganic particle dispersion (1) shown below was used in place of inorganic layered compound dispersion (1) used in image-recording layer coating solution (1). The central line average roughness (Ra) of the surface of the lithographic printing plate precursor having the protective layer measured with a needle having a diameter of 2 μm was 2.0 μm, and the surface roughness of the side opposite to the image-recording layer was 0.25 μm. The obtained lithographic printing plate precursors were made a packaged body according to the same manner as in Example 1.
Preparation of Inorganic Particle Dispersion (1):
To 193.6 g of ion exchange water was added 6.4 g of Mizukasil P-802 (silica gel, manufactured by Mizusawa Industrial Chemicals, Ltd.), and the mixture was dispersed with a homogenizer until the average particle size (a laser scattering method) reached 2.4 μm.

Comparative Example 3

A packaged body was manufactured in the same manner as in Example 2, except that interleaving sheets were inserted between every sheet of 50 sheets of the lithographic printing plate precursors (that is, the image-recording layer was in touch with the interleaf directly). The interleaf used was made from 100 mass % of broad leaved bleached kraft pulp, weighing 30 g/m², density of 0.8 g/cm³, water content of 4.5 mass %, Beck's smoothness of about 500 sec, and pH of 5.5.

Exposure of Lithographic Printing Plate Precursor and Printing Method:
Each of the obtained lithographic printing plate precursors was subjected to exposure with Trendsetter 3244VX (manufactured by Creo Products Incorporated) loading a water-cooling type 40 W infrared semiconductor laser on the conditions of output of 9 W, external drum rotating speed of 210 rpm, and resolution of 2,400 dpi. The exposed printing plate precursor was mounted on SOR-M cylinder (manufactured by Heidelberg Japan K.K.) without performing development. A fountain solution (CDS 803 diluted 50 times with city water, manufactured by Tokyo Printing Ink Mfg. Co., Ltd.) and TRANS-G (N) Sumi Ink (manufactured by Dainippon Ink and Chemicals Inc.) were supplied as the fountain solution and ink, and printing was begun at a printing speed of 6,000 sheets per hour.

The number of the sheets of printing paper required up to the time when the on-press development of the unexposed area of the image-recording layer finished and the ink did not transfer to printing paper was counted, and the number of sheets was taken as the on-press developability. Printed substance free from staining on the non-image area could be obtained within 100 sheets with every lithographic printing plate precursor.
Evaluation of Packaged Body:
With the packaged bodies prepared in Examples and Comparative Examples, adhesion, scratch resistance, aging stability and press life were evaluated as follows. The results obtained of the evaluations are shown Table 2 below. The contents of each packaged bodies in Examples and Comparative Examples are shown in Table 1 below.
(1) Adhesion
The packaged body was preserved under atmosphere of 35° C. 85% RH for 1 month and then unfolded. The adhesion of the lithographic printing plate precursors to each other was evaluated. The case capable of separating the lithographic printing plate precursors was graded o, and the case of incapable of separation due to adhesion of the lithographic printing plate precursors was graded x.
(2) Scratch Resistance
The packaged body was subjected to vibration test according to JIS Z 0232 on the conditions of the peak acceleration ±7.35 m/s² and vibration time of 60 min. After that, the lithographic printing plate precursor was subjected to exposure and on-press development as above. The 100$^{th}$ printed matter was taken out, and an abnormal place where the ink did not adhere to the image area, or an abnormal place where the ink adhered to the non-image area was visually observed. In the case of free of abnormality was graded o, and the case with abnormality was graded x.
(3) Aging Stability
The packaged body was preserved under atmosphere of 35° C. 85% RH for 1 month and then unfolded. After that, the lithographic printing plate precursor was subjected to exposure and on-press development as above. The 100$^{th}$ printed matter was taken out, and the presence or absence of an abnormal place where the ink adhered to the non-image area was visually observed. In the case of free of abnormality was graded o, and the case with abnormality was graded x
(4) Press Life
The packaged body was preserved under atmosphere of 35° C. 85% RH for 1 month and then unfolded. After that, the lithographic printing plate precursor was subjected to exposure and on-press development as above, and printing was further continued. With the increase of the number of printed papers, the abrasion of the image-recording layer gradually proceeds, ink receptivity lowers, and the density of ink on the printing paper starts to decrease. Press life was evaluated by the number of the printed matters at the time when the ink density (reflection density) reduced by 0.1 from the starting time of printing.

TABLE 1

Contents of packaged bodies in Examples and Comparative Examples

| Example No. | No. of Lithographic Printing Plate Precursor | Image Recording Layer | Protective Layer | Coating Weight of Protective Layer (g/m2) | Surface Roughness (μm) | Interleaf |
|---|---|---|---|---|---|---|
| Example 1 | (1) | Coating Soln. (1) | None | | 0.4 | Not used |
| Example 2 | (2) | Coating Soln. (2) | Containing inorganic layered compound dispersion (1) | 0.2 | 0.28 | Not used |
| Example 3 | (3) | Coating Soln. (2) | Containing inorganic layered compound dispersion (1) | 1 | 0.2 | Not used |
| Example 4 | (4) | Coating Soln. (2) | Containing inorganic layered compound dispersion (2) | 0.2 | 0.28 | Not used |
| Example 5 | (5) | Coating Soln. (2) | Containing inorganic layered compound dispersion (3) | 0.2 | 0.27 | Not used |
| Example 6 | (6) | Coating Soln. (2) | Containing inorganic layered compound dispersion (4) | 0.2 | 0.23 | Not used |
| Example 7 | (7) | Coating Sob. (2) | Containing inorganic layered compound dispersion (1) | 2.4 | 0.2 | Not used |
| Example 8 | (8) | Coating Soln. (1) | None | | 0.6 | Not used |
| Comparative Example 1 | Comparison (1) | Coating Soln. (2) | Not containing inorganic layered compound dispersion | 1 | 0.15 | Not used |
| Comparative Example 2 | Comparison (2) | Coating Soln. (1) added with filler | None | | 2 | Not used |
| Comparative Example 3 | (2) | Coating Soln. (2) | Containing inorganic layered compound dispersion (1) | 0.2 | 0.28 | Used |

TABLE 2

Results of Evaluation

| Example No. | Adhesion | Scratch Resistance | Aging Stability | Press Life (number of sheets) |
|---|---|---|---|---|
| Example 1 | ○ | ○ | ○ | 20,000 |
| Example 2 | ○ | ○ | ○ | 30,000 |
| Example 3 | ○ | ○ | ○ | 25,000 |
| Example 4 | ○ | ○ | ○ | 30,000 |
| Example 5 | ○ | ○ | ○ | 30,000 |
| Example 6 | ○ | ○ | ○ | 25,000 |
| Example 7 | ○ | ○ | ○ | 15,000 |
| Example 8 | ○ | ○ | ○ | 15,000 |
| Comparative Example 1 | x | x | x | 1,000 |
| Comparative Example 2 | ○ | ○ | x | 2,000 |
| Comparative Example 3 | ○ | ○ | x | 30,000 |

It can be seen from the results of the above evaluation that the packaged bodies in the invention not using interleaving sheets are free from the failures such as adhesion and scratch, good in aging stability, and press life can be well maintained.

Example 9

The image-recording layer coating solution (3) having the composition shown below was coated on support A with bar coating, dried at 120° C. for 60 seconds in the oven to form an image-recording layer having a dry coating weight of 2.0 g/m². Subsequently, the protective layer coating solution (2) having the composition shown below was coated on the above image-recording layer with wire bar coating in a dry coating weight of 0.3 g/m², and dried at 120° C. for 60 seconds in the same manner, whereby lithographic printing plate precursor (9) was obtained.

| Image-recording layer coating solution (3): | |
|---|---|
| Polymerizable compound (urethane monomer UA-306H, manufactured by Kyoeisha Chemical Co., Ltd.) | 3.74 mass parts |
| Polymerizable compound (acrylic monomer SR-355, manufactured by Nippon Kayaku Co., Ltd.) | 0.78 mass parts |
| Binder polymer (2) shown below | 3.53 mass parts |
| Polymerization initiator (1) | 0.42 mass parts |
| Infrared absorber (2) shown below | 0.09 mass parts |
| n-Propanol | 72.95 mass parts |
| Ion exchange water | 18.24 mass parts |

Binder Polymer (2)

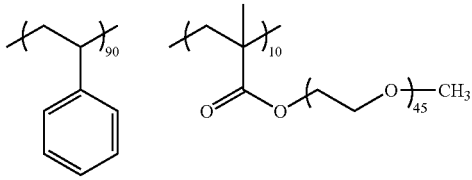

Image-recording layer coating solution (3):

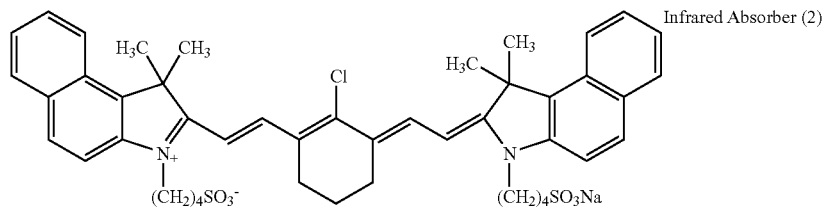
Infrared Absorber (2)

| Protective layer coating solution (2): | |
|---|---|
| Inorganic layered compound dispersion (5) shown below | 8.0 g |
| Polyvinyl alcohol PVA 110 (degree of saponification: 98.5 mol %, manufactured by Kuraray Co., Ltd.) | 1.3 g |
| Sodium 2-ethylhexylsulfosuccinate | 0.3 g |
| Water | 133 g |

To 368 g of water was added 32 g of synthetic mica Somasif ME-100 (aspect ratio: 1,000 or more, manufactured by CO—OP CHEMICAL CO., LTD.), and the mixture was dispersed with a homogenizer until the average particle size (a laser scattering method) reached 0.5 μm.

(2) Exposure and Printing:

Each of the obtained lithographic printing plate precursors was subjected to exposure with Trendsetter 3244VX (manufactured by Creo Products Incorporated) loading a water-cooling type 40 W infrared semiconductor laser on the conditions of output of 10 W, external drum rotating speed of 150 rpm, and resolution of 2,400 dpi. The exposed printing plate precursor was mounted on SOR-M cylinder (manufactured by Heidelberg Japan K.K.) without performing development. A fountain solution (EU-3 (an etching solution manufactured by Fuji Photo Film Co., Ltd.)/water/isopropyl alcohol=1/89/10 (by volume)) and TRANS-G (N) Sumi Ink (manufactured by Dainippon Ink and Chemicals Inc.) were supplied as the fountain solution and ink, and printing was begun at a printing speed of 6,000 sheets per hour. The number of the sheets of printing paper required up to the time when the on-press development of the unexposed area of the image-recording layer finished and the ink did not transfer to printing paper was counted, and the number of sheets was taken as the on-press developability. The results obtained are shown in Table 4.

In the case of negative lithographic printing plate precursor, the degree of hardening of an image-recording layer (photosensitive layer) is low and press life is low when the exposure amount is small, on the other hand the degree of hardening is high and press life is high when the exposure amount is large. Press life was evaluated by continuing printing. With the increase of the number of printed papers, the abrasion of the image-recording layer gradually proceeds, and ink receptivity lowers, so that the density of ink on the printing paper decreases. Press life was evaluated by the number of the printed matters at the time when the ink density (reflection density) reduced by 0.1 from the starting time of printing. The results obtained are shown in Table 4 below.

Examples 10 to 14 and Comparative Example 4

Lithographic printing plate precursors (10) to (14) and comparative lithographic printing plate precursor (R4) were manufactured in the same manner as in Example 9, except that the binder polymer were changed as shown in Table 3 below, and on-press developability and press life were evaluated. The results obtained are shown in Table 4.

TABLE 3

Binder Polymer

Ex. 9: [structure shown] weight average molecular weight: about 40,000

Ex. 10: [structure shown] weight average molecular weight: about 30,000

Ex. 11: [structure shown] weight average molecular weight: about 20,000

TABLE 3-continued

| | Binder Polymer | |
|---|---|---|
| Ex. 12 | 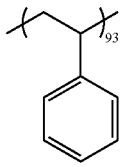 | weight average molecular weight: about 50,000 |
| Ex. 13 | 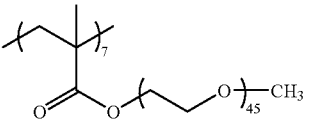 | weight average molecular weight: about 40,000 |
| Ex. 14 | 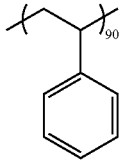 | weight average molecular weight: about 30,000 |
| Comp. Ex. 4 | 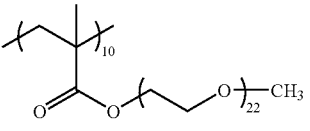 | weight average molecular weight: about 40,000 |

Comparative Example 5

The image-recording layer coating solution (3) shown above was coated on the same support as in Example 9 with bar coating, dried at 120° C. for 60 seconds in the oven to form an image-recording layer having a dry coating weight of 2.0 g/m². Subsequently, the protective layer coating solution (3) having the composition shown below was coated on the above image-recording layer with wire bar coating in a dry coating weight of 2 g/m², and dried at 120° C. for 60 seconds in the same manner, whereby comparative lithographic printing plate precursor (R5) was obtained. On-press developability and press life were evaluated in the same manner as in Example 1. The results obtained are shown in Table 4.

| Protective layer coating solution (3): | |
|---|---|
| Polyvinyl alcohol PVA 110 (degree of saponification: 98.5 mol %, manufactured by Kuraray Co., Ltd.) | 5.26 g |
| Polyvinyl imidazole | 0.93 g |
| Ion exchange water | 93.81 g |

Comparative Example 6

The image-recording layer coating solution (3) shown above was coated on the same support as in Example 9 with bar coating, dried at 120° C. for 60 seconds in the oven to form an image-recording layer having a dry coating weight of 2.0 g/m², whereby comparative lithographic printing plate precursor (R6) was obtained. A protective layer was not provided. With the obtained lithographic printing plate precursor, on-press developability and press life were evaluated in the same manner as in Example 9. The results of evaluation are shown in Table 4.

TABLE 4

| Example No. | Press Life (number of sheet) | On-Press Developability (number of sheet) |
|---|---|---|
| Example 9 | 20,000 | 30 |
| Example 10 | 15,000 | 30 |
| Example 11 | 20,000 | 30 |
| Example 12 | 25,000 | 40 |
| Example 13 | 25,000 | 40 |
| Example 14 | 10,000 | 60 |
| Comparative Example 4 | 5,000 | 150 |
| Comparative Example 5 | 0 (image formation failure) | — |
| Comparative Example 6 | 1,000 | 30 |

From the results in Table 4, it can be seen that the lithographic printing plate precursors in the invention are excellent in on-press developability and press life.

Example 15

Lithographic printing plate precursor (15) was manufactured in the same manner as in Example 9, except that the image-recording layer coating solution (4) shown below was used in place of the image-recording layer coating solution (3) in Example 9, and evaluations were performed in the same manner as in Example 9. The number of press life was 20,000 sheets and the number of on-press developability was 30 sheets.

Image-recording layer coating solution (4) was prepared by mixing and stirring the following photosensitive solution (1) and microgel solution (1) just before coating.

| Photosensitive solution (1): | |
|---|---|
| Binder polymer (2) in Example 9 | 0.162 g |
| Polymerization initiator in Example 9 | 0.1 g |
| Infrared absorber (2) in Example 9 | 0.020 g |
| Polymerizable compound, Aronix M-215 (manufactured by Toa Gosei Co., Ltd.) | 0.385 g |
| Fluorine surfactant (1) | 0.044 g |
| Methyl ethyl ketone | 1.091 g |
| 1-Methoxy-2-propanol | 8.609 g |

| Microgel solution (1): | |
|---|---|
| Microgel (1) synthesized as follows | 2.640 g |
| Distilled water | 2.425 g |

Synthesis of Microgel (1):

As the oil phase component, 10 g of the addition product of trimethylolpropane and xylene diisocyanate (Takenate D-110N, manufactured by Mitsui Takeda Chemicals Inc.), 3.15 g of pentaerythritol triacrylate (SR444, manufactured by Nippon Kayaku Co., Ltd.), and 0.1 g of Pionin A-41C (manufactured by Takemoto Oil & Fat) were dissolved in 17 g of ethyl acetaate. As the aqueous phase component, 40 g of a 4 mass % aqueous solution of PVA-205 was prepared. The oil phase component and the aqueous phase component were mixed, and emulsified with a homogenizer at 12,000 rpm for 10 minutes. The obtained emulsified product was added to 25 g of distilled water, stirred at room temperature for 30 minutes, and then stirred at 50° C. for 3 hours. The concentration of the solids content of the obtained microgel solution was diluted with distilled water to reach 15 mass %. The average particle size of the obtained microgel solution was 0.2 μm.

Examples 16 to 26 and Comparative Examples 7 to 13

The image-recording layer coating solution shown below was coated on support C with bar coating, dried at 100° C. for 60 seconds in the oven to form an image-recording layer having a dry coating weight of 1.0 g/m². Subsequently, the protective layer coating solution (4) or (5) having the composition shown below was coated on the above image-recording layer with bar coating, and dried at 125° C. for 75 seconds in the oven to form a protective layer, whereby lithographic printing plate precursors (16) to (26) and comparative lithographic printing plate precursors (R7) to (R13) were obtained.

The image-recording layer coating solutions were prepared by mixing and stirring the following photosensitive solutions ((2) to (12) and (r1) to (r5)) and microcapsule solution (2) just before coating.

| Photosensitive solution (2) to (12) and (r1) to (r5): | |
|---|---|
| Binder polymer (1) | 0.147 g |
| Radical generator (the compound shown in Table 5) | X g |
| Infrared absorber (the compound shown in Table 5) | Y g |
| Additive for discoloration (the compound shown in Table 5) | Z g |
| Polymerizable compound (Aronix M-215 manufactured by Toa Gosei Co., Ltd.) | 0.350 g |
| Fluorine surfactant (1) | 0.040 g |
| Methyl ethyl ketone | 0.991 g |
| 1-Methoxy-2-propanol | 7.816 g |
| Microcapsule solution (1): | |
| Microcapsule (1) shown above | 2.397 g |
| Water | 2.202 g |
| Protective layer coating solution (4): | |
| Polyvinyl alcohol PVA 105 (degree of saponification: 98.5 mol %, degree of polymerization: 500, a 6 mass % aqueous dispersion, manufactured by Kuraray Co., Ltd.) | 2.24 g |
| Vinyl acetate-vinylpyrrolidone copolymer Luviskol VA64W, a 50 mass % aqueous solution, manufactured by BASF Japan) | 0.0073 g |
| Polyvinyl pyrrolidone (30K, manufactured by Wako Pure Chemical Industries) | 0.0053 g |
| Surfactant (EMALEX 10, a 1 mass % aqueous solution, manufactured by Kao Corporation) | 2.15 g |
| Flaky synthetic mica (MEB3L, average particle size: 1 to 5 μm Φ, a 3.4 mass % water dispersion, manufactured by UNICOO) | 3.75 g |
| Distilled water | 10.60 g |
| Protective layer coating solution (5): | |
| Polyvinyl alcohol PVA 105 (degree of saponification: 98.5 mol %, degree of polymerization: 500, a 6 mass % aqueous dispersion, manufactured by Kuraray Co., Ltd.) | 2.24 g |
| Vinyl acetate-vinylpyrrolidone copolymer Luviskol VA64W, a 50 mass % aqueous solution, manufactured by BASF Japan) | 0.0073 g |

-continued

| Photosensitive solution (2) to (12) and (r1) to (r5): | |
|---|---|
| Polyvinyl pyrrolidone (30K, manufactured by Wako Pure Chemical Industries) | 0.0053 g |
| Surfactant (EMALEX 10, a 1 mass % aqueous solution, manufactured by Kao Corporation) | 2.15 g |
| Distilled water | 10.60 g |

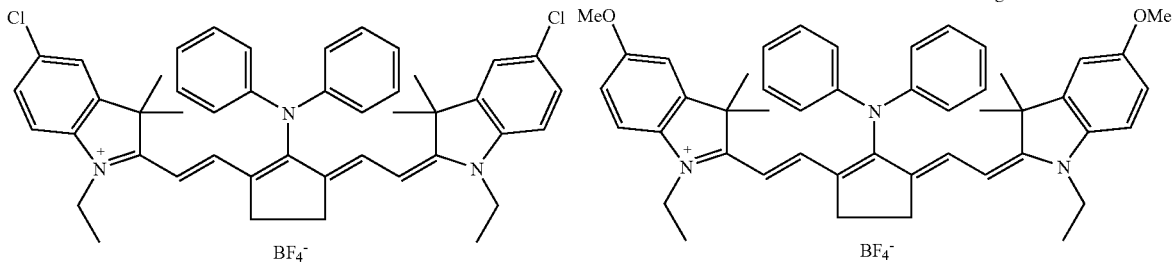

Infrared Absorber (3)   Infrared Absorber (4)

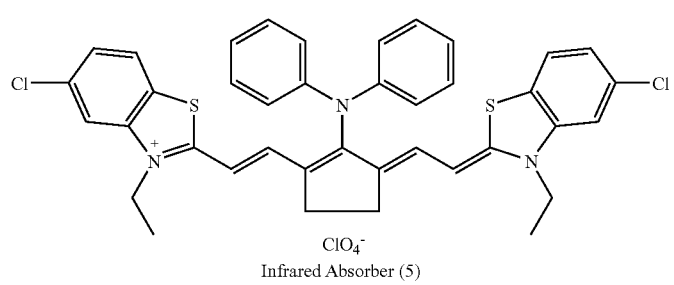

Infrared Absorber (5)

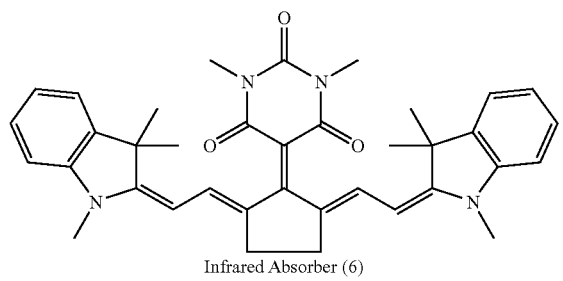

Infrared Absorber (6)

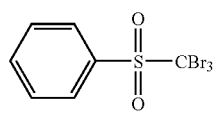 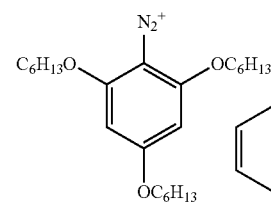 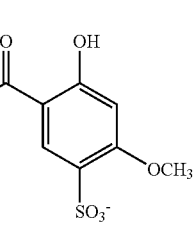 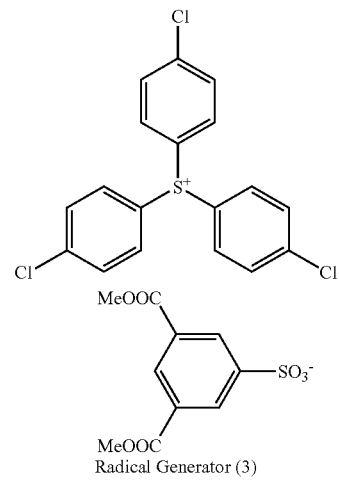

Radical Generator (1)   Radical Generator (2)   Radical Generator (3)

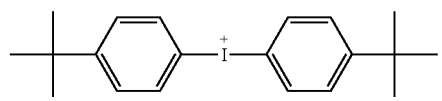 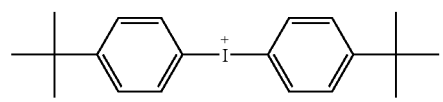

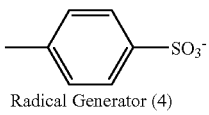

Radical Generator (4)   Radical Generator (5)

Photosensitive solution (2) to (12) and (r1) to (r5):

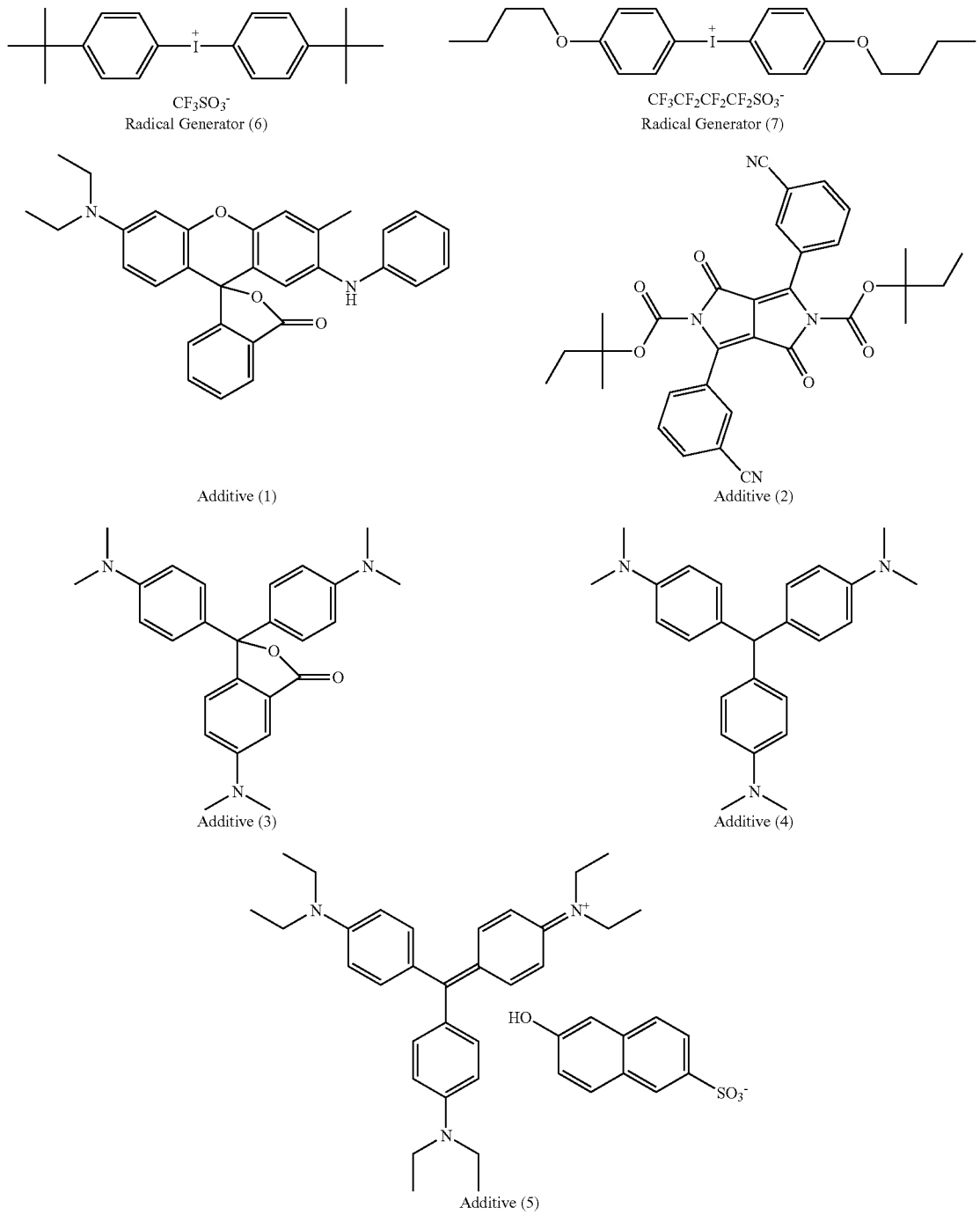

(2) Exposure and Printing:

Each of the obtained lithographic printing plate precursors was subjected to exposure with Trendsetter 3244VX (manufactured by Creo Products Incorporated) loading a water-cooling type 40 W infrared semiconductor laser on the conditions of output of 9 W, external drum rotating speed of 210 rpm, and resolution of 2,400 dpi, so that the exposure image contained a fine line chart. After exposure, the visibility (plate-detecting property) of the fine line chart was visually evaluated.

The exposed printing plate precursor was mounted on SOR-M cylinder (manufactured by Heidelberg Japan K.K.) without performing development. A fountain solution (EU-3 (an etching solution manufactured by Fuji Photo Film Co., Ltd.)/water/isopropyl alcohol=1/89/10 (by volume)) and TRANS-G (N) Sumi Ink (manufactured by Dainippon Ink and Chemicals Inc.) were supplied as the fountain solution and ink, and printing was performed at a printing speed of 6,000 sheets per hour. At this time, the number of the sheets required up to the time when the ink did not transfer to the unexposed area (non-image area) of the image-recording layer (on-press developability) was evaluated.

When the number of printed papers increases by further continuing printing, the abrasion of the image-recording layer gradually proceeds, and ink receptivity lowers, so that the density of ink on the printing paper decreases. Press life was evaluated by the number of the printed matters at the time when the ink density (reflection density) reduced by 0.1 from the starting time of printing. The results obtained are shown in Table 5 below:

From the results in Table 5, it can be seen that Examples 16 to 26 that used the lithographic printing plate precursors and the lithographic printing method of the invention are excellent in the visibility of the printing plates after exposure and on-press developability, little in loss paper, and showed good press life.

ing microgel solution (2) was used in place of microcapsule solution (2), and evaluations were performed in the same manner as in Example 16.

The lithographic printing plate precursor showed good plate-detecting property, and the number of on-press developability was 30 sheets and the number of press life was 12,000 sheets. The absorbance of the infrared absorber at 645 nm increased by 0.10 by exposure.

| Microgel solution (2): | |
|---|---|
| Microgel (2) synthesized as follows | 2.397 g |
| Distilled water | 2.202 g |

Synthesis of Microgel (2):

As the oil phase component, 10 g of the addition product of trimethylolpropane and xylene diisocyanate (Takenate D-110N, manufactured by Mitsui Takeda Chemicals Inc.), 3.15 g of pentaerythritol triacrylate (SR444, manufactured by

TABLE 5

| Ex. No. | Lithographic Printing Plate Precursor | Image-Recording Layer | | | | | | | | Variation in Absorbance of Infrared Absorber | | Performance | | |
|---|---|---|---|---|---|---|---|---|---|---|---|---|---|---|
| | | Photosensitive Layer | Infrared Absorber | | Radical Generator | | Additive | | Protective Layer Coating Solution | Wavelength (nm) | Amount of Variation in Absorbance | Plate Detecting Property | On-Press Developability | Press Life |
| | | | Structure | Addition Amount X (g) | Structure | Addition Amount Y (g) | Structure | Addition Amount Z (g) | | | | | | |
| Ex. 16 | (16) | (2) | (1) | 0.034 | (4) | 0.125 | | None | (4) | 645 | Increase by 0.09 | Good | 30 | 11,000 |
| Ex. 17. | (17) | (3) | (1) | 0.034 | (5) | 0.119 | | None | (4) | 650 | Increase by 0.08 | Good | 60 | 9,000 |
| Ex. 18. | (18) | (4) | (1) | 0.034 | (6) | 0.119 | | None | (4) | 650 | Increase by 0.12 | Very good | 30 | 12,000 |
| Ex. 19 | (19) | (5) | (1) | 0.034 | (7) | 0.159 | | None | (4) | 650 | Increase by 0.11 | Good | 30 | 10,000 |
| Ex. 20 | (20) | (6) | (1) | 0.034 | (7) (1) | 0.159 0.086 | | None | (4) | 650 | Increase by 0.13 | Very good | 50 | 8,000 |
| Ex. 21 | (21) | (7) | (1) | 0.034 | (7) (2) | 0.159 0.157 | | None | (4) | 650 | Increase by 0.10 | Good | 70 | 10,000 |
| Ex. 22 | (22) | (8) | (1) | 0.034 | (7) (3) | 0.159 0.141 | | None | (4) | 650 | Increase by 0.14 | Very good | 50 | 17,000 |
| Ex. 23 | (23) | (9) | (3) | 0.036 | (7) | 0.159 | | None | (4) | 640 | Increase by 0.08 | Good | 40 | 11,000 |
| Ex. 24 | (24) | (10) | (4) | 0.036 | (7) | 0.159 | | None | (4) | 680 | Increase by 0.11 | Very good | 40 | 10,000 |
| Ex. 25 | (25) | (11) | (5) | 0.036 | (7) | 0.159 | | None | (4) | 555 | Increase by 0.06 | Almost good | 60 | 11,000 |
| Ex. 26 | (26) | (12) | (6) | 0.027 | (7) | 0.159 | | None | (4) | 650 | Increase by 0.06 | Almost good | 60 | 9,000 |
| Comp. Ex. 7 | (R7) | (r1) | (1) | 0.034 | (6) | 0.086 | (1) | 0.090 | (4) | | | Good | 200 | 2,000 |
| Comp. Ex. 8 | (R8) | (r2) | (1) | 0.034 | (6) | 0.086 | (2) | 0.090 | (4) | | | Almost good | 300 | 3,000 |
| Comp. Ex. 9 | (R9) | (r3) | (1) | 0.034 | (6) | 0.119 | (3) | 0.050 | (4) | | | Good | 200 | 5,000 |
| Comp. Ex. 10 | (R10) | (r4) | (1) | 0.034 | (6) | 0.119 | (4) | 0.050 | (4) | | | Very good | 250 | 4,000 |
| Comp. Ex. 11 | (R11) | (r5) | (1) | 0.034 | (6) | 0.086 | (5) | 0.040 | (4) | | | Bad | 500 | 8,000 |
| Comp. Ex. 12 | (R12) | (8) | (1) | 0.034 | (7) (3) | 0.159 0.141 | | None | (5) | 650 | Increase by 0.09 | Very good | 500 | 12,000 |
| Comp. Ex. 13 | (R13) | (8) | (1) | 0.034 | (7) (3) | 0.159 0.141 | | None | (5) | 650 | Increase by 0.09 | Very good | 60 | 2,000 |

Example 27

A lithographic printing plate precursor was manufactured in the same manner as in Example 16, except that the following Nippon Kayaku Co., Ltd.), and 0.1 g of Pionin A-41C (manufactured by Takemoto Oil & Fat) were dissolved in 17 g of ethyl acetaate. As the aqueous phase component, 40 g of a 4 mass % aqueous solution of PVA-205 was prepared. The oil phase component and the aqueous phase component were mixed, and emulsified with a homogenizer at 12,000 rpm for 10 minutes. The obtained emulsified product was added to 25 g of distilled water, stirred at room temperature for 30 minutes, and then stirred at 50° C. for 3 hours. The concentration of the solids content of the obtained microgel solution was diluted with distilled water to reach 15 mass %. The average particle size of the obtained microgel solution was 0.2 μm.

The invention can provide a packaged body of lithographic printing plate precursors dispensing with a development process free of interleaving sheets, by which the lithographic printing plate precursors can be prevented from the generation of adhesion and scratches, and preservation stability and press life can be maintained well. The invention can further provide a lithographic printing plate precursor excellent in on-press developability and press life. The invention can still further provide an on-press development type or non-processing type (non-development type) lithographic printing plate precursor that is excellent in the visibility of a printing plate after exposure, little in loss paper, and having good press life. The invention can further provide a lithographic printing method including on-press development with these lithographic printing plate precursors.

The entire disclosure of each and every foreign patent application from which the benefit of foreign priority has been claimed in the present application is incorporated herein by reference, as if fully set forth.

What is claimed is:

1. A packaged body of lithographic printing plate precursors, which comprises at least two lithographic printing plate precursors free from interleaving sheets, each lithographic printing plate precursor comprising: an aluminum support; an image-recording layer; and a protective layer in this order,
    wherein a first one and a second one of the at least two lithographic printing plate precursors are laminated so that a surface of a side having an image-recording layer of the first one directly contacts with a surface of a side not having an image-recording layer of the second one,
    wherein no interleaving sheet is present between the at least two lithographic printing plate precursors,
    wherein the protective layer comprises an inorganic layered compound,
    wherein the image-recording layer comprises (A) an actinic ray absorber, (B) a polymerization initiator and (C) a polymerizable compound,
    wherein the at least two lithographic printing plate precursors each has an outermost surface having a center line average surface roughness (Ra) of from 0.2 to 0.6 μm in a side having an image-recording layer, and
    wherein the inorganic layered compound is a mica group consisting of natural mica and synthetic mica represented by the following formula:

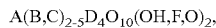

wherein A is any of K, Na and Ca, B and C are any of Fe(II), Fe(III), Mn, Al, Mg and V, and D is Si or Al.

2. The packaged body of lithographic printing plate precursors according to claim 1,
    wherein the image-recording layer is capable of being removed by at least one of a fountain solution and an ink.

3. The packaged body of lithographic printing plate precursors according to claim 1,
    wherein the image-recording layer further comprises at least one of microcapsules and microgels.

4. A packaged body according to claim 1, wherein said (C) polymerizable compound is an addition-polymerizable compound having at least one ethylenically unsaturated double bond.

5. A packaged body according to claim 1, wherein said (C) polymerizable compound is a monomer and its copolymer includes an unsaturated carboxylic acid and esters and amides thereof.

6. A packaged body according to claim 1, wherein said (C) polymerizable compound is an unsaturated carboxylic acid ester or amide having a hydroxyl group, amino group or mercapto group with a monofunctional or polyfunctional isocyanate or epoxy.

7. A packaged body according to claim 1, wherein said (C) polymerizable compound is a dehydrating condensation reaction product with a monofunctional or polyfunctional carboxylic acid.

8. A packaged body according to claim 1, wherein said (C) polymerizable compound is an addition reaction product of an unsaturated carboxylic acid ester or amide having an as isocyanate group or epoxy group with a monofunctional or polyfunctional alcohol, amine or thiol.

9. A packaged body according to claim 1, wherein said (C) polymerizable compound is a displacement reaction product of an unsaturated carboxylic acid ester or amide having a halogen group or tosyloxy group with a monofunctional or polyfunctional alcohol, amine or thiol.

10. A packaged body according to claim 1, wherein said (C) polymerizable compound is an urethane acrylate or urethane compounds having an ethylene oxide-type skeleton.

11. The packaged body of lithographic printing plate precursors according to claim 1,
    wherein the image-recording layer further comprises (D) a binder polymer.

12. The packaged body of lithographic printing plate precursors according to claim 1, wherein the image-recording layer further comprises a binder polymer that is a polymer of a monomer of (meth)acrylic acid ester in which the R moiety of —COOR comprises a —CH$_2$CH$_2$O— structure.

13. The packaged body of lithographic printing plate precursors according to claim 1, wherein the image-recording layer further comprises a binder polymer that is a copolymer of alkyl(meth)acrylate and a monomer of a (meth)acrylic acid ester in which the R moiety of —COOR comprises a —CH$_2$CH$_2$O— structure.

* * * * *

UNITED STATES PATENT AND TRADEMARK OFFICE
CERTIFICATE OF CORRECTION

PATENT NO. : 7,910,286 B2
APPLICATION NO. : 11/339447
DATED : March 22, 2011
INVENTOR(S) : Tomoyoshi Mitsumoto et al.

It is certified that error appears in the above-identified patent and that said Letters Patent is hereby corrected as shown below:

ON THE TITLE PAGE:

At Item (30), correct the Foreign Application Priority Data to read:

-- Jan. 26, 2005 (JP) .................... P. 2005-018195
   Jan. 31, 2005 (JP) .................... P. 2005-022650
   Mar. 11, 2005 (JP) .................... P. 2005-068924
   Jul. 28, 2005 (JP) .................... P. 2005-219200
   Jul. 29, 2005 (JP) .................... P. 2005-221594 --.

Signed and Sealed this
Sixth Day of September, 2011

David J. Kappos
*Director of the United States Patent and Trademark Office*